United States Patent
Wu et al.

(10) Patent No.: US 11,469,349 B2
(45) Date of Patent: Oct. 11, 2022

(54) SEMICONDUCTOR CHIP OF LIGHT EMITTING DIODE AND MANUFACTURING METHOD THEREOF

(71) Applicant: XIAMEN CHANGELIGHT CO., LTD., Fujian (CN)

(72) Inventors: Xingen Wu, Xiamen (CN); Junxian Li, Xiamen (CN); Yingce Liu, Xiamen (CN); Zhendong Wei, Xiamen (CN); Hongyi Zhou, Xiamen (CN)

(73) Assignee: Xiamen Changelight Co., Ltd., Fujian (CN)

( * ) Notice: Subject to any disclaimer, the term of this patent is extended or adjusted under 35 U.S.C. 154(b) by 270 days.

(21) Appl. No.: 16/961,259

(22) PCT Filed: Jul. 16, 2019

(86) PCT No.: PCT/CN2019/096141
§ 371 (c)(1),
(2) Date: Jul. 10, 2020

(87) PCT Pub. No.: WO2020/015630
PCT Pub. Date: Jan. 23, 2020

(65) Prior Publication Data
US 2021/0091262 A1 Mar. 25, 2021

(30) Foreign Application Priority Data

Jul. 17, 2018 (CN) .......................... 201810783043.X
Jul. 17, 2018 (CN) .......................... 201810784329.X

(51) Int. Cl.
*H01L 33/38* (2010.01)
*H01L 33/42* (2010.01)
(Continued)

(52) U.S. Cl.
CPC .......... *H01L 33/145* (2013.01); *H01L 33/007* (2013.01); *H01L 33/14* (2013.01);
(Continued)

(58) Field of Classification Search
CPC ......... H01L 33/42; H01L 33/44; H01L 33/38; H01L 33/382; H01L 33/007;
(Continued)

(56) References Cited

U.S. PATENT DOCUMENTS

2016/0284940 A1* 9/2016 Kawaguchi ........... H01L 33/382
2019/0067526 A1* 2/2019 Kim ........................ H01L 33/46
(Continued)

*Primary Examiner* — Savitri Mulpuri
(74) *Attorney, Agent, or Firm* — Arch & Lake LLP

(57) ABSTRACT

A semiconductor chip of a LED and a manufacturing method thereof are disclosed. The semiconductor chip includes a substrate, an N-type semiconductor layer, an active region, a P-type semiconductor layer, and at least one semiconductor exposing portion extending from the P-type semiconductor layer to the N-type semiconductor layer. The semiconductor chip further includes one or more current blocking layers, a transparent conductive layer, an N-type electrode, and a P-type electrode, wherein the current blocking layer encapsulates the P-type semiconductor in such a manner to be stacked on the P-type semiconductor layer. The transparent conductive layer has one or more through holes corresponding to the one or more current blocking layers respectively. The N-type electrode is stacked on the N-type semiconductor layer and the P-type electrode is stacked on the N-type semiconductor layer. The P-type prongs of the P-type electrode are retained in the through holes of the transparent conductive layer respectively.

20 Claims, 29 Drawing Sheets

(51) Int. Cl.
*H01L 33/44* (2010.01)
*H01L 33/14* (2010.01)
*H01L 33/00* (2010.01)
*H01L 33/30* (2010.01)

(52) U.S. Cl.
CPC ............ *H01L 33/30* (2013.01); *H01L 33/382* (2013.01); *H01L 33/387* (2013.01); *H01L 33/42* (2013.01); *H01L 33/44* (2013.01); *H01L 2933/0016* (2013.01); *H01L 2933/0025* (2013.01)

(58) Field of Classification Search
CPC ........... H01L 33/145; H01L 2933/0025; H01L 2933/0016; H01L 33/14; H01L 33/30; H01L 33/387
See application file for complete search history.

(56) References Cited

U.S. PATENT DOCUMENTS

2020/0411721 A1* 12/2020 Zeng ................. H01L 33/10
2021/0343904 A1* 11/2021 Liu .................... H01L 33/44

* cited by examiner

SEMICONDUCTOR CHIP OF LIGHT EMITTING DIODE AND MANUFACTURING METHOD THEREOF

CROSS REFERENCE OF RELATED APPLICATION

This is a U.S. National Stage under 35 U.S.C. 371 of the International Application Number PCT/CN2019/096141, filed Jul. 16, 2019, which claims priority to Chinese application number CN201810783043.X, filed Jul. 17, 2018, and Chinese application number CN201810784329.X, filed Jul. 17, 2018.

BACKGROUND OF THE PRESENT INVENTION

Field of Invention

The present invention relates to a LED chip, and more particularly to a semiconductor chip of light emitting diode and manufacturing method thereof.

Description of Related Arts

There are two types of conventional front-mounted LED chip, which are generally named as three-times photolithography LED chip structure and five-times photolithography LED chip structure according to their photolithography processes. In other words, three times of photolithography cycle are applied to the three-times photolithography LED chip structure and five times of photolithography cycle are applied to the five-time photolithography LED chip structure. In generally, the photolithography process of the five-times photolithography LED chip may be simplified from five photolithography cycles to four photolithography cycles. For the three-times photolithography LED chip structure, its manufacturing process includes Mesa procedure (Mesa procedure refers to a step to manufacture an exposed area of a N-type layer on the outer surface of the epitaxial wafer by dry etching), ITO procedure (ITO procedure refers to a step to make a transparent conductive film), and PV&Pad procedure (PV&Pad procedure refers to a step that the passivation layer and the electrode use the same process for photolithographic pattern production). As to the five-times photolithography LED chip structure, its manufacturing process includes Mesa procedure, CB procedure (CB procedure refers to a step to make a current blocking layer), ITO procedure, and PV&Pad procedure. In view of the structure, there are no significant difference between the three-times photolithography LED chip and the five-times photolithography LED chip. In view of the procedures, the five-times photolithography front-mounted LED chip has an additional current blocking layer (CB) structure which is the current blocking layer of the P-type electrodes, in comparison with the three-times photolithography front-mounted LED chip, which is intended to prevent the current crowding effect caused by the current entered from the P-type electrodes being concentrated right under the P-type electrodes. Of course, the additional current blocking layer structure increases the manufacturing cost of the LED chip, and thus the three-times photolithograph LED chip structure is generally utilized in low-power chips and display chips, while the five-times photolithography LED chip structure is generally applied in high-power chips and lighting and illuminating chips.

From the perspective of the combination of the positive and negative resistances of the PN diodes of the five-times photolithography LED chip, the current from the P-type electrode is expanded by the metal electrode while flowing through the metal electrode and then flows into the P-type GaN layer via the transparent conductive layer. Finally, it enters the active layer. Also, after the current from the N-type electrode is expanded by the metal electrode while flowing through the metal electrode, the flows into the N-type GaN layer and then, finally, enters the active layer, so as to cooperate with the current from the P-type electrodes to emit light from the active area. From the perspective of the entire current flowing process, the electrical conductivity of the metal electrode is higher than that of the semiconductor layer. Therefore, the current on the surface of the P-type electrode tends to gather at the end of the P-type electrode.

In view of the curve of the light emitting characteristics of the five-times photolithography LED chip, as the current density increases, the brightness tends to rise and then decrease, and there is a saturation current density, that affects the light-emitting efficiency of the five-times front-mounted LED chip. The ideal high-brightness light-emitting chip structure is capable of distributing and maintaining a high current density in a region with high luminous efficiency of the LED chip. However, the conventional five-times photolithography—LED chip is unable to accomplish.

SUMMARY OF THE PRESENT INVENTION

The invention is advantageous in that it provides a semiconductor chip of light emitting diode and manufacturing method thereof, wherein the brightness of the semiconductor chip can be effectively improved.

Another advantage of the invention is to provide a semiconductor chip of light emitting diode and manufacturing method thereof, wherein the current injected into a P-type semiconductor layer of the semiconductor chip can be uniformly and evenly distributed, so as to facilitate the improvement of the brightness of the semiconductor chip.

Another advantage of the invention is to provide a semiconductor chip of light emitting diode and manufacturing method thereof, wherein the semiconductor chip provides a P-type electrode, wherein the current injected into the semiconductor chip from the P-type electrode is forcibly distributed, so that the current injected into the P-type semiconductor layer can be evenly distributed that substantially facilitate the enhancement of the brightness of the semiconductor chip.

Another advantage of the invention is to provide a semiconductor chip of light emitting diode and manufacturing method thereof, wherein the semiconductor chip further provides a current blocking layer stacked on a P-type semiconductor layer and a transparent conductive layer which is stacked on the P-type semiconductor layer and encapsulates the current blocking layer, wherein the P-type electrode is stacked on the transparent conductive layer, such that the current injected into the transparent conductive layer from the P-type electrode can be blocked by the current blocking layer, thereby avoiding the occurrence of adverse effect of crowding current in the P-type electrode. Therefore, the current can subsequently be evenly and uniformly distributed to the P-type semiconductor layer.

Another advantage of the invention is to provide a semiconductor chip of light emitting diode and manufacturing method thereof, wherein a P-type prong of the P-type electrode is inserted into the transparent conductive layer, such that the current injected into the P-type electrode can further be injected into the transparent conductive layer from its outer surface and inside. Accordingly, the current can be evenly and uniformly distributed to the P-type semiconductor layer.

Another advantage of the invention is to provide a semiconductor chip of light emitting diode and manufacturing method thereof, wherein the transparent conductive layer has at least one through hole with respect to the current blocking layer, wherein the P-type prong of the P-type electrode is formed and retained in the through hole of the transparent conductive layer, such that the current injected into the P-type electrode can further be injected into the transparent conductive layer from its outer surface and inside.

Another advantage of the invention is to provide a semiconductor chip of light emitting diode and manufacturing method thereof, wherein in the process of forming the P-type electrode, the P-type prong of the P-type electrode is formed and retained in the through hole of the transparent conductive layer, such that the P-type electrode is embedded and encapsulated in the transparent conductive layer. This combination and integration of the P-type electrode and the transparent conductive layer can effectively ensure the stability and reliability of the chip.

Another advantage of the invention is to provide a semiconductor chip of light emitting diode and manufacturing method thereof, wherein the semiconductor chip is provided with a transparent conductive layer stacked on the P-type semiconductor layer and a P-type electrode stacked on the transparent conductive layer, such that the current injected through the P-type electrode can be uniformly and evenly injected into the P-type semiconductor layer after being diffused by the transparent conductive layer, thereby facilitating the improvement of the overall brightness of the semiconductor chip.

Another advantage of the invention is to provide a semiconductor chip of light emitting diode and manufacturing method thereof, wherein the P-type electrode comprises at least one row of P-type prongs, wherein the P-type prongs are arranged along a longitudinal direction of the semiconductor chip and inserted into the transparent conductive layer. Accordingly, a current from the P-type electrode can be injected into the transparent conductive layer from its outer surface and inner inside, such that the current can be more evenly and uniformly injected into the P-type semiconductor layer.

Another advantage of the invention is to provide a semiconductor chip of light emitting diode and manufacturing method thereof, wherein the P-type electrode further comprises a P-type electrode pad and at least one P-type electrode extension member, wherein the P-type electrode pad is formed on a first end portion of the semiconductor chip and the P-type electrode extension member is extended from the P-type electrode pad towards a second end portion of the semiconductor chip, wherein the P-type prongs are intervally formed on the P-type electrode extension member, and at least one of the P-type prongs in the row of P-type prongs has a different shape or size with its adjacent P-type prong, in such a manner that the current injected through the P-type electrode can be evenly and uniformly injected into the P-type semiconductor layer after being diffused by the transparent conductive layer.

Another advantage of the invention is to provide a semiconductor chip of light emitting diode and manufacturing method thereof, wherein the shapes of the P-type prongs are gradually changed along the P-type electrode extension member, facilitating the current injected through the P-type electrode to evenly and uniformly inject into the P-type semiconductor layer after being diffused by the transparent conductive layer.

Another advantage of the invention is to provide a semiconductor chip of light emitting diode and manufacturing method thereof, wherein the shapes of the P-type prongs are gradually changed along the P-type electrode extension member, thereby facilitating the current injected through the P-type electrode to evenly and uniformly inject into the P-type semiconductor layer after being diffused by the transparent conductive layer.

Another advantage of the invention is to provide a semiconductor chip of light emitting diode and manufacturing method thereof, wherein a distance between each two adjacent P-type prongs in the row of the P-type pongs is gradually changed along the P-type electrode extension member, thereby facilitating the current injected through the P-type electrode to evenly and uniformly inject into the P-type semiconductor layer after being diffused by the transparent conductive layer.

Additional advantages and features of the invention will become apparent from the description which follows, and may be realized by means of the instrumentalities and combinations particular point out in the appended claims.

According to the present invention, the foregoing and other objects and advantages are attained by a semiconductor chip of LED, comprising:

an epitaxial unit, which comprises a substrate, an N-type semiconductor layer formed on the substrate, an active region formed on the N-type semiconductor layer and a P-type semiconductor layer formed on the active region, wherein the epitaxial unit has at least one semiconductor exposing portion extending from the P-type semiconductor layer through the active region to the N-type semiconductor layer to expose the N-type semiconductor layer thereat;

at least one current blocking layer formed on the P-type semiconductor layer of the epitaxial unit;

a transparent conductive layer having at least one through hole with respect to the at least one current blocking layer, wherein the transparent conductive layer encapsulates the at least one current blocking layer and is formed on the P-type semiconductor layer; and an electrode assembly which comprises at least one N-type electrode and at least one P-type electrode, wherein the N-type electrode is formed on the semiconductor exposing portion so as to stack on the N-type semiconductor layer, wherein the P-type electrode has at least one P-type prong formed and retained in the at least one through hole of the transparent conductive layer when the P-type semiconductor layer is formed on the transparent conductive layer.

In one embodiment of the present invention, the N-type electrode comprises a N-type electrode pad formed at a second end portion of the semiconductor chip and at least one N-type electrode extension member extended from the N-type electrode pad to a first end portion of the semiconductor chip, wherein the P-type electrode comprises a P-type electrode pad formed at the first end portion of the semiconductor chip and at least two P-type electrode extension members extended from the P-type electrode pad to the second end portion of the semiconductor chip, wherein the at least one N-type electrode extension member is retained between two adjacent P-type electrode extension members.

In one embodiment of the present invention, the N-type electrode includes only one N-type electrode extension member extending in a longitudinal direction of the semiconductor chip at a middle portion thereof, wherein the P-type electrode includes two P-type electrode extension members which are symmetric to each other and extended in a longitudinal direction of the semiconductor chip along a peripheral edge thereof.

In one embodiment of the present invention, the N-type electrode includes two N-type electrode extension members extending in a longitudinal direction of the semiconductor chip at a middle portion thereof, wherein the P-type electrode includes three P-type electrode extension members, including a first P-type electrode extension member, a second P-type electrode extension member, and a third P-type electrode extension member, wherein the first P-type electrode extension member and the third P-type electrode extension member of the P-type electrode are arranged in a symmetric manner and extended from the P-type electrode pad towards the second end portion of the semiconductor chip in a longitudinal direction along the peripheral edge thereof, while the second P-type electrode extension member of the P-type electrode is extended from the P-type electrode pad towards the second end portion of the semiconductor chip in a longitudinal direction at a middle portion thereof, wherein one of the N-type electrode extension members is retained between the first P-type electrode extension member and the second P-type electrode extension member and the other N-type electrode extension member is retained between the second P-type electrode extension member and the third P-type electrode extension member.

In one embodiment of the present invention, the N-type electrode comprises a N-type electrode pad formed at a second end portion of the semiconductor chip and at least two N-type electrode extension members extended from the N-type electrode pad to a first end portion of the semiconductor chip, wherein the P-type electrode comprises a P-type electrode pad formed at the first end portion of the semiconductor chip and at least one P-type electrode extension member extended from the P-type electrode pad to the second end portion of the semiconductor chip, wherein the at least one N-type electrode extension member is retained between adjacent two P-type electrode extension members.

In one embodiment of the present invention, the N-type electrode includes two N-type electrode extension members arranged in a symmetric manner and extended in a longitudinal direction of the semiconductor chip along the peripheral edge thereof, wherein the P-type electrode includes only one P-type electrode extension member extended in a longitudinal direction of the semiconductor chip at a middle portion thereof.

In one embodiment of the present invention, the N-type electrode includes three N-type electrode extension members, including a first N-type electrode extension member, a second N-type electrode extension member and a third N-type electrode extension member, wherein the first N-type electrode extension member and the third N-type electrode extension member are arranged in a symmetric manner and extended in a longitudinal direction of the semiconductor chip along the peripheral edge thereof, and the second N-type electrode extension member is extended in a longitudinal direction of the semiconductor chip at a middle portion thereof, wherein the P-type electrode includes two P-type electrode extension members extended in a longitudinal direction of the semiconductor at a middle portion thereof, wherein one of the P-type electrode extension members is retained between the first N-type electrode extension member and the second N-type electrode extension member and the other P-type electrode extension member is retained between the second N-type electrode extension member and the third N-type electrode extension member.

In one embodiment of the present invention, the N-type electrode comprises a N-type electrode pad formed at a second end portion of the semiconductor chip, wherein the P-type electrode comprises a P-type electrode pad formed at a first end portion of the semiconductor chip and a P-type electrode extension member extended from the N-type electrode pad to the second end portion of the semiconductor chip.

In one embodiment of the present invention, the at least one current blocking layer is stacked on the outer surface of N-type semiconductor layer exposed at the semiconductor exposing portion, wherein the at least one current blocking layer stacked on the N-type semiconductor layer is encapsulated in the P-type electrode.

In one embodiment of the present invention, the current blocking layer stacked on the N-type semiconductor layer has a strip shape and is extended in a longitudinal direction of the semiconductor chip.

In one embodiment of the present invention, a plurality of the current blocking layers is stacked on the N-type semiconductor layer, wherein the current blocking layers are arranged in a strip manner and extended in a longitudinal direction of the semiconductor chip, and each two adjacent current blocking layers have a gap formed therebetween.

In one embodiment of the present invention, the semiconductor chip further comprises a passivation layer encapsulating the N-type electrode and the P-type electrode and being stacked on the P-type semiconductor layer and the transparent conductive layer, wherein the passivation layer has a first through hole provided with respect to the N-type electrode and a second through hole provided with respect to the P-type electrode.

According to another aspect of the present invention, the present invention further provides a manufacturing method of a semiconductor chip, which comprises the following steps, (a) Form a current blocking layer on a P-type semiconductor layer of an epitaxial unit.

(b) Form a transparent conductive layer on the P-type semiconductor layer by encapsulating the current blocking layer in the transparent conductive layer, wherein the transparent conductive layer has at least one through hole provided with respect to the current blocking layer.

(c) Form an N-type electrode on an N-type semiconductor layer of the epitaxial unit, wherein the N-type electrode is retained in a semiconductor exposing portion of the epitaxial unit, and form a P-type electrode on the transparent conductive layer by forming and retaining a P-type prong of the P-type electrode in the at least one through hole of the transparent conductive layer. Accordingly, the semiconductor chip is manufactured.

In one embodiment of the present invention, the method further comprises the following step:

(d) Form a passivation layer on the P-type semiconductor layer and the transparent conductive layer y encapsulating the N-type electrode and the P-type electrode in the passivation layer, wherein the passivation layer has a first through hole provided with respect to the N-type electrode and a second through hole provided with respect to the P-type electrode.

In one embodiment of the present invention, the step (a) further comprises the steps of:

(a.1) depositing an insulating layer on the P-type semiconductor layer; and (a.2) wet-etching the insulating layer to form the current blocking layer stacked on the P-type semiconductor layer.

In one embodiment of the present invention, prior to the step (a.2), the step (a) further comprises a step of applying photoresist on the insulating layer, and after the step (a.2), the step (a) further comprises a step of removing the photoresist.

In one embodiment of the present invention, a material of the insulating layer is SiO2.

In one embodiment of the present invention, in the step (a.1), the involved reaction gas includes SiH4, N2O and N2, for depositing the insulating layer on the P-type semiconductor layer.

In one embodiment of the present invention, the thickness of the insulating layer ranges from 500 Angstroms to 10,000 Angstroms.

In one embodiment of the present invention, the involved solution adapted in the wet-etching is a mixed solution of hydrofluoric acid and ammonium fluoride.

In one embodiment of the present invention, the step (b) further comprises the steps of:

(b.1) depositing an indium tin oxide layer on the P-type semiconductor layer by encapsulating the current blocking layer in the indium tin oxide layer; and (b.2) wet-etching the indium tin oxide layer to form the transparent conductive layer and the through holes of the transparent conductive layer.

In one embodiment of the present invention, prior to the step (b.2), the step (b) further comprises a step of applying photoresist on the transparent conductive layer, and after the step (b.2), the step (b) further comprises a step of removing the photoresist.

In one embodiment of the present invention, prior to the step of applying the photoresist, the step (b) further comprises a step of alloy-treating the indium tin oxide layer.

In one embodiment of the present invention, the etching solution used for wet etching the indium tin oxide layer is a mixed solution of hydrochloric acid and ferric chloride.

In one embodiment of the present invention, the step (a) further comprises a step of forming the current blocking layer on the outer surface of the P-type semiconductor layer exposed at the semiconductor exposing portion, such that in the step (c), the current blocking layer formed on the N-type semiconductor layer is encapsulated in the P-type electrode.

According to another aspect of the present invention, it further provides a semiconductor chip, which comprises:

an epitaxial unit, which comprises a substrate, an N-type semiconductor layer formed on the substrate, an active region formed on the N-type semiconductor layer, and a P-type semiconductor layer formed on the active region, wherein the epitaxial unit has at least one semiconductor exposing portion extending from the P-type semiconductor layer through the active region to the N-type semiconductor layer to expose the N-type semiconductor layer thereat;

at least one current blocking layer formed on the P-type semiconductor layer of the epitaxial unit.

a transparent conductive layer having at least one row of through holes provided with respect to the at least one current blocking layer, wherein the transparent conductive layer encapsulates the at least one current blocking layer and thus is formed on the P-type semiconductor layer, wherein at least one of the through holes is different from the other adjacent through hole; and an electrode assembly which comprises an N-type electrode formed on the N-type semiconductor layer and a P-type electrode formed on the transparent conductive layer, wherein the N-type electrode comprises a N-type electrode pad formed at a second end portion of the semiconductor chip, wherein the P-type electrode comprises a P-type electrode pad formed at a first end portion of the semiconductor chip and at least one P-type electrode extension member extended from the P-type electrode pad towards the second end portion of the semiconductor, wherein the P-type electrode extension member has a row of P-type prongs formed and retained in the through holes of the transparent conductive layer respectively.

In one embodiment of the present invention, the N-type electrode further comprises at least one N-type electrode extension member extended from the N-type electrode pad to the second end portion of the semiconductor chip.

In one embodiment of the present invention, the sizes of the through holes in the same row are gradually increased from the first end portion of the semiconductor chip to the second end portion thereof, and the sizes of the P-type prongs in the same row are gradually increased from the first end portion of the semiconductor chip to the second end portion thereof.

In one embodiment of the present invention, the sizes of the through holes in the same row are gradually decreased from the first end portion of the semiconductor chip to the second end portion thereof, and the sizes of the P-type prongs in the same row are gradually decreased from the first end portion of the semiconductor chip to the second end portion thereof.

In one embodiment of the present invention, the distances between each two adjacent through holes in the same row are gradually increased from the first end portion of the semiconductor chip to the second end portion thereof, and the distances between each two adjacent P-type prongs in the same row are gradually increased from the first end portion of the semiconductor chip to the second end portion thereof.

In one embodiment of the present invention, the distances between each two adjacent through holes in the same row are gradually decreased from the first end portion of the semiconductor chip to the second end portion thereof, and the distances between each two adjacent P-type prongs in the same row are gradually decreased from the first end portion of the semiconductor chip to the second end portion thereof.

In one embodiment of the present invention, the N-type electrode comprises one N-type electrode extension member extended in a longitudinal direction of the semiconductor chip at a middle portion thereof, wherein the P-type electrode comprises two P-type electrode extension members arranged in a symmetric manner and extended in a longitudinal direction of the semiconductor chip along the peripheral edge thereof, wherein the one N-type electrode extension member is retained between the two P-type electrode extension members.

In one embodiment of the present invention, the N-type electrode comprises two N-type electrode extension members extended in a longitudinal direction of the semiconductor chip at a middle portion thereof, wherein the P-type electrode comprises three P-type electrode extension members, including a first P-type electrode extension member, a second P-type electrode extension member and a third P-type electrode extension member, wherein the first P-type electrode extension member and the third P-type electrode extension member are arranged in a symmetric manner and extended in a longitudinal direction of the semiconductor chip along the peripheral edge thereof, and the second P-type electrode extension member is extend a longitudinal direction of the semiconductor chip at a middle portion thereof, wherein one of the two N-type electrode extension members is retained between the first P-type electrode extension member and the second P-type electrode extension member and the other N-type electrode extension member is retained between the second P-type electrode extension member and the third P-type electrode extension member.

In one embodiment of the present invention, the N-type electrode comprises two N-type electrode extension members extended in a longitudinal direction of the semiconductor chip along a peripheral edge thereof, wherein the P-type electrode comprises one P-type electrode extension member extended in a longitudinal direction of the semiconductor chip at a middle portion thereof, wherein the P-type electrode extension member is retained between the two N-type electrode extension members.

In one embodiment of the present invention, the N-type electrode includes three N-type electrode extension members, namely a first N-type electrode extension member, a second N-type electrode extension member and a third N-type electrode extension member, wherein the first N-type electrode extension and the third N-type electrode extension member are arranged in a symmetric manner and extended in a longitudinal direction of the semiconductor chip along the peripheral edge thereof, and the second N-type electrode extension member is extended in a longitudinal direction of the semiconductor chip at a middle portion thereof, wherein the P-type electrode includes two P-type electrode extension members extended in a longitudinal direction of the semiconductor at a middle portion thereof, wherein one of the P-type electrode extension member is retained between the first N-type electrode extension member and the second N-type electrode extension member and the other P-type electrode extension member is retained between the second N-type electrode extension member and the third N-type electrode extension member.

In one embodiment of the present invention, at least one current blocking layer is formed on the outer surface of N-type semiconductor layer exposed at the semiconductor exposing portion, wherein the at least one current blocking layer formed on the N-type semiconductor layer which is encapsulated in the P-type electrode.

In one embodiment of the present invention, the current blocking layer formed on the N-type semiconductor layer has a strip shape and is extended in a longitudinal direction of the semiconductor chip.

In one embodiment of the present invention, a plurality of the current blocking layers is formed on the N-type semiconductor layer, wherein the current blocking layers are arranged in a strip manner and extended in a longitudinal direction of the semiconductor chip, and each two adjacent current blocking layers have a gap formed therebetween.

In one embodiment of the present invention, the semiconductor chip further comprises a passivation layer formed on the P-type semiconductor layer and the transparent conductive layer by encapsulating the N-type electrode and the P-type electrode, wherein the passivation layer has a first through hole provided with respect to the N-type electrode and a second through hole provided with respect to the P-type electrode.

Still further objects and advantages will become apparent from a consideration of the ensuing description and drawings.

These and other objectives, features, and advantages of the present invention will become apparent from the following detailed description, the accompanying drawings, and the appended claims.

DETAILED DESCRIPTION OF THE PREFERRED EMBODIMENT

Figure 1A:
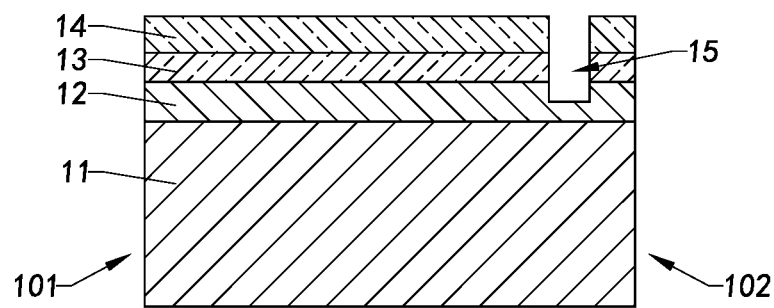
FIG. 1A is a schematic cross-sectional view illustrating one of the manufacturing steps of a semiconductor chip according to a first preferred embodiment of the present invention.

The following description is disclosed to enable any person skilled in the art to make and use the present invention. Preferred embodiments are provided in the following description only as examples and modifications will be apparent to those skilled in the art. The general principles defined in the following description would be applied to other embodiments, alternatives, modifications, equivalents, and applications without departing from the spirit and scope of the present invention.

Referring to the FIG. 1A to 5B of the drawings, a semiconductor chip of a LED is illustrated, wherein the semiconductor chip comprises an epitaxial unit 10, at least one current blocking layer 20, a transparent conductive layer 30, and an electrode assembly 40.

More specifically, the epitaxial unit 10 comprises a substrate 11, an N-type semiconductor layer 12, an active region 13, and a P-type semiconductor layer 14, wherein the N-type semiconductor layer 12 is grown from the substrate 11, such that the N-type semiconductor layer 12 is stackedly formed on the substrate 11, wherein the active region 13 is grown from the N-type semiconductor layer 12, such that the active region 13 is stackedly formed on the N-type semiconductor layer 12, wherein the P-type semiconductor layer 14 is grown from the active region 13, such that the P-type semiconductor layer 14 is stackedly formed on the active region 13.

It is worth mentioning that the type of the substrate 11 of the epitaxial unit 10 is not limited in the present invention. For example, the substrate 11 may be, but not limited to, a sapphire substrate, a silicon substrate, or etc. In addition, the types of the N-type semiconductor layer 12 and the P-type semiconductor layer 14 may also not be limited in the present invention. For example, the N-type semiconductor layer 12 may be an N-type gallium nitride layer and the P-type semiconductor layer 14 may be a P-type gallium nitride layer.

Figure 1B:
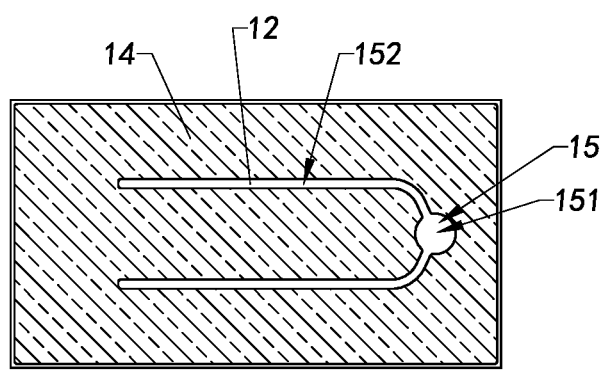
FIG. 1B is a schematic top view illustrating another one of the manufacturing steps of the semiconductor chip according to the above first preferred embodiment of the present invention.

As shown in FIGS. 1A and 1B of the drawings, the epitaxial unit 10 has at least one semiconductor exposing portion 15 extending from the P-type semiconductor layer 14 to the N-type semiconductor layer 12 through the active region 13, so as to expose the N-type semiconductor layer 12 to outside. In other words, at least a portion of an outer surface of the N-type semiconductor layer 12 is exposed at the semiconductor exposing portion 15.

According to the semiconductor chip as illustrated in a preferred embodiment of the present invention, a metal-organic chemical vapor deposition (MOCVD) device may be utilized to sequentially grow the N-type semiconductor layer 12, the active region 13 and the P-type semiconductor layer 14 on the substrate 11 so as to sequentially stack the N-type semiconductor layer 12 on the substrate 11, stack the active region 13 on the N-type semiconductor layer 12 and stack the P-type semiconductor layer 14 on the active region 13. Then, a Mesa pattern is formed using photoresist. Then, ICP (inductively coupled plasma) is used to sequentially dry-etch the P-type semiconductor layer 14 and the active region 13 to form the semiconductor exposing portion 15, which is a space extended from the P-type semiconductor layer 14 through the active region 13 to the N-type semiconductor layer 12, so as to expose the N-type semiconductor layer 12 through the semiconductor exposing portion 15.

In another preferred embodiment of the present invention, the ICP is further utilized to etch the N-type semiconductor layer 12 to form the semiconductor exposing portion 15, which is a space extending from the P-type semiconductor layer 14 through the active region 13 into the N-type semiconductor layer 12, so as to expose the N-type semiconductor layer 12 therethrough. In other words, in such preferred embodiment of the present invention, a thickness of the portion of the N-type semiconductor layer 12 corresponding to the semiconductor exposing portion 15 is smaller than that of other portion of the N-type semiconductor layer 12.

Preferably, a depth of the semiconductor exposing portion 15 of the epitaxial unit 10 ranges from 0.7 μm to 3 μm (including 0.7 μm and 3 μm). The gases to be used in dry-etching the P-type semiconductor layer 14, the active region 13 and the N-type semiconductor layer 12 with the inductively coupled plasma includes, but not limited to, Cl2 (chlorine), BCl3 (boron trichloride) and Ar (argon). After dry-etching the P-type semiconductor layer 14, the active region 13 and the N-type semiconductor layer 12 with the inductively coupled plasma to form the semiconductor exposing portion 15, the photoresist is removed to obtain the epitaxial unit 10. The way to remove the photoresist is not intended to be limiting in the present invention. For example, the photoresist may be removed by, but not limited to, a de-gluing solution.

Furthermore, referring to FIGS. 1A to 5B of the drawings, the semiconductor chip has a first end portion 101 and a second end portion 102 opposing the first end portion 101. Further referring to FIGS. 1A to 5B of the drawings, the semiconductor exposing portion 15 has an N-type electrode pad exposing portion 151 and two N-type electrode extension member exposing portions 152, wherein the N-type electrode pad exposing portion 151 of the semiconductor exposing portion 15 is formed at the second end portion 102 of the semiconductor chip. The two N-type electrode extension member exposing portions 152 of the semiconductor exposing portion 15 are extended from the N-type electrode pad exposing portion 151 to the first end portion 101 of the semiconductor chip along a longitudinal direction of the semiconductor chip at a middle portion of the semiconductor chip in a symmetrical manner. Each of the two N-type electrode extension member exposing portions 152 of the semiconductor exposing portion 15 is communicated with the N-type electrode pad exposing portion 151.

It is appreciated that the N-type electrode pad exposing portion 151 and the two N-type electrode extension member exposing portions 152 of the semiconductor exposing portion 15 are formed in the same etching process, wherein both the N-type electrode pad exposing portion 151 and the two N-type electrode extension member exposing portions 152 of the semiconductor exposing portion 15 are extended from the P-type semiconductor layer 14 through the active region 13 to the N-type semiconductor layer N-type semiconductor layer 12 so as to expose the corresponding portions of an outer surface of the N-type semiconductor layer 12 at the N-type electrode pad exposing portion 151 and the two N-type electrode extension member exposing portions 152 respectively.

Figure 2A:
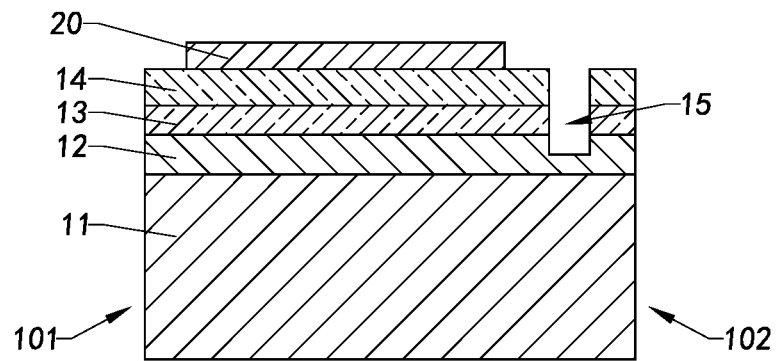
FIG. 2A is a schematic cross-sectional view illustrating another one of the manufacturing steps of the semiconductor chip according to the above first preferred embodiment of the present invention.
Figure 2B:
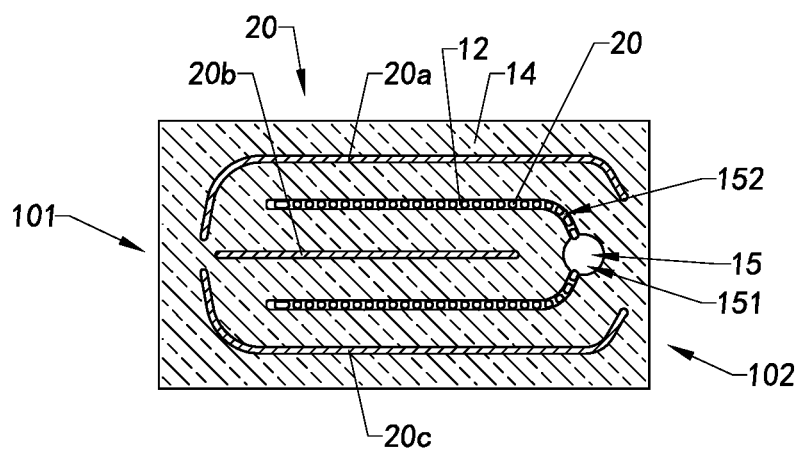
FIG. 2B is a schematic view illustrating another one of the manufacturing steps of the semiconductor chip according to the above first preferred embodiment of the present invention.

Referring to FIGS. 2A and 2B of the drawings, at least one current blocking layer 20 is stackedly formed on the P-type semiconductor layer 14 of the epitaxial unit 10. Preferably, three current blocking layers 20 are provided, which are embodied in strip shape and sequentially defined as a first current blocking layer 20a, a second current blocking layer 20b, and a third current blocking layer 20c, wherein the first current blocking layer 20a, the second current blocking layer 20b and the third current blocking layer 20c are extended from the first end portion 101 to the second end portion 102 of the to semiconductor chip along a longitudinal direction of the semiconductor chip.

One of the two N-type electrode extension member exposing portions 152 of the semiconductor exposing portion 15 is formed between the first current blocking layer 20a and the second current blocking layer 20b, and the other N-type electrode extension member exposing portion 152 is formed between the second current blocking layer 20b and the third current blocking layer 20c. Preferably, the first current blocking layer 20a and the third current blocking layer 20c are symmetrically extended from the first end portion 101 to the second end portion 102 of the semiconductor chip along a longitudinal direction at the peripheral edge of the semiconductor chip. The second current blocking layer 20b is formed between the first current blocking layer 20a and the third current blocking layer 20c and extended from the first end portion 101 to the second end portion 102 of the semiconductor chip along a longitudinal direction at a middle portion of the semiconductor chip.

The way to stack the current blocking layer 20 on the P-type semiconductor layer 14 of the epitaxial unit 10 is not limited in the present invention. For example, the process of stacking the current blocking layer 20 on the P-type semiconductor layer 14 of the epitaxial unit epitaxial unit 10 may include the following steps.

Firstly, a layer of SiO2 (silicon dioxide) is deposited on the P-type semiconductor layer 14 of the epitaxial unit 10 by a Plasma Enhanced Chemical Vapor Deposition (PECVD), wherein a thickness of the P-type semiconductor layer 14 of the epitaxial unit 10 ranges from 500 Angstroms to 10,000 Angstroms (including 500 Angstroms and 10,000 Angstroms) and the reaction gases used includes SiH4 (silane), N2O (nitrogen monoxide), and N2 (nitrogen).

Then, the current blocking layer 20 is formed by photoresist using photo-etching technique, wherein a thickness of the photoresist ranges from 0.5 μm to 5 μm (including 0.5 μm and 5 μm).

Then, the SiO2 layer is etched to form a pattern of the current blocking layer 20 by wet-etching technique, wherein the selected etching solution is a mixed solution of hydrofluoric acid and ammonium fluoride.

Finally, the photoresist is removed after the etching process is completed and the current blocking layer 20 is stackedly formed on the P-type semiconductor layer 14 of the epitaxial unit 10.

Preferably, the current blocking layer 20 may also be stackedly formed on the N-type semiconductor layer 12 of the epitaxial unit 10. For example, as shown in FIG. 2B of the drawings, the current blocking layer 20 may be stackedly formed on the N-type electrode extension member exposing portion 152 of the semiconductor exposing portion 15, such that the current blocking layer 20 is stacked on the N-type semiconductor layer 12 of the epitaxial unit 10. More preferably, the current blocking layers 20 are arranged intervally with one and another and extended intervally along an extending direction of the N-type electrode extension member exposing portion 152 of the semiconductor exposing portion 15 in a strip-shaped manner.

It is worth mentioning that, although the current blocking layers 20 are embodied and illustrated in the preferred embodiment as shown in FIG. 2B in multiple number and having an interval gap between every two adjacent current blocking layers 20 as an example, those skilled in the art should understand that the semiconductor chip as shown in FIG. 2B of the drawings is merely exemplary, which should not be considered as a limitation to the content and scope of the present invention. In other words, in other examples of the semiconductor chip, there may be only one current blocking layer 20 provided and stacked on the N-type semiconductor layer 12 of the epitaxial unit 10, wherein the current blocking layer 20 has a strip shape and its extending direction and length are the same as that of the semiconductor exposing portion 15.

Figure 3A:
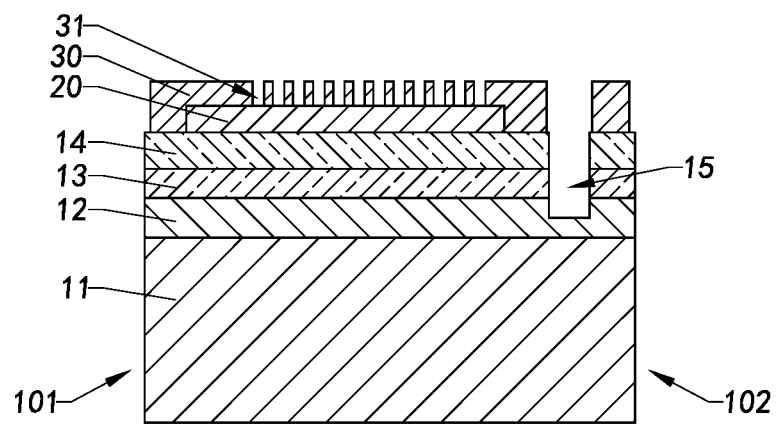
FIG. 3A is a schematic cross-sectional view illustrating another one of the manufacturing steps of the semiconductor chip according to the above first preferred embodiment of the present invention.
Figure 3B:
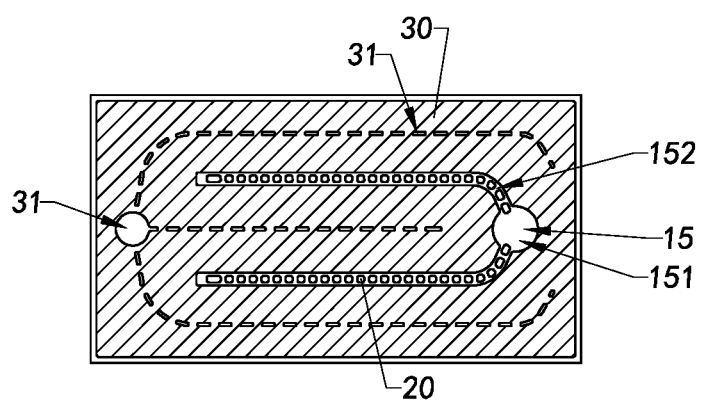
FIG. 3B is a schematic top view illustrating another one of the manufacturing steps of the semiconductor chip according to the above first preferred embodiment of the present invention.

Referring to FIGS. 3A and 3B of the drawings, a manufacturing process to form the transparent conductive layer 30 on the current blocking layer 20 is illustrated. Firstly, an indium tin oxide (ITO) layer is deposited on the P-type semiconductor layer 14 of the epitaxial unit 10, wherein the indium tin oxide layer is electrically connected to the P-type semiconductor layer 14. Then, an alloy treatment is performed on the indium tin oxide layer. It is worth mentioning that the way of alloy-treating the indium tin oxide layer is not limited in the present invention. For example, a rapid annealing furnace or an alloy furnace tube may be used for alloy-treating the indium tin oxide. Then, a photoresist is used to perform photolithography on the indium tin oxide layer with positive photoresist, and after the photolithography is completed, the indium tin oxide layer is etched by a wet etching so as to form the transparent conductive layer 30 after the etching is completed and the photoresist is removed, wherein the transparent conductive layer 30 has one or more through holes 31 positioned corresponding to different positions of the current blocking layers 20 stacked on the P-type semiconductor layer 14 respectively, such that the current blocking layer 20 is exposed at the one or more through holes 31 of the transparent conductive layer 30. Preferably, the etching solution used in the wet-etching technique is a mixed solution of hydrochloric acid and ferric chloride.

Preferably, the transparent conductive layer 30 has three rows of the through holes 31, wherein a first, second and third rows of the through holes 31 of the transparent conductive layer 30 are arranged corresponding to different positions of the first, second and third current blocking layers 20a, 20b, 20c respectively.

Figure 4A:
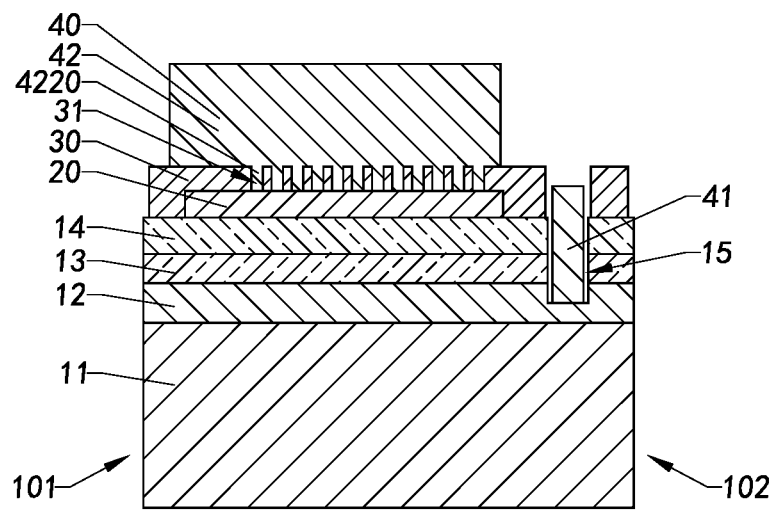
FIG. 4A is a schematic cross-sectional view illustrating another one of the manufacturing steps of the semiconductor chip according to the above first preferred embodiment of the present invention.
Figure 4B:
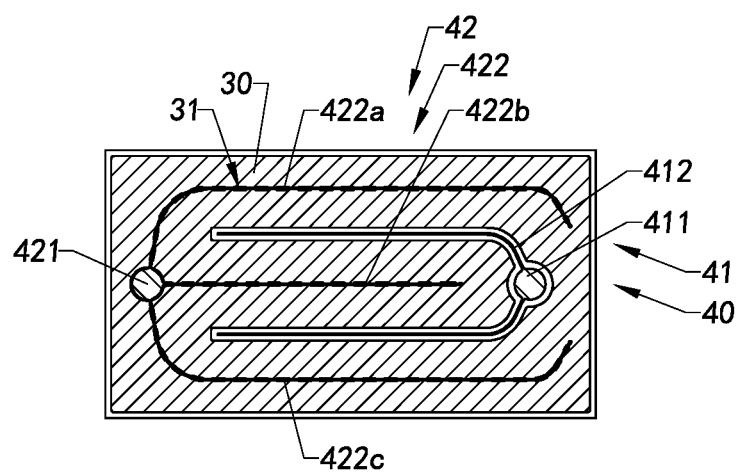
FIG. 4B is a schematic top view illustrating another one of the manufacturing steps of the semiconductor chip according to the above first preferred embodiment of the present invention.

Referring to the FIGS. 4A and 4B of the drawings, a manufacturing process of making the electrode assembly 40 is illustrated as follows.

Firstly, a pattern of an N-type electrode 41 and a pattern of a P-type electrode 42 of the electrode assembly 40 are etched on the outer surface of the transparent conductive layer 30 by photolithography with negative photoresist.

Then, a metal electrode layer is deposited by evaporation or sputtering.

Thereafter, excessive metal layer and the remaining photoresist are removed by peeling, for example, thereby forming the N-type electrode 41 and the P-type electrode 42 of the electrode assembly electrode assembly 40.

More specifically, the N-type electrode 41 comprises an N-type electrode pad 411 and two N-type electrode extension members 412 electrically connected to the N-type electrode pad 411, wherein the N-type electrode pad 411 of the N-type electrode 41 is formed on the N-type electrode pad exposing portion 151 of the semiconductor exposing portion 15 of the epitaxial unit 10, such that the N-type electrode pad 411 is stacked on and electrically connected to the N-type semiconductor layer 12 of the epitaxial unit 10, and the N-type electrode extension members 412 of the N-type electrode 41 are formed on the N-type electrode extension member exposing portions 152 of the semiconductor exposing portion 15 of the epitaxial unit epitaxial unit 10 respectively, such that the N-type electrode extension members 412 are stackedly formed on and electrically connected to the N-type semiconductor layer 12 of the epitaxial unit 10. It is appreciated that the N-type electrode extension members 412 fills a gap formed between the adjacent current blocking layers 20 stacked on the N-type semiconductor layer 12. Preferably, the two N-type electrode extension members 412 are extended from the N-type electrode pad 411 towards the first end portion 101 of the semiconductor chip in a longitudinal direction at a middle portion of the semiconductor chip in a symmetrical manner.

Correspondingly, the P-type electrode 42 comprises one P-type electrode pad 421 and three P-type electrode extension members 422 electrically connected to the P-type electrode pad 421, wherein the three P-type electrode extension members 422 are defined a first P-type electrode extension member strip 422a, a second P-type electrode extension member strip 422b, and a third P-type electrode extension member strip 422c. The P-type electrode pads 421 and the P-type electrode extension members 422 are stackedly formed on the transparent conductive layer 30, wherein the P-type electrode pad 421 of the P-type electrode 42 is formed at the first end portion 101 of the semiconductor chip, and each of the P-type electrode extension members 422 is extended from the P-type electrode pad 421 to the second end portion 102 of the semiconductor chip in a longitudinal direction thereof. In a height direction of the semiconductor chip, the first P-type electrode extension member 422a of the P-type electrode 42 is overlappedly formed on the first current blocking layer 20a, such that the P-type prongs 4220 of the first P-type electrode extension member 422a are formed and retained in the through holes 31 of the transparent conductive layer 30 respectively. The second P-type electrode extension member 422b of the P-type electrode 42 is overlappedly formed on the second current blocking layer 20b, such that the P-type prongs 4220 of the second P-type electrode extension member 422b are formed and retained in the through holes 31 of the transparent conductive layer 30 respectively. The third P-type electrode extension member 422c of the P-type electrode 42 is overlappedly formed on the third current blocking layer 20c, such that the P-type prongs 4220 of the third P-type electrode extension member 422a are formed and retained in the through holes 31 of the transparent conductive layer 30 respectively.

In other words, the first P-type electrode extension member 422a of the P-type electrode 42 and the third P-type electrode extension member 422c of the P-type electrodes 42, arranged in a symmetrical manner, are extended from the P-type electrode pad 421 towards the second end portion 102 of the semiconductor chip along a longitudinal direction at the peripheral edge of the semiconductor chip. The second P-type electrode extension member 422b of the P-type electrode 42 is extended from the P-type electrode pad 421 towards the second end portion 102 of the semiconductor chip along a longitudinal direction at a middle portion of the semiconductor chip. One of the N-type electrode extension members 412 of the N-type electrode 41 is retained between the first P-type electrode extension member strip 422a and the second P-type electrode extension member strip 422b of the P-type electrode P-type electrode 42, while the other N-type electrode extension member 412 is retained between the second P-type electrode extension member 422b and the third P-type electrode extension member 422c.

Preferably, the semiconductor chip further comprises a passivation layer 50 stackedly formed on the P-type semiconductor layer 14 of the epitaxial unit 10, wherein the passivation layer 50 encapsulates the transparent conductive layer 30 and the N-type electrode 41 and P-type electrode 42 of the electrode assembly 40. The passivation layer 50 has at least one first through hole 51 formed with respect to the N-type electrode pad 411 of the N-type electrode 41 of the electrode assembly 40 for exposing the N-type electrode pad 411 at the first through hole 51 and at least one second through hole 52 formed with respect to the P-type electrode pads 421 of the P-type electrodes 42 of the electrode assembly 40 for exposing the P-type electrode pad 421 at the second through hole 42.

Figure 5A:
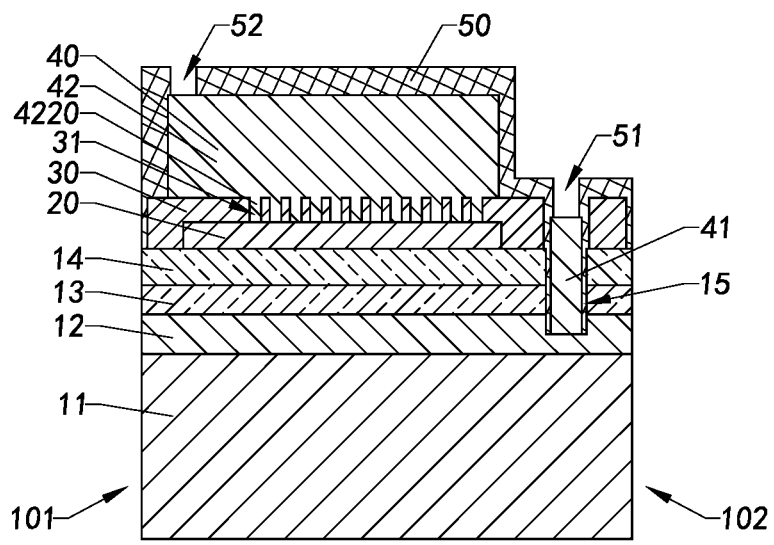
FIG. 5A is a schematic cross-sectional view illustrating another one of the manufacturing steps of the semiconductor chip according to the above first preferred embodiment of the present invention, which illustrates a cross-sectional state of the semiconductor chip.
Figure 5B:
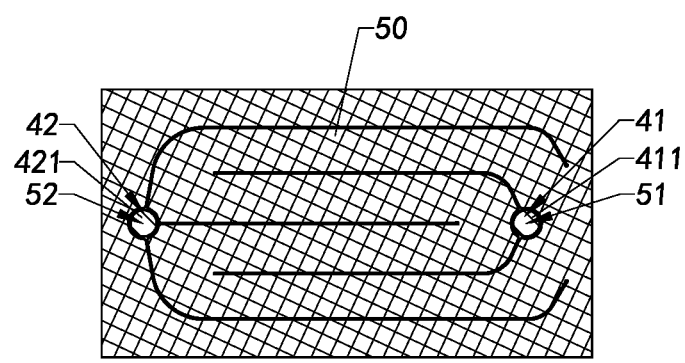
FIG. 5B is a schematic top view illustrating another one of the manufacturing steps of the semiconductor chip according to the above first preferred embodiment of the present invention, which shows the top view of the semiconductor chip.

More specifically, referring to FIGS. 5A and 5B of the drawings, a manufacturing process of making the passivation layer 50 is illustrated as follows.

First, Plasma Enhanced Chemical Vapor Deposition (PECVD) is used to deposit a layer of SiO2 (silicon dioxide) on the P-type semiconductor layer 14 of the epitaxial unit 10, wherein a thickness of the SiO2 ranges from 500 angstroms to 10,000 angstroms (including 500 angstroms and 10,000 angstroms). The reaction gases being used are SiH4 (silane), N2O (nitrogen monoxide), and N2 (nitrogen).

Then, a structure of the passivation layer 50 is photo-etched using positive photoresist.

Then, the SiO2 layer is etched by wet etching to make a pattern of the passivation layer 50, wherein the etching solution being used is preferably a mixed solution of hydrofluoric acid and ammonium fluoride.

Finally, after the etching is completed, the photoresist is removed, such that the passivation layer 50 is formed stacking on the P-type semiconductor layer 14 of the epitaxial unit 10 and encapsulating the transparent conductive layer 30 and the N-type electrode 41 and the P-type electrode 42 of the electrode assembly 40. As shown in the FIGS. 5A and 5B, the first through hole 51 of the passivation layer 50 is positioned with respect to the N-type electrode pad 411 of the N-type electrode 41 while the second through hole 52 is positioned with respect to the P-type electrode pad 421 of the P-type electrode 42.

External electrical power can be applied to the N-type electrode 41 and the P-type electrode 42 of the electrode group 40 through the first through-hole 51 and the second through-hole 52 of the passivation layer 50 respectively. The current is injected into the N-type semiconductor layer 12 of the epitaxial unit 10 through the N-type electrode pad 411 and the N-type electrode extension member 412 of the N-type electrode 41, wherein the current blocking layer 20, which is retained between the N-type electrode extension member 412 and the N-type semiconductor layer 12, is capable of preventing current from being concentrated at a lower portion of the N-type electrode extension member 412, such that the current can be evenly and uniformly directed and injected to the peripheral edge of the N-type semiconductor layer 12. Accordingly, the current is injected into the transparent conductive layer 30 through the P-type electrode pad 421 stacked on the transparent conductive layer 30 and the P-type electrode extension members 422 retained in the through holes 31 of the transparent conductive layer 30, such that the current can be uniformly and evenly injected into the transparent conductive layer 30 from the outer surface and the inside thereof through the P-type electrode extension members 422. Moreover, since the current blocking layer 20 is retained between the transparent conductive layer 30 and the P-type semiconductor layer 14, the current blocking layer 20 is capable of preventing current from being concentrated at the lower portion of the P-type electrode extension members 422, such that the current can be uniformly injected into the P-type semiconductor layer 14 from its peripheral edge. The current uniformly injected into the N-type semiconductor layer 12 and the current uniformly injected into the P-type semiconductor layer 14 are recombined in the active region 13 to produce light. Accordingly, the brightness of the semiconductor chip can be effectively increased and improved.

Figure 6:
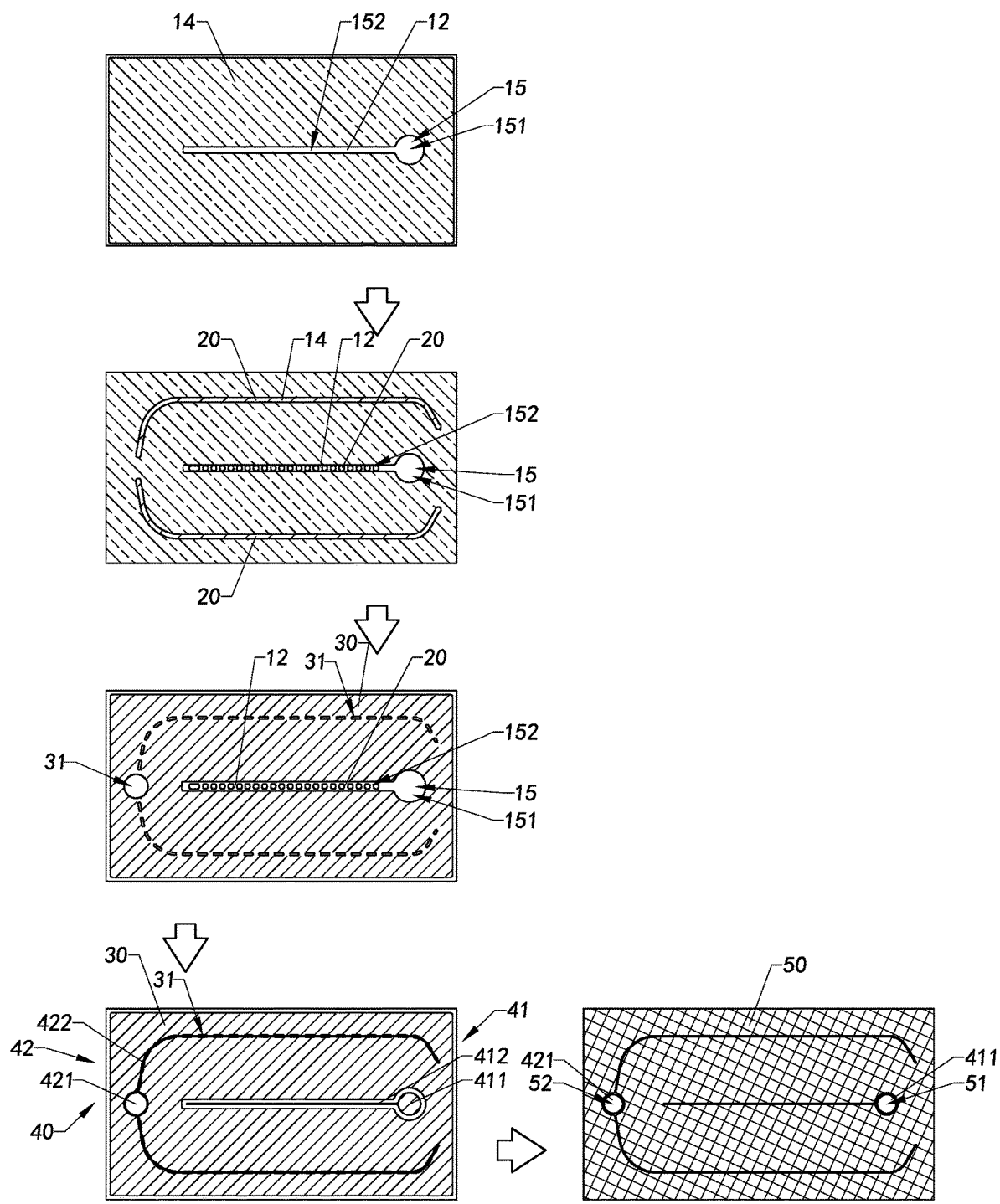
FIG. 6 is a schematic view illustrating the manufacturing steps of the semiconductor chip according to an alternative mode of the above first preferred embodiment of the present invention.

Referring to FIG. 6 of the drawings, an alternative mode of the semiconductor chip of the first preferred embodiment of the present invention is illustrated, wherein compared with the semiconductor chip illustrated in the FIGS. 1A to 5B of the drawings, the semiconductor chip in the alternative mode is different in that the semiconductor exposing portion 15 has one N-type electrode pad exposing portion 151 and one N-type electrode extension member exposing portion 152, wherein the N-type electrode pad exposing portion 151 is formed on the second end portion 102 of the semiconductor chip, while the N-type electrode extension member exposing portion 152 is extended from the N-type electrode pad exposing portion 151 to the first end portion 101 of the semiconductor chip along a longitudinal direction at a middle portion thereof.

Correspondingly, the N-type electrode 41 comprises one N-type electrode pad 411 stackedly formed on the N-type semiconductor layer 12 and retained in the N-type electrode pad exposing portion 151, and one N-type electrode extension member 412 stackedly formed on the N-type semiconductor layer 12 and retained in the N-type electrode extension member exposing portion 152, wherein the N-type electrode extension member 412 is extended from the N-type electrode pad 411 towards the first end portion 101 of the semiconductor chip along a longitudinal direction at a middle portion thereof.

Referring to FIG. 6 of the drawings, there are two current blocking layers 20 provided in the alternative mode, wherein the two current blocking layers 20 are symmetrically extended from the first end portion 101 of the semiconductor chip to the second end portion 102 thereof along a longitudinal direction at the peripheral edge of the semiconductor chip. Further, the transparent conductive layer 30 encapsulates the current blocking layer 20, such that the transparent conductive layer 30 is stackedly formed on the P-type semiconductor layer 14, wherein the through holes 31 of the transparent conductive layer 30 are arranged corresponding to different positions of the current blocking layer 20 respectively. Accordingly, the transparent conductive layer 30 has two rows of the through holes 31 arranged corresponding to different positions of the current blocking layers 20 respectively.

Correspondingly, the P-type electrode 42, after being made, comprises one P-type electrode pad 421 and two P-type electrode extension members 422, wherein the one P-type electrode pad 421 and the two P-type electrode extension members 422 are stackedly formed on the transparent conductive layer 30. The two P-type electrode extension members 422 are symmetrically extended from the P-type electrode pad 421 towards the second end portion 102 of the semiconductor chip along a longitudinal direction at the peripheral edge of the semiconductor chip, wherein the P-type prongs 4220 of the P-type electrode extension member 422 are formed and retained in the through holes of the transparent conductive layer 30 respectively. Referring to FIG. 6 of the drawings, the N-type electrode extension member 412 of the N-type electrode 41 is retained between the two P-type electrode extension members 422 of the P-type electrode 42.

Referring to FIG. 6 of the drawings, a passivation layer 50 is stackedly formed on the P-type semiconductor layer 14 of the epitaxial unit 10, wherein the passivation layer 50 encapsulates the transparent conductive layer 30 and the N-type electrode 41 and the P-type electrode 42 of the electrode assembly 40. The passivation layer 50 has at least one first through hole 51 positioned corresponding to the N-type electrode pad 411 of the N-type electrode 41 of the electrode assembly 40 for exposing the N-type electrode pad 411 at the first through hole 51, and at least one second through hole 52 positioned corresponding to the P-type electrode pads 421 of the P-type electrodes 42 of the electrode assembly 40 for exposing the P-type electrode pad 421 at the second through hole 42.

Figure 7:
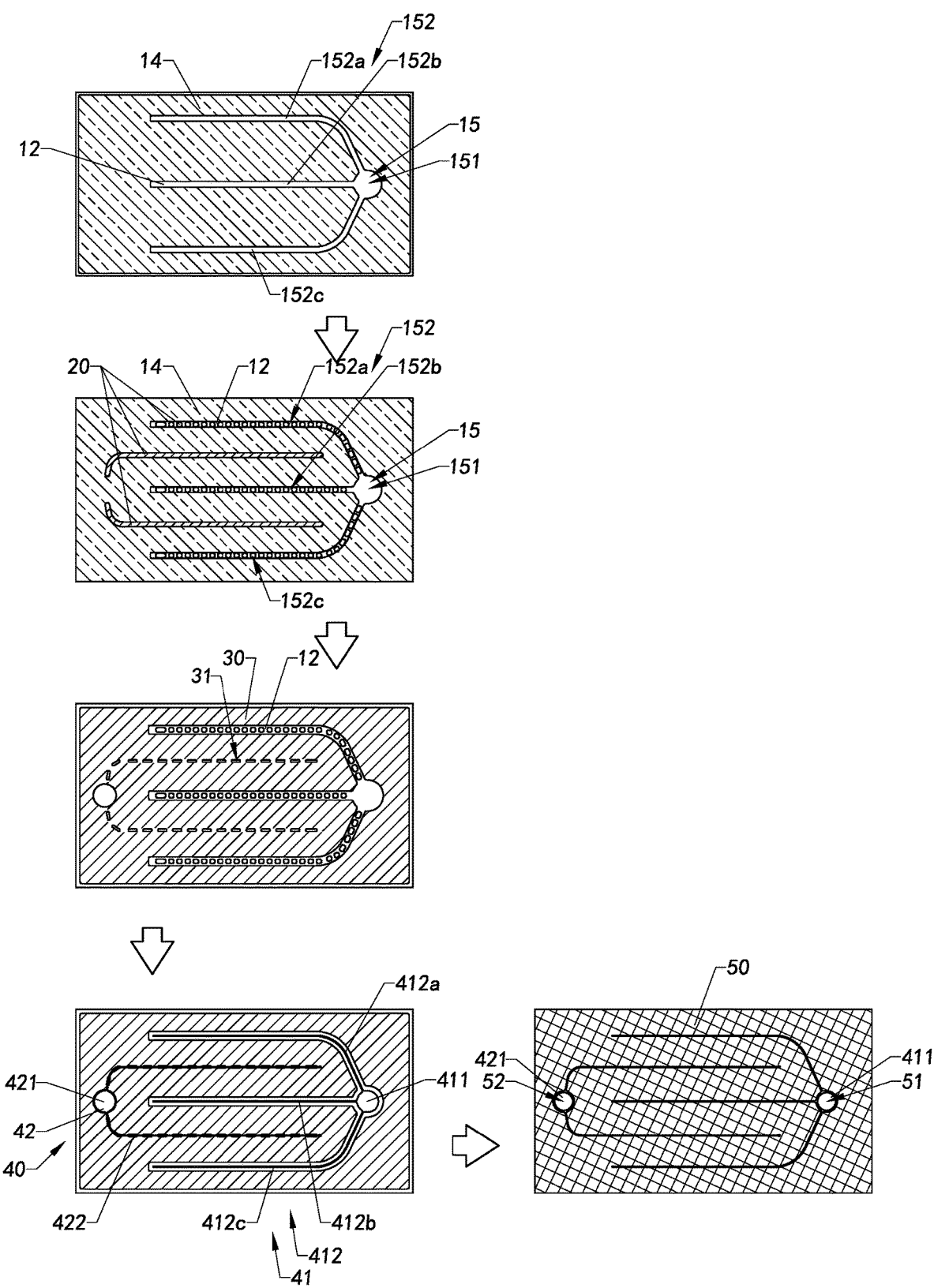
FIG. 7 is a schematic view illustrating the manufacturing steps of the semiconductor chip according to another alternative mode of the above first preferred embodiment of the present invention.

Referring to FIG. 7 of the drawings, another alternative mode of the semiconductor according to the first preferred embodiment as shown in FIGS. 1A to 5B of the present invention is illustrated, wherein the semiconductor exposing portion 15 has one N-type electrode pad exposing portion 151 and three N-type electrode extension member exposing portions 152, wherein the three N-type electrode extension member exposing portions 152 are defined as a first extension exposing portion 152a, a second extension exposing portion 152b and a third extension exposing portion 152c. Accordingly, the first extension exposing portion 152a and the third extension exposing portion 152c are symmetrically extended from the N-type electrode pad exposing portion 151 to the first end portion 101 of the semiconductor chip along a longitudinal direction at a peripheral edge of the semiconductor chip. The second extension exposing portion 152b is extended from the N-type electrode pad exposing portion 151 to the first end portion 101 of the semiconductor chip along a longitudinal direction at a middle portion thereof.

Correspondingly, the N-type electrode 41 comprises one N-type electrode pad 411 stackedly formed on the N-type semiconductor layer 12 and retained in the N-type electrode pad exposing portion 151 and three N-type electrode extension members 412 stackedly formed on the N-type semiconductor layer 12 and retained in the N-type electrode extension member exposing portion 152, wherein the three N-type electrode extension members 412 are defined as a first N-type electrode extension member 412a, a second N-type electrode extension member 412b, and a third N-type electrode extension member 412c. Accordingly, the first N-type electrode extension member 412a and the third N-type electrode extension member 412c are symmetrically extended from the N-type electrode pad 411 to the first end portion 101 of the semiconductor chip along a longitudinal direction at a peripheral edge of the semiconductor chip. The second N-type electrode extension member 412b is extended from the N-type electrode pad 411 to the first end portion 101 of the semiconductor chip along a longitudinal direction at a middle portion thereof.

Referring to FIG. 7 of the drawings, there are two current blocking layers 20 provided in the alternative mode, wherein the two current blocking layers 20 are symmetrically extend from the first end portion 101 of the semiconductor chip to the second end portion 102 thereof along a longitudinal direction at the peripheral edge of the semiconductor chip. Further, the transparent conductive layer 30 encapsulates the current blocking layer 20, such that the transparent conductive layer 30 is stackedly formed on the P-type semiconductor layer 14, wherein the through holes 31 of the transparent conductive layer 30 are arranged corresponding to different positions of the current blocking layers 20 respectively. Accordingly, the transparent conductive layer 30 has two rows of the through holes 31 arranged corresponding to different positions of the current blocking layers 20 respectively.

Accordingly, the P-type electrode 42, after being formed, comprises one P-type electrode pad 421 stackedly formed on the P-type electrode pad 421 of the transparent conductive layer 30 and two P-type electrode extension members 422 symmetrically extended from the P-type electrode pad 421 towards the second end portion 102 of the semiconductor chip along a longitudinal direction at the peripheral edge of the semiconductor chip. Also, P-type prongs 4220 of the P-type electrode extension member 422 are formed and retained in the through holes of the transparent conductive layer 30 respectively. Referring to FIG. 7 of the drawings, the N-type electrode extension member 412 of the N-type electrode 41 is retained between the two P-type electrode extension members 422 of the P-type electrode 42.

Referring to FIG. 7 of the drawings, a passivation layer 50 is stackedly formed on the P-type semiconductor layer 14 of the epitaxial unit 10, wherein the passivation layer 50 encapsulates the transparent conductive layer 30, and the N-type electrode 41 and P-type electrode 42 of the electrode assembly 40. The passivation layer 50 has at least one first through hole 51 positioned corresponding to the N-type electrode pad 411 of the N-type electrode 41 of the electrode assembly 40 for exposing the N-type electrode pad 411 at the first through hole 51 and at least one second through hole 52 positioned corresponding to the P-type electrode pads 421 of the P-type electrodes 42 of the electrode assembly 40 for exposing the P-type electrode pad 421 at the second through hole 52.

Figure 8:
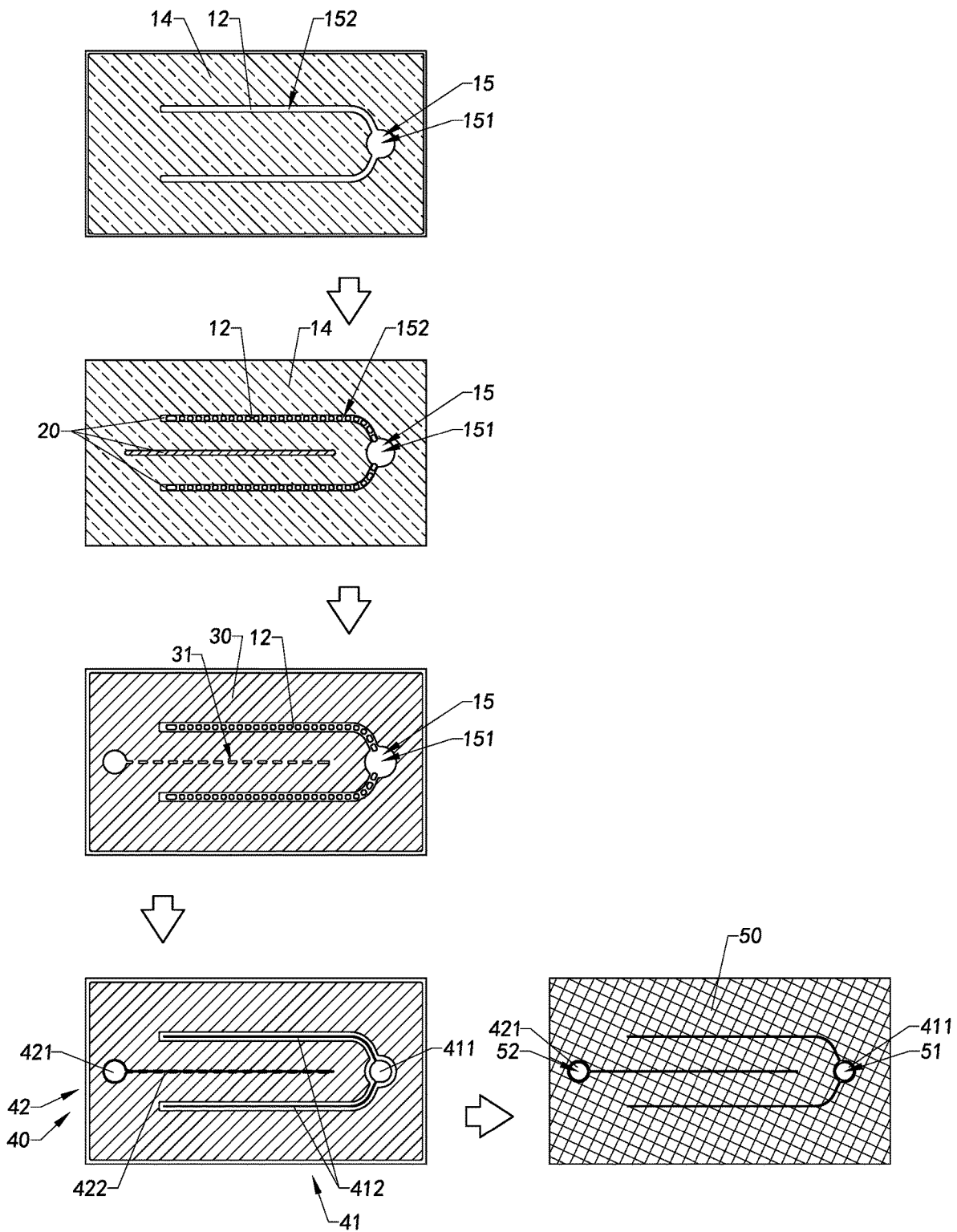
FIG. 8 is a schematic view illustrating the manufacturing steps of the semiconductor chip according to another alternative mode of the above first preferred embodiment of the present invention.

Referring to FIG. 8 of the drawings, another alternative mode of the semiconductor chip according to the first preferred embodiment of the present invention is illustrated, wherein the semiconductor chip as illustrated in FIG. 8 is different from the semiconductor chip as shown in FIG. 7 in that, the semiconductor exposing portion 15 has one N-type electrode pad exposing portion 151 and two N-type electrode extension member exposing portions 152, wherein the N-type electrode pad exposing portion 151 is formed at the second end portion 102 of the semiconductor chip and the two N-type electrode extension member exposing portions 152 are symmetrically extended from the N-type electrode pad exposing portion 151 to the first end portion 101 of the semiconductor chip along a longitudinal direction at a peripheral edge of the semiconductor chip.

Correspondingly, after the N-type electrode 41 is formed, the N-type electrode 41 comprises one N-type electrode pad 411 stacked on the N-type semiconductor layer 12 and retained in the N-type electrode pad exposing portion 151 and two N-type electrode extension member 412 stacked on the N-type semiconductor layer 12 and retained in the N-type electrode extension member exposing portion 152. Accordingly, the two N-type electrode extension members 412 are symmetrically extended from the N-type electrode pad 411 to the first end portion 101 of the semiconductor along a longitudinal direction at a peripheral edge thereof.

Referring to FIG. 8 of the drawings, there is one current blocking layer 20 provided in this alternative mode, wherein the one current blocking layer 20 extends from the first end portion 101 of the semiconductor chip to the second end portion 102 thereof along a longitudinal direction at the peripheral edge of the semiconductor chip. Thereafter, the transparent conductive layer 30 encapsulates the current blocking layer 20 in such a manner to stack on the P-type semiconductor layer 14, wherein the through holes 31 of the transparent conductive layer 30 are arranged corresponding to different positions of the current blocking layers 20 respectively.

Accordingly, the P-type electrode 42, after being formed, comprises one P-type electrode pad 421 stacked on the transparent conductive layer 30 and one P-type electrode extension member 422, wherein the one P-type electrode pad 421 which is formed at the first end portion 101 of the semiconductor chip is extended from the P-type electrode pad 421 towards the second end portion 102 of the semiconductor chip along a longitudinal direction thereof at a middle portion of the semiconductor chip. Also, the P-type prongs 4220 of the P-type electrode extension member 422 are formed and retained in the through holes of the transparent conductive layer 30 respectively. Referring to FIG. 8 of the drawings, the P-type electrode extension member 422 of the P-type electrode 42 is retained between the two N-type electrode extension members 412 of the N-type electrode 41.

Referring to FIG. 8 of the drawings, a passivation layer 50 is stackedly formed on the P-type semiconductor layer 14 of the epitaxial unit 10, wherein the passivation layer 50 encapsulates the transparent conductive layer 30 and the N-type electrode 41 and the P-type electrode 42 of the electrode assembly 40. The passivation layer 50 has at least one first through hole 51 positioned corresponding to the N-type electrode 41 of the electrode assembly 40 for exposing the N-type electrode 41 at the first through hole 51, and at least one second through hole 52 positioned corresponding to the P-type electrodes 42 of the electrode assembly 40 for exposing the P-type electrode 42 at the second through hole 42.

Figure 9:
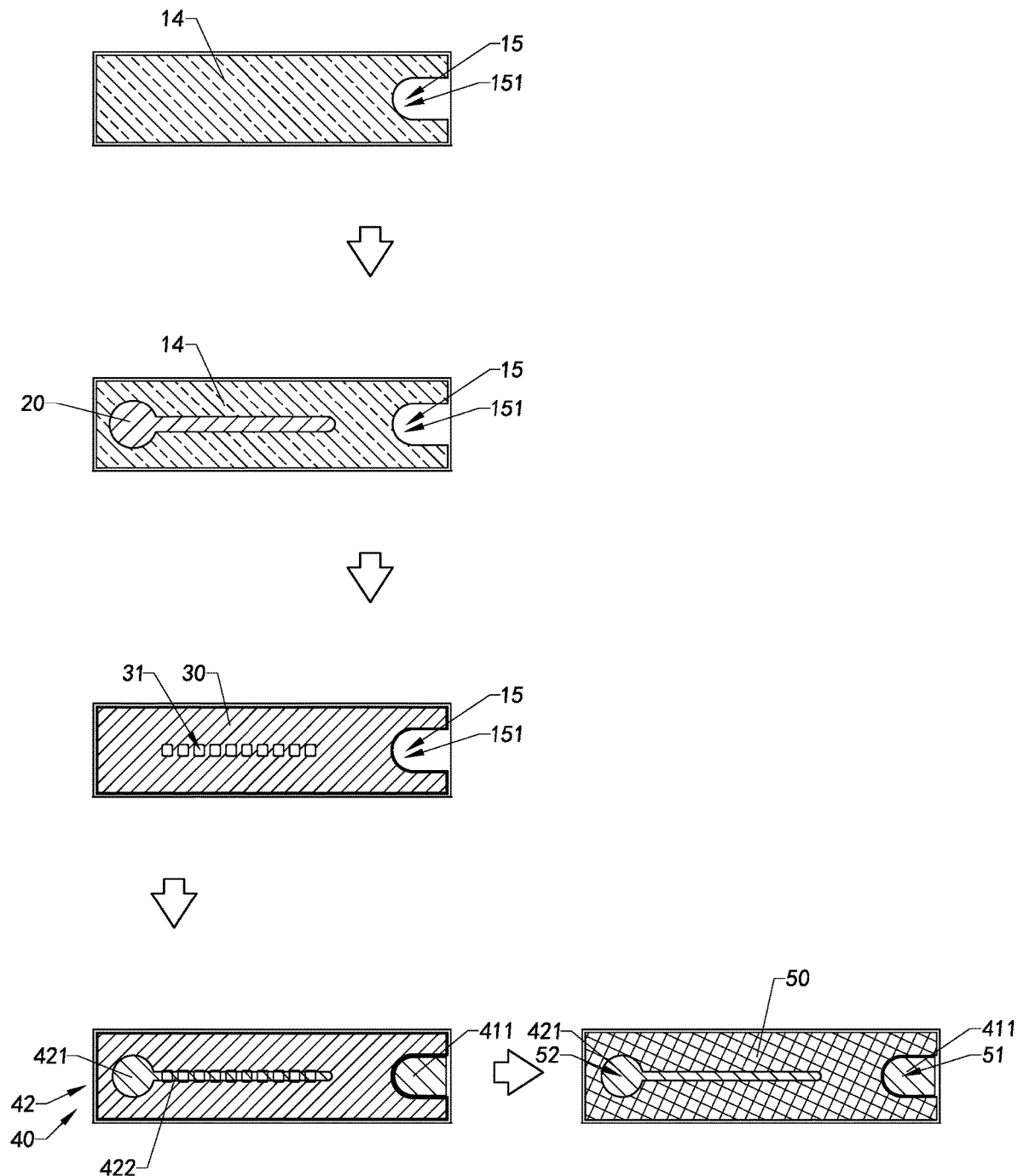
FIG. 9 is a schematic view illustrating the manufacturing steps of the semiconductor chip according to another alternative mode of the above first preferred embodiment of the present invention.

Referring to FIG. 9 of the drawings, another alternative mode of the semiconductor according to the first preferred embodiment of the present invention is illustrated, which is different with the semiconductor chip as shown in FIG. 8 in that, the semiconductor exposing portion 15 merely has one N-type electrode pad exposing portion 151 formed at the second end portion 102 of the semiconductor chip. Accordingly, the N-type electrode 41 comprises one N-type electrode pad 411 stackedly formed on the N-type semiconductor layer 12 and retained in the N-type electrode pad exposing portion 151.

Referring to FIG. 9 of the drawings, there is one current blocking layer 20 provided in this alternative mode, wherein the one current blocking layer 20 extends from the first end portion 101 to the second end portion 102 of the semiconductor chip along a longitudinal direction thereof at the peripheral edge of the semiconductor chip. Further, the transparent conductive layer 30 encapsulates the current blocking layer 20 in such a manner to stack on the P-type semiconductor layer 14, wherein the through hole 31 of the transparent conductive layer 30 is positioned corresponding to the current blocking layer 20.

Accordingly, the P-type electrode 42, after being formed, comprises one P-type electrode pad 421 stackedly formed on the transparent conductive layer 30 and one P-type electrode extension member 422, wherein the P-type electrode pad 421 is formed on the first end portion 101 of the semiconductor chip and the P-type electrode extension member 422 is extended from the P-type electrode pad 421 towards the second end portion 102 of the semiconductor chip along a longitudinal direction thereof at the peripheral edge of the semiconductor chip. Also, the P-type prong 4220 of the P-type electrode extension member 422 is formed and retained in the through hole 31 of the transparent conductive layer 30.

Referring to the FIG. 9 of the drawings, a passivation layer 50 is stackedly formed on the P-type semiconductor layer 14 of the epitaxial unit 10, wherein the passivation layer 50 encapsulates the transparent conductive layer 30, and the N-type electrode 41 and the P-type electrode 42 of the electrode assembly 40. The passivation layer 50 has at least one first through hole 51 positioned corresponding to the N-type electrode pad 411 of the N-type electrode 41 of the electrode assembly 40 for exposing the N-type electrode pad 411 at the first through hole 51, and at least one second through hole 52 positioned corresponding to the P-type electrode pads 421 of the P-type electrodes 42 of the electrode assembly 40 for exposing the P-type electrode pad 421 at the second through hole 42.

According to another aspect of the present invention, it further provides a manufacturing method of the semiconductor chip, which comprises the following steps:

(a) stacking the current blocking layer 20 on the P-type semiconductor layer 14 of the epitaxial unit 10;

(b) stacking the transparent conductive layer 30 on the P-type semiconductor layer 14 through encapsulating the current blocking layer 20, wherein the transparent conductive layer 30 has at least one through hole through holes 31 positioned corresponding to the current blocking layer 20; and (c) stacking the N-type electrode 41 on the epitaxial unit 10 through retaining the N-type electrode 41 in the semiconductor exposing portion 15 of the epitaxial unit 10, and stacking the P-type electrode 42 on the transparent conductive layer 30 through forming the one or more P-type prongs 4220 in the through hole 31 of the transparent conductive layer 30.

Furthermore, the manufacturing method further comprises a step of:

(d) stacking the passivation layer 50 on the transparent conductive layer 30 and the P-type semiconductor layer 14 through encapsulating the transparent conductive layer 30 and the P-type semiconductor layer 14, wherein the passivation layer 50 has the first through hole 51 positioned corresponding to the N-type electrode 41 and the second through hole 52 positioned corresponding to the P-type electrode 42.

It is worth mentioning that the thicknesses of the substrate 11, the N-type semiconductor layer 12, the active region 13, the second semiconductor layer 14, the current blocking layer 20, the transparent conductive layer 30, the N-type electrode 41, and the P-type electrode 42 as shown in the drawings are merely exemplary, that does not represent the real thickness of the substrate 11, the N-type semiconductor layer 12, the active region 13, the second semiconductor layer 14, the current blocking layer 20, the transparent conductive layer 30, the N-type electrode 41, and the P-type electrode 42. In addition, the real thickness proportion between the substrate 11, the N-type semiconductor layer 12, the active region 13, the second semiconductor layer 14, the current blocking layer 20, the transparent conductive layer 30, the N-type electrode between 41, and the P-type electrode 42 may also not as shown in the drawings, wherein the size proportion between the N-type electrode 41 and the P-type electrode 42 of the electrode assembly 40 and other layers of the semiconductor chip should not be limited to what is shown in the drawings.

Figure 10A:
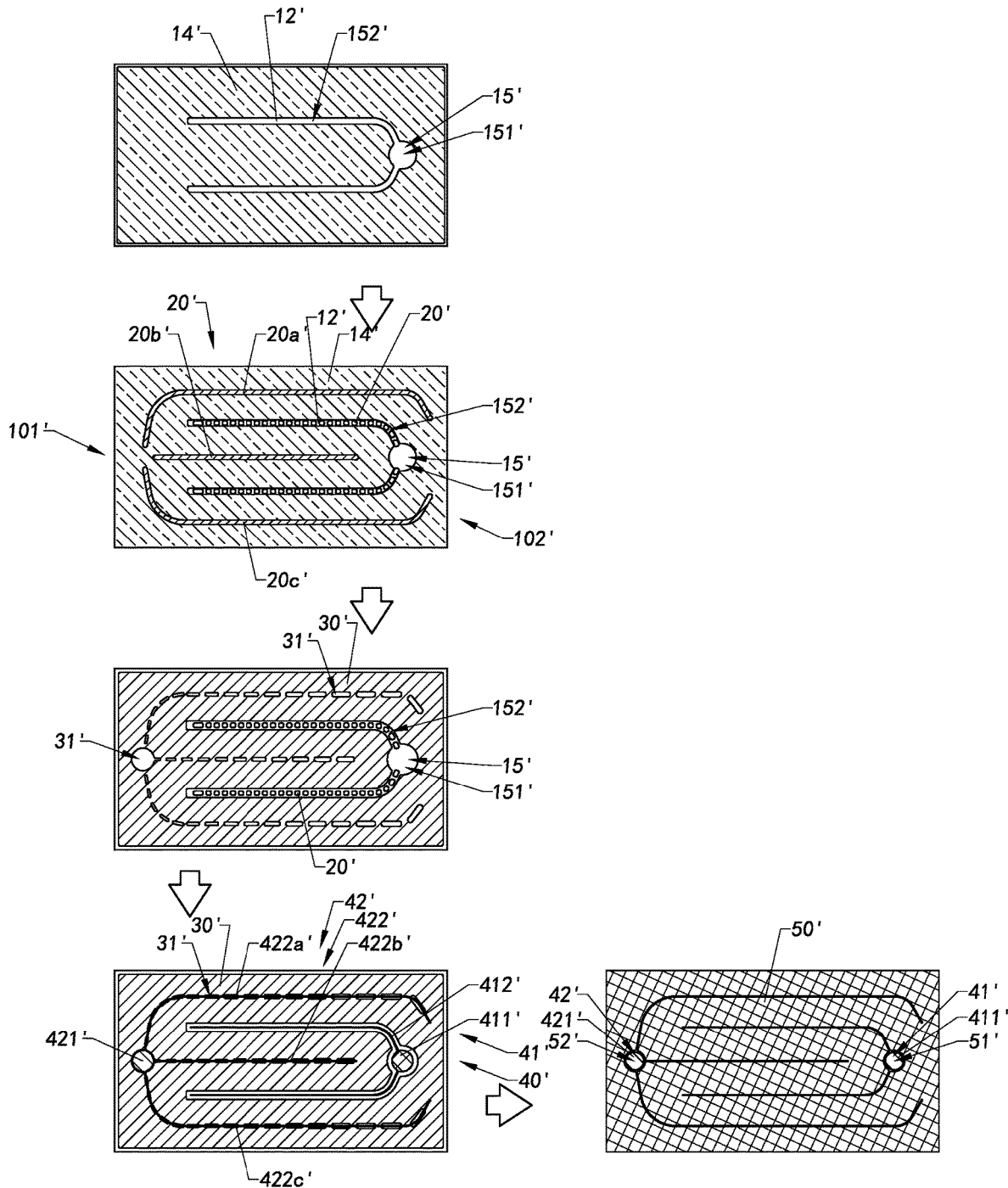
FIG. 10A is a schematic top view illustrating the manufacturing steps of a semiconductor chip according to a second preferred embodiment of the present invention.
Figure 10B:
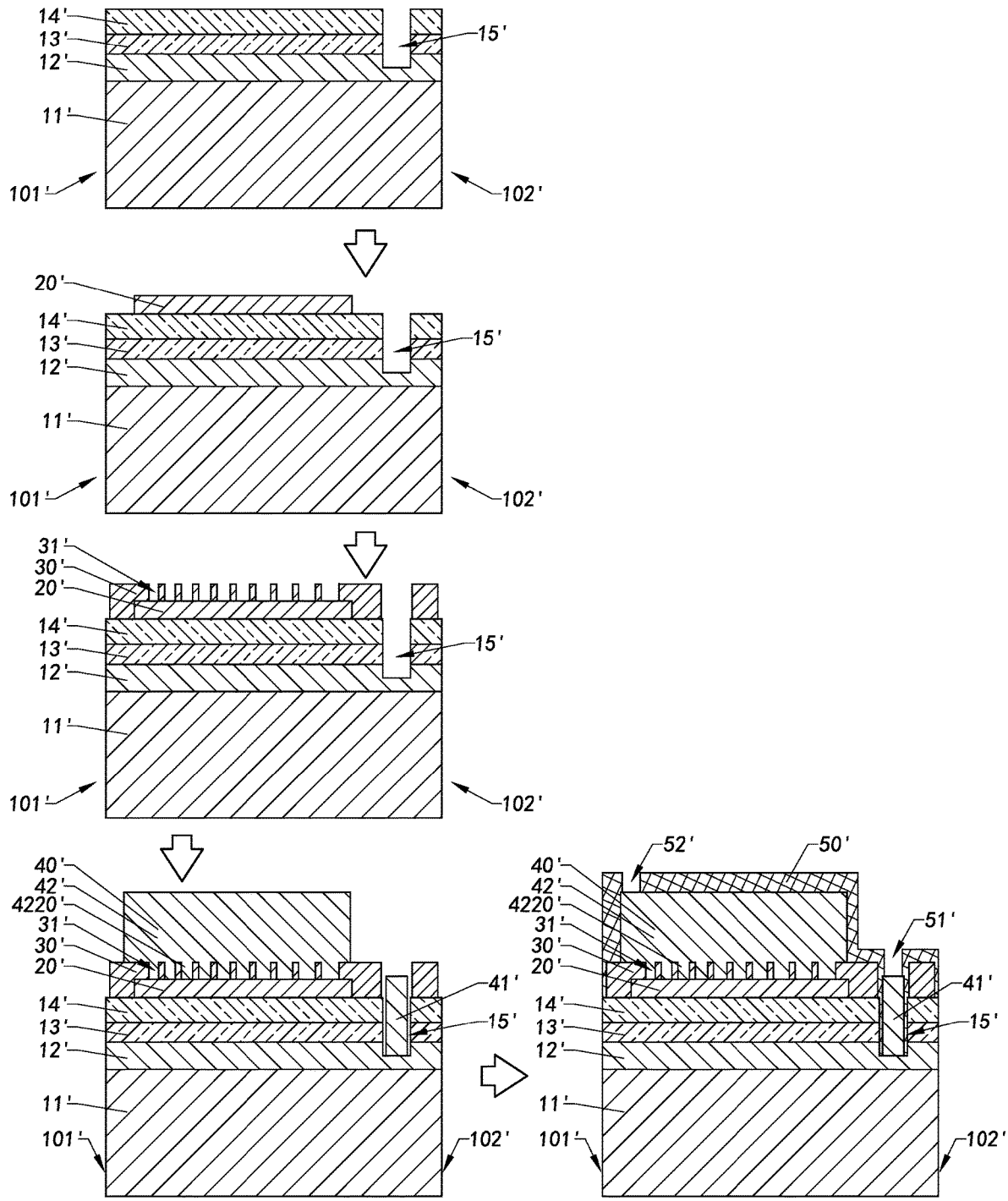
FIG. 10B is a schematic cross-sectional view illustrating the manufacturing steps of the semiconductor chip according to the above second preferred embodiment of the present invention.

Referring to FIGS. 10A and 10B of the drawings, a semiconductor chip of a LED according to a second preferred embodiment is illustrated, wherein the semiconductor chip comprises an epitaxial unit 10', at least one current blocking layer 20', a transparent conductive layer 30', and an electrode assembly 40'.

More specifically, the epitaxial unit 10' comprises a substrate 11', a N-type semiconductor layer 12', an active region 13', and a P-type semiconductor layer 14', wherein the N-type semiconductor layer 12' is grown from the substrate 11' such that the N-type semiconductor layer 12' is stackedly formed on the substrate 11'. The active region 13' is grown from the N-type semiconductor layer 12', such that the active region 13' is stackedly formed on the N-type semiconductor layer 12'. The P-type semiconductor layer 14' is grown form the active region 13', such that the P-type semiconductor layer 14' is stackedly formed on the active region 13'.

It is worth mentioning that the type of the substrate 11' of the epitaxial unit 10' is not intended to be limiting in the present invention. For example, the substrate 11' may be, but not limited to, a sapphire substrate and a silicon substrate. In addition, the types of the N-type semiconductor layer 12' and the P-type semiconductor layer 14' may also not be limited in the present invention. For example, the N-type semiconductor layer 12' may be an N-type gallium nitride layer and the P-type semiconductor layer 14' may be a P-type gallium nitride layer.

As shown in FIGS. 10A and 10B of the drawings, the epitaxial unit 10' has at least one semiconductor exposing portion 15' extending from the P-type semiconductor layer 14' through the active region 13' to the N-type semiconductor layer 12', so as to expose the N Type semiconductor layer 12'. In other words, a portion of the outer surface of the N-type semiconductor layer 12' is exposed at the semiconductor exposing portion 15'.

According to the semiconductor chip of the second preferred embodiment of the present invention, a metal-organic chemical vapor deposition (MOCVD) device may be used to sequentially grow the N-type semiconductor layer 12', the active region 13' and the P-type semiconductor layer 14' to obtain the epitaxial unit 10' with the substrate 11', the N-type semiconductor layer 12', the active region 13', and the P-type semiconductor layer 14' stackedly formed sequentially. Then, a Mesa pattern is formed with photoresist. Then, ICP (inductively coupled plasma) is used to sequentially dry-etch the P-type semiconductor layer 14' and the active region 13' to form the exposing portion 15', extending from the P-type semiconductor layer 14' through the active region 13' to the N-type semiconductor layer 12', so as to expose the N Type semiconductor layer 12' at the semiconductor exposing portion 15'.

In another alternative mode of the above second preferred embodiment of the present invention, the ICP is further utilized to etch the N-type semiconductor layer 12' to form the exposing portion 15', extending from the P-type semiconductor layer 14' through the active region 13' into the N-type semiconductor layer 12', so as to expose the N Type semiconductor layer 12' at the semiconductor exposing portion 15'. In other words, the thickness of the N-type semiconductor layer 12' corresponding to the semiconductor exposing portion 15' is smaller than that of other portions of the N-type semiconductor layer 12'.

Preferably, a depth of the semiconductor exposing portion 15' of the epitaxial unit 10' ranges from 0.7 μm to 3 μm (including 0.7 μm and 3 μm). The gases used in the process of dry-etching the P-type semiconductor layer 14', the active region 13' and the N-type semiconductor layer 12' with the inductively coupled plasma includes, but not limited to, Cl2 (chlorine), BCl3 (boron trichloride) and Ar (argon). After dry-etching the P-type semiconductor layer 14', the active region 13' and the N-type semiconductor layer 12' with the inductively coupled plasma to form the semiconductor exposing portion 15', the photoresist is removed to form the epitaxial unit 10'. The way to remove the photoresist is not intended to be limiting in the present invention. For example, the photoresist may be removed by, but not limited to, a de-gluing solution.

Furthermore, referring to FIGS. 10A and 10B of the drawings, the semiconductor chip has a first end portion 101' and a second end portion 102' opposing to the first end portion 101'. Further, as shown in FIGS. 10A and 10B of the drawings, the semiconductor exposing portion 15' is embodied to have one N-type electrode pad exposing portion 151' and two N-type electrode extension member exposing portions 152', wherein the N-type electrode pad exposing portion 151' of the semiconductor exposing portion 15' is formed at the second end portion 102' of the semiconductor chip, and the two N-type electrode extension member exposing portions 152' of the semiconductor exposing portion 15' are symmetrically extended from the N-type electrode pad exposing portion 151' to the first end portion 101' of the semiconductor chip along a longitudinal direction of the semiconductor chip at a mid-portion thereof. The two N-type electrode extension member exposing portions 152' of the semiconductor exposing portion 15' are communicated with the N-type electrode pad exposing portion 151'.

It is appreciated that the N-type electrode pad exposing portion 151' and the two N-type electrode extension member exposing portions 152' of the semiconductor exposing portion 15' may be formed in the same etching process, wherein both the N-type electrode pad exposing portion 151' and the two N-type electrode extension member exposing portions 152' of the semiconductor exposing portion 15' are extended from the P-type semiconductor layer 14' through the active region 13' to the N-type semiconductor layer N-type semiconductor layer 12' so as to expose at least a portion of the outer surface of the N-type semiconductor layer 12' at the N-type electrode pad exposing portion 151' and the two N-type electrode extension member exposing portions 152'.

Referring to FIGS. 10A and 10B of the drawings, at least one current blocking layer 20' is stackedly formed on the P-type semiconductor layer 14' of the epitaxial unit 10'. Preferably, three current blocking layers 20' are provided in strip shape, which are sequentially defined as a first current blocking layer 20a', a second current blocking layer 20b', and a third current blocking layer 20c'. The first current blocking layer 20a', the second current blocking layer 20b' and the third current blocking layer 20c' are extended from the first end portion 101' to the second end portion 102' of the semiconductor chip in a longitudinal direction thereof respectively.

One of the two N-type electrode extension member exposing portions 152' of the semiconductor exposing portion 15' is formed between the first current blocking layer 20a' and the second current blocking layer 20b', and the other N-type electrode extension member exposing portion 152' of the semiconductor exposing portions 15' is formed between the second current blocking layer 20b' and the third current blocking layer 20c'. Preferably, the first current blocking layer 20a' and the third current blocking layer 20c' are symmetrically extended from the first end portion 101' to the second end portion 102' of the semiconductor chip along a longitudinal direction at the peripheral edge of the semiconductor chip, wherein the second current blocking layer 20b' is formed between the first current blocking layer 20a' and the third current blocking layer 20c' and extends from the first end portion 101' to the second end portion 102' of the semiconductor chip in a longitudinal direction at a middle portion of the semiconductor chip.

The way to stack the current blocking layer 20' on the P-type semiconductor layer 14' of the epitaxial unit 10' is not intended to be limiting in the present invention. For example, the way to stack the current blocking layer 20' on the P-type semiconductor layer 14' of the epitaxial unit epitaxial unit 10' may include the following steps.

First, a layer of SiO2 (silicon dioxide) is deposited on the P-type semiconductor layer 14' of the epitaxial unit 10' using a Plasma Enhanced Chemical Vapor Deposition (PECVD)

method, wherein a thickness of the P-type semiconductor layer 14' of the epitaxial unit 10' ranges from 500 Angstroms to 10,000 Angstroms (including 500 Angstroms and 10,000 Angstroms) and the reaction gases being used are SiH4 (silane), N2O (nitrogen monoxide), and N2 (nitrogen). Then, the current blocking layer 20' is formed by photo-etching a positive photoresist, wherein a thickness of the photoresist ranges from 0.5 µm to 5 µm (including 0.5 µm and 5 µm).

Then, the SiO2 layer is etched to form a pattern of the current blocking layer 20' by wet-etching, wherein the etching solution is a mixed solution of hydrofluoric acid and ammonium fluoride.

Finally, the photoresist is removed after the etching is completed to form the current blocking layer 20' on the P-type semiconductor layer 14' of the epitaxial unit 10'.

Preferably, the current blocking layer 20' may be stackedly formed on the N-type semiconductor layer 12' of the epitaxial unit 10'. For example, as shown in the FIG. 10A of the drawings, the current blocking layer 20' may be formed on the N-type electrode extension member exposing portion 152' of the semiconductor exposing portion 15', such that the current blocking layer 20' is stacked on the N-type semiconductor layer 12' of the epitaxial unit 10'. More preferably, the current blocking layers 20' are intervally extended along the N-type electrode extension member exposing portion 152' of the semiconductor exposing portion 15' in a strip-shaped manner.

It is worth mentioning that, although the current blocking layer 20' as illustrated in this preferred embodiment includes a plurality of interval current blocking layers, those skilled in the art should understand that the semiconductor chip as shown in the FIGS. 10A and 10B of the drawings is merely an example, which should not be considered as a limitation to the content and scope of the present invention. In other words, in other examples of the semiconductor chip, there may be only one current blocking layer 20' provided and stacked on the N-type semiconductor layer 12' of the epitaxial unit 10', wherein the current blocking layer 20' has a strip shape and the extending direction and length of the current blocking layer 20' are the same as that of the semiconductor exposing portion 15'.

Referring to the FIGS. 10A and 10B of the drawings, a manufacturing process to form the transparent conductive layer 30' on the current blocking layer 20' is illustrated as follows.

First, an indium tin oxide (ITO) layer is deposited on the P-type semiconductor layer 14' of the epitaxial unit 10', wherein the indium tin oxide layer is electrically connected to the P-type semiconductor layer 14'.

Then, an alloy treatment is performed on the indium tin oxide layer. It is worth mentioning that the way of alloy-treating the indium tin oxide layer is not limited in the present invention. For example, a rapid annealing furnace or an alloy furnace tube may be used for alloy-treating the indium tin oxide.

Then, a photoresist is used to perform pattern photolithography on the indium tin oxide layer, and after the photolithography is completed, the indium tin oxide layer is etched by a wet etching to obtain the transparent conductive layer 30' after the etching is completed and the photoresist is removed. The transparent conductive layer 30' has one or more through holes 31', wherein the one or more through holes 31' of the transparent conductive layer 30' are respectively arranged corresponding to different positions of the current blocking layers 20' stacked on the P-type semiconductor layer 14', such that the current blocking layers 20' are exposed at the through holes 31' of the transparent conductive layer 30' respectively. Preferably, the etching solution used in the wet-etching technique is a mixed solution of hydrochloric acid and ferric chloride.

Preferably, referring to FIG. 10A of the drawings, the transparent conductive layer 30' has three rows of the through holes 31', wherein the first, second and third rows of the through holes 31' of the transparent conductive layer 30' are arranged corresponding to different positions of the first current blocking layers 20a', the second current blocking layer 20b', and the third current blocking layer 20c' respectively. In this preferred example of the semiconductor chip shown in FIGS. 10A and 10B, at least one through hole 31' in the same row of the through holes 31' is different from its adjacent through hole 31' in size. Of course, those skilled in the art should understand that in other examples of the semiconductor chip of the present invention, at least one of the through holes 31' in the same row of the through holes 31' is different from its adjacent through hole 31' in shape or both in size and shape.

Preferably, according to the preferred embodiment of the present invention as shown in FIGS. 10A and 10B, the sizes of the through holes 31' in the same row are gradually increased from the first end portion 101' towards the second end portion 102' of the semiconductor chip. In other words, the through holes 31' near to the second end portion 102' of the semiconductor chip have a larger size than those near to the first end portion 101' of the semiconductor chip.

Referring to the FIGS. 10A and 10B of the drawings, a manufacturing process of making the electrode assembly 40' is illustrated as follows.

First, a pattern of an N-type electrode 41' and a pattern of a P-type electrode 42' of the electrode assembly 40' are etched on the surface of the transparent conductive layer 30' with negative photoresist.

Then, a metal electrode layer is deposited by evaporation or sputtering.

Then, excessive metal layer and the remaining photoresist are removed, such as by peeling, to form the N-type electrode 41' and the P-type electrode 42' of the electrode assembly 40'.

More specifically, the N-type electrode 41' comprises an N-type electrode pad 411' and two N-type electrode extension members 412' electrically connected to the N-type electrode pad 411', wherein the N-type electrode pad 411' of the N-type electrode 41' is formed on the N-type electrode pad exposing portion 151' of the semiconductor exposing portion 15' of the epitaxial unit 10', such that the N-type electrode pad 411' is stackedly formed on and electrically connected to the N-type semiconductor layer 12' of the epitaxial unit 10', and the N-type electrode extension members 412' of the N-type electrode 41' are formed on the N-type electrode extension member exposing portions 152' of the semiconductor exposing portion 15' of the epitaxial unit epitaxial unit 10' respectively, such that the N-type electrode extension members 412' are stackedly formed on and electrically connected to the N-type semiconductor layer 12' of the epitaxial unit 10'. It is appreciated that the N-type electrode extension members 412' fills a gap defined between the adjacent current blocking layers 20' stacked on the N-type semiconductor layer 12'. Preferably, the two N-type electrode extension members 412' are symmetrically extended from the N-type electrode pad 411' towards the first end portion 101' of the semiconductor chip along a longitudinal direction at a middle portion of the semiconductor chip.

Correspondingly, the P-type electrode 42' comprises one P-type electrode pad 421' and three P-type electrode extension members 422' electrically connected to the P-type electrode pad 421', wherein the three P-type electrode extension members 422' are defined a first P-type electrode extension member 422a', a second P-type electrode extension member 422b', and a third P-type electrode extension member 422c'. The P-type electrode pad 421' and the three P-type electrode extension members 422' are stackedly formed on the transparent conductive layer 30', wherein the P-type electrode pad 421' of the P-type electrode 42' is formed at the first end portion 101' of the semiconductor chip, and the P-type electrode extension members 422' are extended from the first end portion 101' to the second end portion 102' of the semiconductor chip along a longitudinal direction of the semiconductor chip at the P-type electrode pad 421'. In a height direction of the semiconductor chip, the first P-type electrode extension member 422a' of the P-type electrode 42' is overlapped on the first current blocking layer 20a', such that P-type prongs 4220' of the first P-type electrode extension member 422a' are formed and retained in the through holes 31' of the transparent conductive layer 30' respectively. The second P-type electrode extension member 422b' of the P-type electrode 42' is overlapped on the second current blocking layer 20b', such that P-type prongs 4220' of the second P-type electrode extension member 422b' are formed and retained in the through holes 31' of the transparent conductive layer 30' respectively. The third P-type electrode extension member 422c' of the P-type electrode 42' is overlapped on the third current blocking layer 20c', such that P-type prongs 4220' of the third P-type electrode extension member 422a' are formed and retained in the through holes 31' of the transparent conductive layer 30' respectively.

In other words, the first P-type electrode extension member 422a' of the P-type electrode 42' and the third P-type electrode extension member 422c' of the P-type electrodes 42', arranged in a symmetric manner, are extended from the P-type electrode pad 421' towards the second end portion 102' of the semiconductor chip along a longitudinal direction at the peripheral edge of the semiconductor chip. The second P-type electrode extension member 422b' of the P-type electrode 42' is extended from the P-type electrode pad 421' towards the second end portion 102' of the semiconductor chip along a longitudinal direction at a middle portion of the semiconductor chip. One of the N-type electrode extension members 412' of the N-type electrode 41' is retained between the first P-type electrode extension member 422a' and the second P-type electrode extension member 422b' of the P-type electrode P-type electrode 42', and the other N-type electrode extension member 412' is retained between the second P-type electrode extension member 422b' and the third P-type electrode extension member 422c'.

Each of the P-type electrode extension members 422' has a row of the P-type prongs 4220'. That is, the first P-type electrode extension member 422a' has a row of the P-type prongs 4220', the second P-type electrode extension member 422b' has a row of the P-type prongs 4220', and the third P-type electrode extension member 422c' has a row of the P-type prongs 4220'.

In the process of stacking the P-type electrode 42' on the transparent conductive layer 30", the P-type prongs 4220' of the first P-type electrode extension member 422a' of the P-type electrode 42' are formed and retained in a row of through holes 31' of the transparent conductive layer 30' simultaneously and respectively. Since the sizes of the through holes 31' of the transparent conductive layer 30' are gradually increased from the first end portion 101' towards the second end portion 102' of the semiconductor chip, the sizes of the P-type prongs 4220' of the P-type electrode extension member 422a' are gradually increased from the first end portion 101' towards the second end portion 102' of the semiconductor chip as well. In other words, the sizes of the P-type prongs 4220' adjacent to the N-type electrode pad 411' are relatively larger than those far from the N-type electrode pad 411', such that the current can be evenly and uniformly distributed in the P-type semiconductor layer 14'.

In the process of stacking the P-type electrode 42' on the transparent conductive layer 30', the P-type prongs 4220' of the second P-type electrode extension member 422b' of the P-type electrode 42' are formed and retained in a row of through holes 31' of the transparent conductive layer 30' simultaneously and respectively. Since the sizes of the through holes 31' of the transparent conductive layer 30' are gradually increased from the first end portion 101' towards the second end portion 102' of the semiconductor chip, the sizes of the P-type prongs 4220' of the P-type electrode extension member 422b' are gradually increased from the first end portion 101' towards the second end portion 102' of the semiconductor chip as well. In other words, the sizes of the P-type prongs 4220' near the N-type electrode pad 411' are relatively larger than those far from the N-type electrode pad 411', such that the current can be evenly and uniformly distributed in the P-type semiconductor layer 14'.

In the process of stacking the P-type electrode 42' on the transparent conductive layer 30', the P-type prongs 4220' of the third P-type electrode extension member 422c' of the P-type electrode 42' are formed and retained in a row of through holes 31' of the transparent conductive layer 30' simultaneously and respectively. Since the sizes of the through holes 31' of the transparent conductive layer 30' are gradually increased from the first end portion 101' towards the second end portion 102' of the semiconductor chip, the sizes of the P-type prongs 4220' of the P-type electrode extension member 422c' are gradually increased from the first end portion 101' towards the second end portion 102' of the semiconductor chip as well. In other words, the sizes of the P-type prongs 4220' near the N-type electrode pad 411' are relatively larger than those far from the N-type electrode pad 411', such that the current can be evenly and uniformly distributed in the P-type semiconductor layer 14'.

Preferably, the semiconductor chip further comprises a passivation layer 50' stackedly formed on the P-type semiconductor layer 14' of the epitaxial unit 10', wherein the passivation layer 50' encapsulates the transparent conductive layer 30' and the N-type electrode 41' and the P-type electrode 42' of the electrode assembly 40'. The passivation layer 50' has at least one first through hole 51' positioned corresponding to the N-type electrode pad 411' of the N-type electrode 41' of the electrode assembly 40' so as to expose the N-type electrode pad 411' at the first through hole 51', and at least one second through hole 52' positioned corresponding to the P-type electrode pads 421' of the P-type electrodes 42' of the electrode assembly 40' so as to expose the P-type electrode pad 421' at the second through hole 42'.

More specifically, referring to FIGS. 10A and 10B of the drawings, a manufacturing process of making the passivation layer 50' is illustrated as follows.

First, Plasma Enhanced Chemical Vapor Deposition (PECVD) is used to deposit a layer of SiO2 (silicon dioxide) on the P-type semiconductor layer 14' of the epitaxial unit 10', wherein the thickness of the SiO2 ranges from 500 Angstroms to 10,000 angstroms (including 500 angstroms and 10,000 angstroms). The reaction gases being used are SiH4 (silane), N2O (nitrogen monoxide), and N2 (nitrogen).

Then, a structure of the passivation layer 50' is photo-etched with photoresist.

Then, the SiO2 layer is etched by wet etching to make a pattern of the passivation layer 50', wherein the etching solution used is preferably a mixed solution of hydrofluoric acid and ammonium fluoride.

Finally, after the etching is completed, the photoresist is removed to form the passivation layer 50' stacked on the P-type semiconductor layer 14' of the epitaxial unit 10', and that the passivation layer 50' encapsulates the transparent conductive layer 30' and the N-type electrode 41' and the P-type electrode 42' of the electrode assembly 40'. And, the first through hole 51' of the passivation layer 50' is positioned corresponding to the N-type electrode pad 411' of the N-type electrode 41' and the second through hole 52' is positioned corresponding to the P-type electrode pad 421' of the P-type electrode 42'.

External electrical power can be applied to the N-type electrode 41' and the P-type electrode 42' of the electrode group 40' through the first through-hole 51' and the second through-hole 52' of the passivation layer 50' respectively. The current is injected into the N-type semiconductor layer 12' of the epitaxial unit 10' through the N-type electrode pad 411' and the N-type electrode extension members 412' of the N-type electrode 41', wherein the current blocking layers 20', which are retained between the N-type electrode extension members 412' and the N-type semiconductor layer 12', are capable of preventing current from being concentrated and crowded at a lower portion of each of the N-type electrode extension members 412', such that the current can be evenly and uniformly injected to the N-type semiconductor layer 12' from all direction peripherally. Accordingly, the current is injected into the transparent conductive layer 30' through the P-type electrode pad 421' stacked on the transparent conductive layer 30' and the P-type electrode extension members 422' respectively retained in the through holes 31' of the transparent conductive layer 30'. Since the P-type electrode extension members 422' are stacked on the transparent conductive layer 30' and the P-type prongs 4220' of the P-type electrode extension members 422' are retained in the through holes 31' of the transparent conductive layer 30' respectively, and that the sizes of the P-type prongs 4220' of the P-type electrode extension members 422' are gradually increased from the P-type electrode pad 421' to the second end portion 102' of the semiconductor chip, the current can be uniformly and evenly injected into the transparent conductive layer 30' from the outer surface and the inside of the transparent conductive layer 30' through the P-type electrode extension members 422'. Moreover, since the current blocking layer 20' is retained between the transparent conductive layer 30' and the P-type semiconductor layer 14', the current blocking layer 20' is capable of preventing current from being concentrated and crowded at the lower portion of each of the P-type electrode extension members 422', such that the current can be evenly and uniformly injected into the P-type semiconductor layer 14' from all direction peripherally. The current uniformly injected into the N-type semiconductor layer 12' and the current uniformly injected into the P-type semiconductor layer 14' are recombined in the active region 13' to produce light. Accordingly, the brightness of the semiconductor chip can be effectively increased and improved.

Figure 11A:
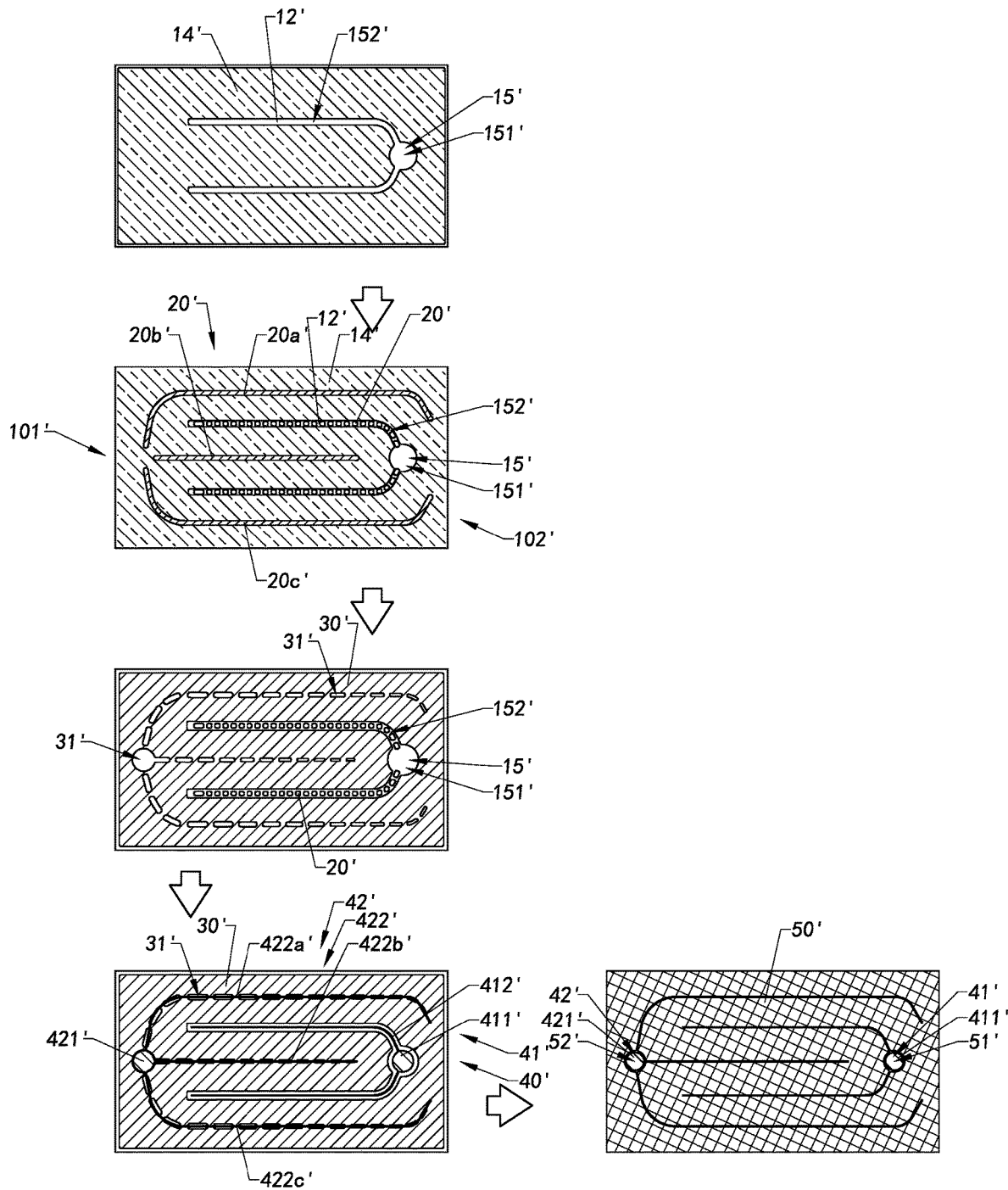
FIG. 11A is a schematic cross-sectional view illustrating the manufacturing steps of a semiconductor chip according to a third preferred embodiment of the present invention.
Figure 11B:
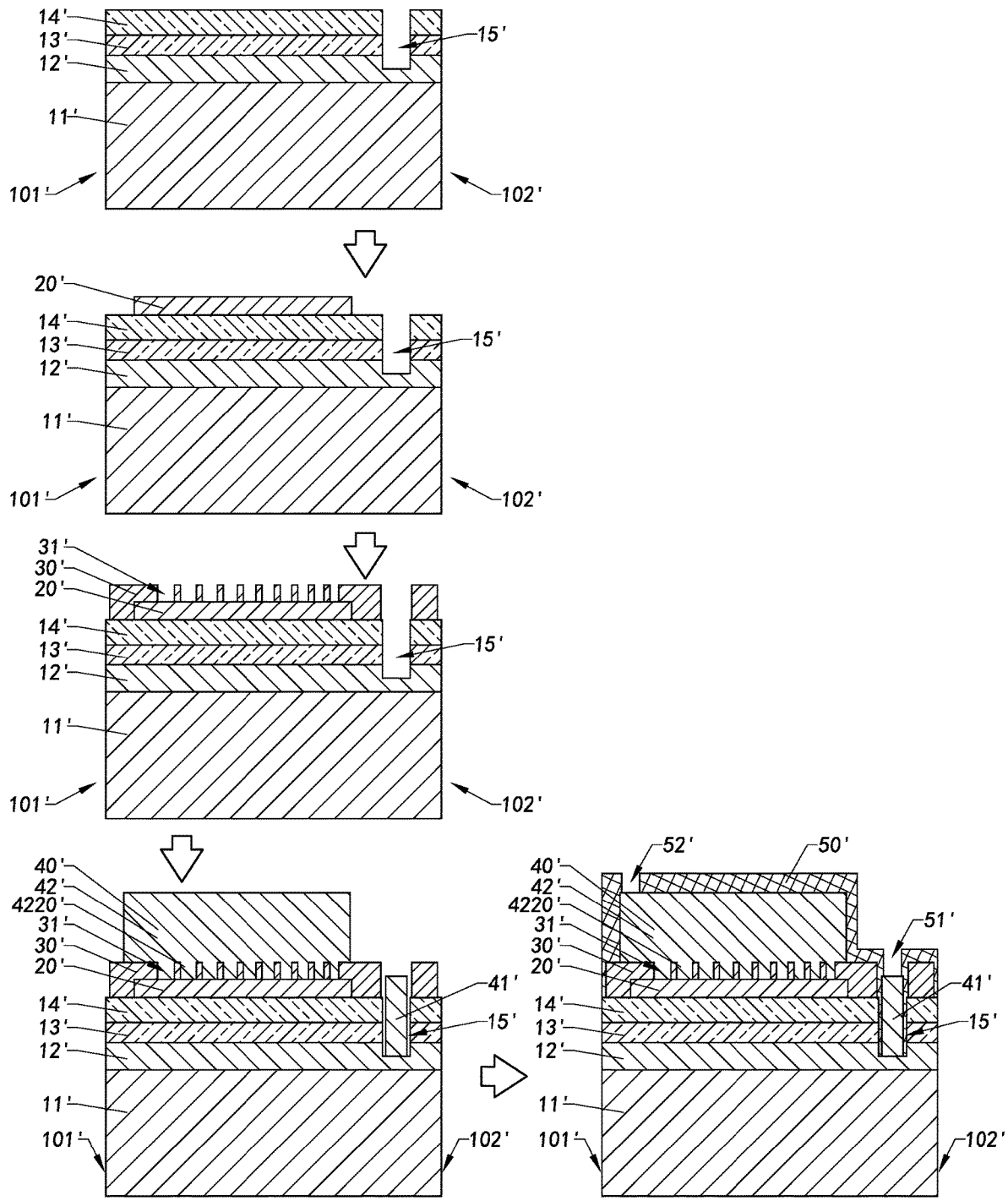
FIG. 11B is a schematic cross-sectional view illustrating the manufacturing steps of the semiconductor chip according to the above third preferred embodiment of the present invention.

Referring to the FIGS. 11A and 11B of the drawings, an alternative mode of the semiconductor chip according to the above second preferred embodiment of the present invention is illustrated, wherein in comparison with the semiconductor chip illustrated in the FIGS. 10A and 10B of the drawings, the semiconductor chip in this alternative mode is different in that the sizes of the through holes 31' of the transparent conductive layer 30' are gradually decreased from the first end portion 101' to the second end portion 102' of the semiconductor chip. In other words, the sizes of the through holes 31' near the second end portion 102' of the semiconductor chip are relatively smaller than those near the first end portion 101' of the semiconductor chip.

Correspondingly, after the P-type electrode 42' is stacked on the transparent conductive layer 30', the sizes of the P-type prongs 4220' of the P-type electrode extension members 422' of the P-type electrode 42' are gradually decreased from the first end portion 101' to the second end portion 102' of the semiconductor chip. In other words, the P-type prongs 4220' near the second end portion 102' of the semiconductor chip are relatively smaller than those near the first end portion 101' of the semiconductor chip, such that the current can be evenly and uniformly distributed in the P-type semiconductor layer 14'.

Figure 12A:
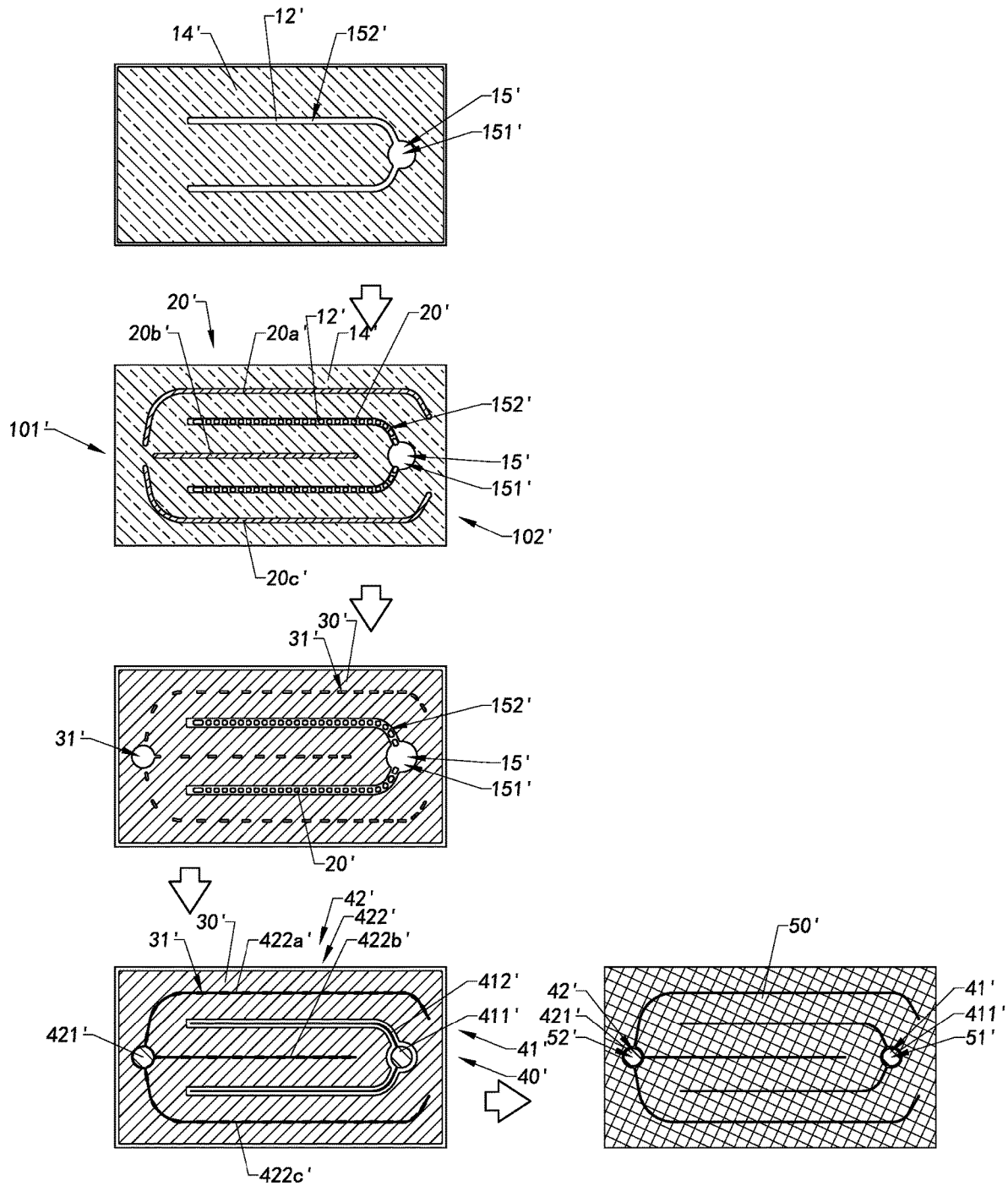
FIG. 12A is a schematic cross-sectional view illustrating the manufacturing steps of a semiconductor chip according to a fourth preferred embodiment of the present invention.
Figure 12B:
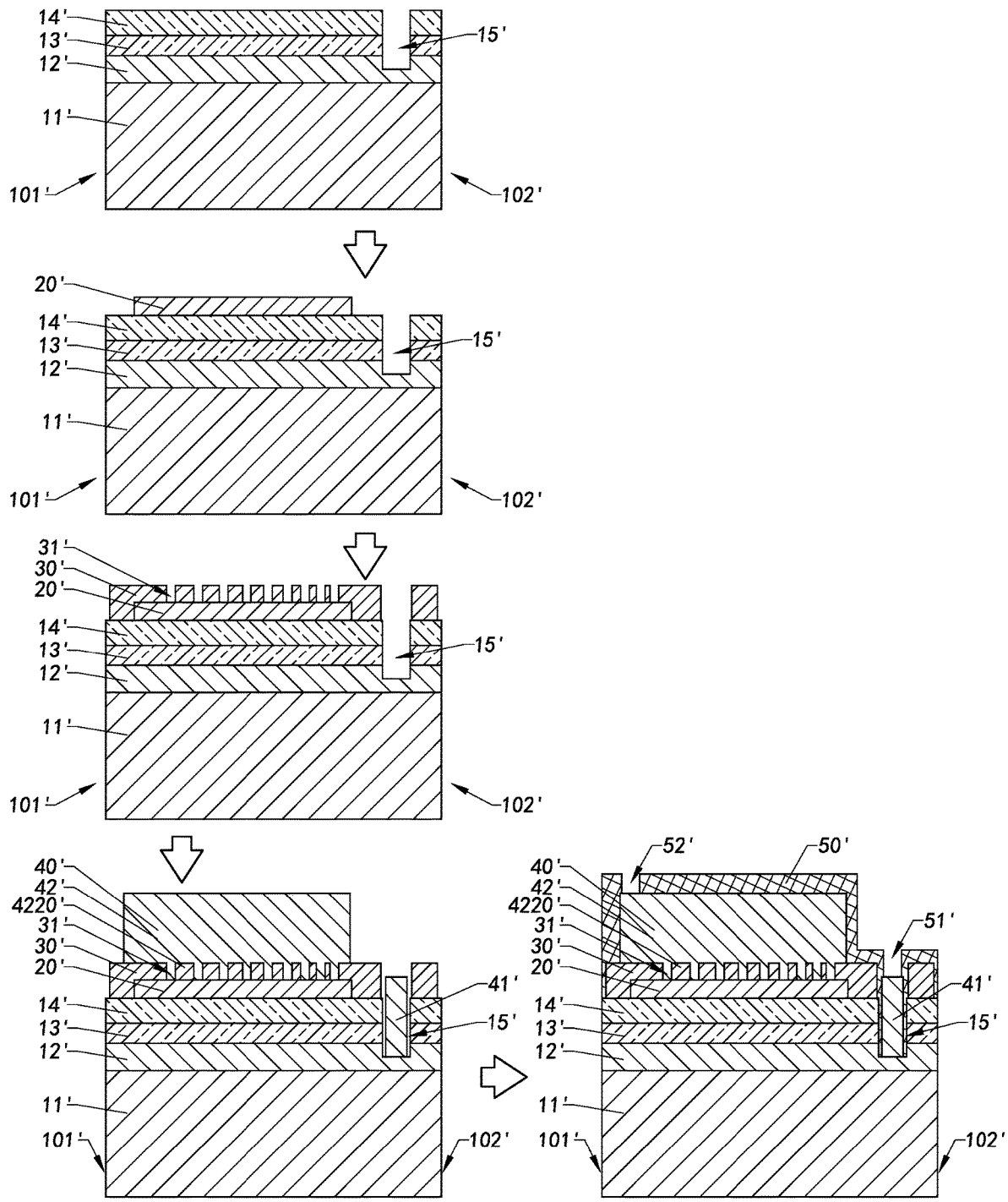
FIG. 12B is a schematic cross-sectional view illustrating the manufacturing steps of the semiconductor chip according to the above fourth preferred embodiment of the present invention.

Referring to FIGS. 12A and 12B of the drawings, another alternative mode of the semiconductor chip according to the above second preferred embodiment of the present invention is illustrated, which is different to the semiconductor chip as shown in FIGS. 10A and 10B in that, the through holes 31' of the transparent conductive layer 30' are equal in size. In addition, the distance between each two adjacent through holes 31' of the transparent conductive layer 30' is gradually decreased from the first end portion 101' to the second end portion 102' of the semiconductor chip. Accordingly, after the P-type electrode 42' is stacked on the transparent conductive layer 30', the P-type prongs 4220' of the P-type electrode extension members 422' have the same size, and that the distance between each two adjacent P-type prongs 4220' of the P-type electrode extension members 422' is gradually decreased from the first end portion 101' to the second end portion 102' of the semiconductor chip, such that the current can be evenly and uniformly distributed in the P-type semiconductor layer 14'.

Figure 13A:
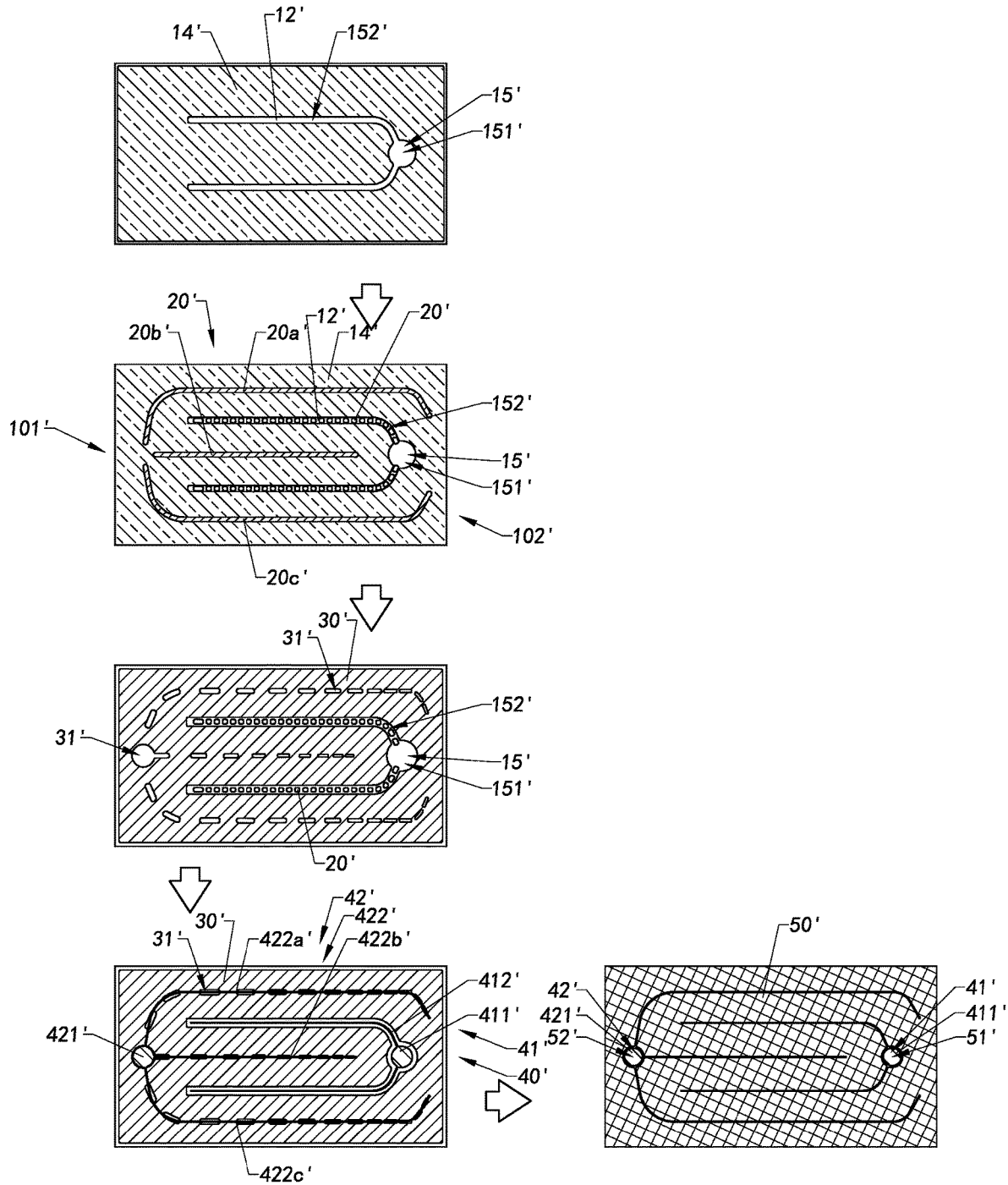
FIG. 13A is a schematic cross-sectional view illustrating the manufacturing steps of a semiconductor chip according to a fifth preferred embodiment of the present invention.
Figure 13B:
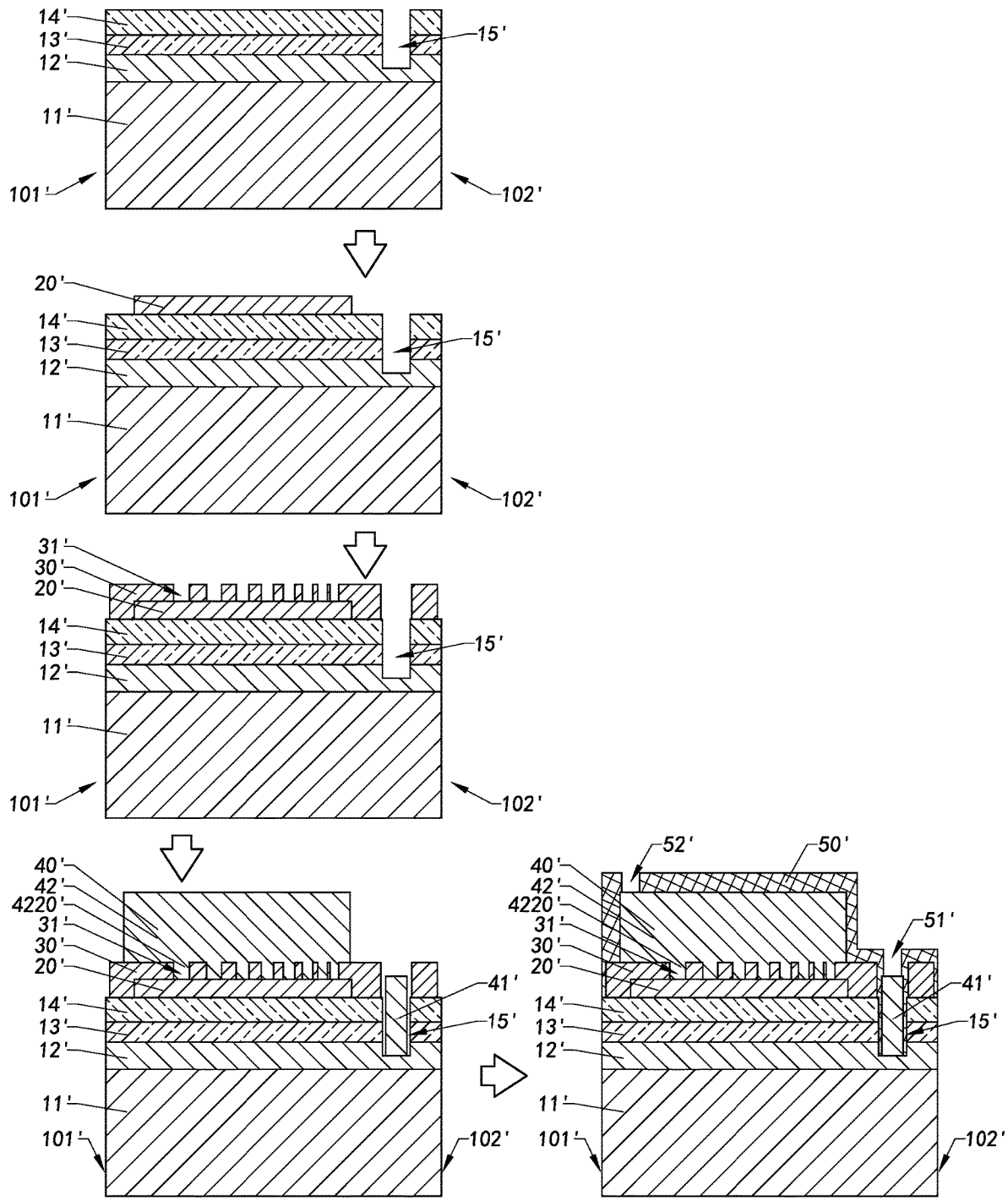
FIG. 13B is a schematic cross-sectional view illustrating the manufacturing steps of the semiconductor chip according to the above fifth preferred embodiment of the present invention.

Referring to FIGS. 13A and 13B of the drawings, another alternative mode of the semiconductor chip according to the above second preferred embodiment of the present invention is illustrated, which is different from the semiconductor chip as shown in FIGS. 10A and 10B in that, the sizes of through holes 31' of the transparent conductive layer 30' are gradually decreased from first end portion 101' to the second end portion 102' of the semiconductor chip, wherein the distance between each two adjacent through holes 31' of the transparent conductive layer 30' is gradually decreased from first end portion 101' to the second end portion 102' of the semiconductor chip. Accordingly, after the P-type electrode 42' is stackedly formed on the transparent conductive layer 30', the sizes of the P-type prongs 4220' of the P-type electrode extension member 422' are gradually decreased from the first end portion 101' to the second end portion 102' of the semiconductor chip, and that the distance between each two adjacent P-type prongs 4220' of the P-type electrode extension member 422' is gradually decreased. Therefore, it facilitates the current to be evenly and uniformly distributed in the P-type semiconductor layer 14'.

Figure 14A:
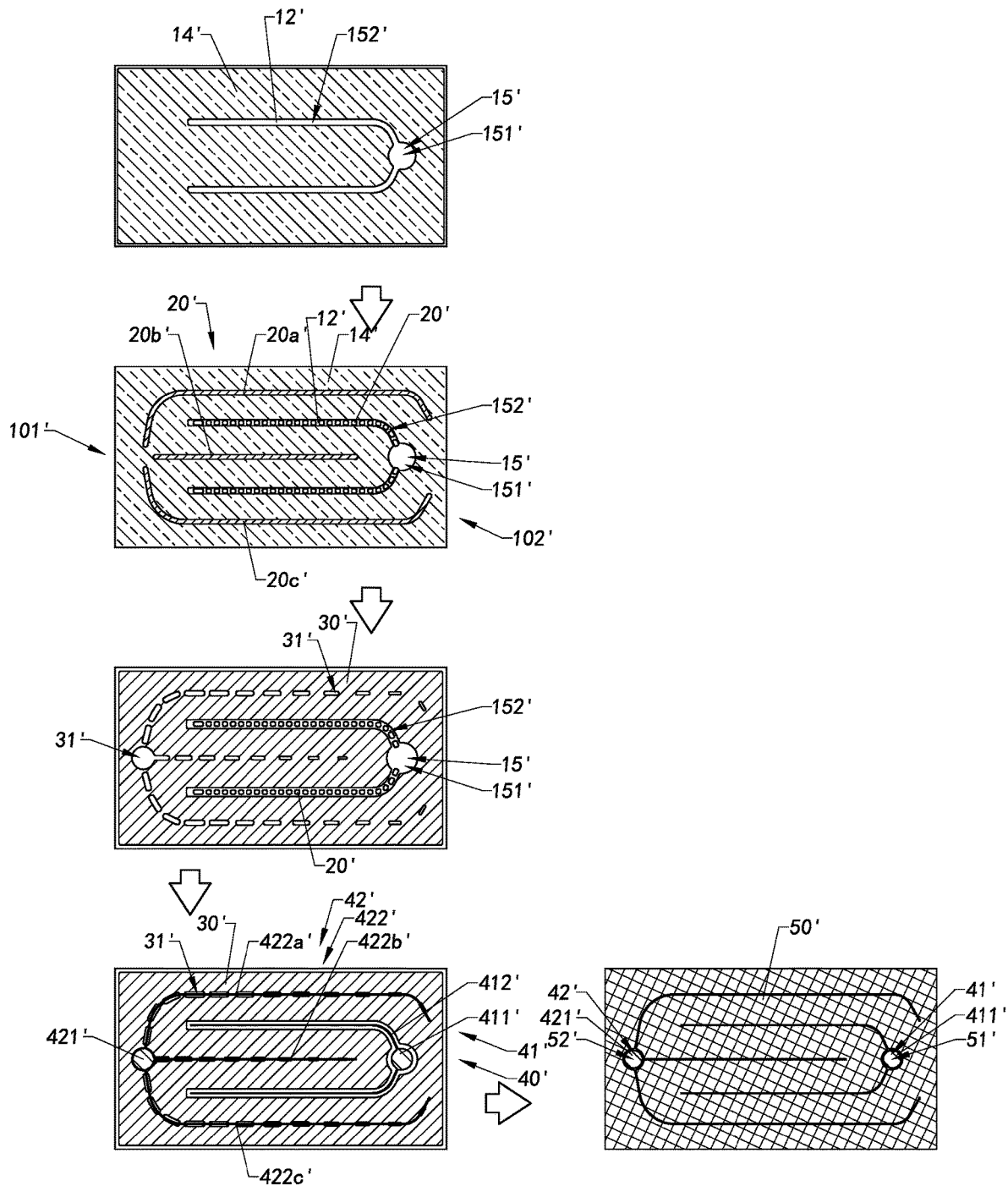
FIG. 14A is a schematic cross-sectional view illustrating the manufacturing steps of a semiconductor chip according to a sixth preferred embodiment of the present invention.
Figure 14B:
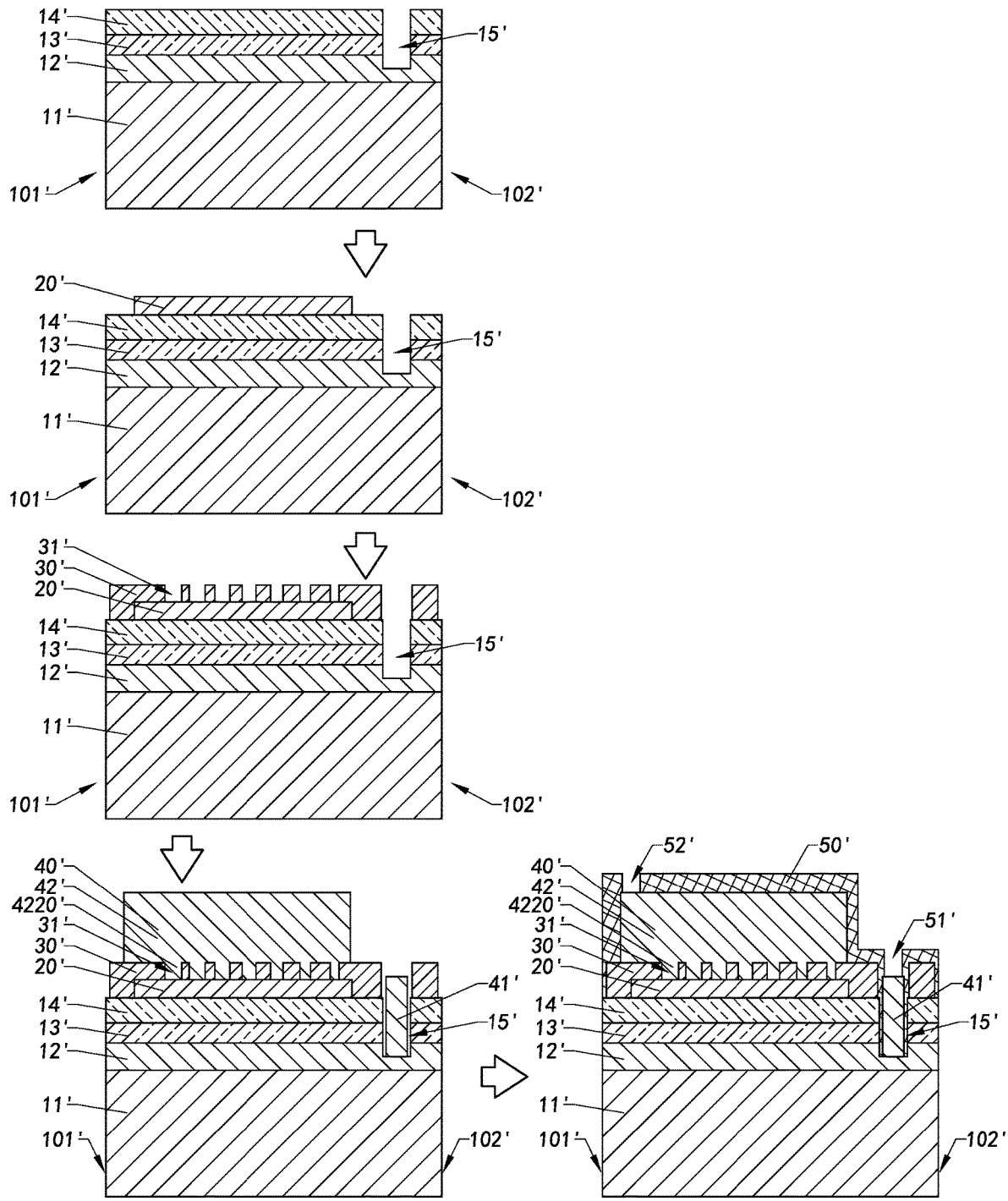
FIG. 14B is a schematic cross-sectional view illustrating the manufacturing steps of the semiconductor chip according to the above sixth preferred embodiment of the present invention.

Referring to FIGS. 14A and 14B of the drawings, another alternative mode of the semiconductor chip according to the above second preferred embodiment of the present invention is illustrated, which is different to the semiconductor chip as shown in FIGS. 10A and 10B in that, the sizes of through holes 31' of the transparent conductive layer 30' are gradually decreased from first end portion 101' to the second end portion 102' of the semiconductor chip, and that the distance between each two adjacent through holes 31' of the transparent conductive layer 30' is gradually increased from first end portion 101' to the second end portion 102' of the semiconductor chip. Accordingly, after the P-type electrode 42' is stackedly formed on the transparent conductive layer 30', the sizes of the P-type prongs 4220' of the P-type electrode extension member 422' are gradually decreased from the first end portion 101' to the second end portion 102' of the semiconductor chip and the distance between each two adjacent P-type prongs 4220' of the P-type electrode extension member 422' is gradually increased from the first end portion 101' to the second end portion 102' of the semiconductor chip. Therefore, the current can be evenly and uniformly distributed in the P-type semiconductor layer 14'.

Figure 15A:
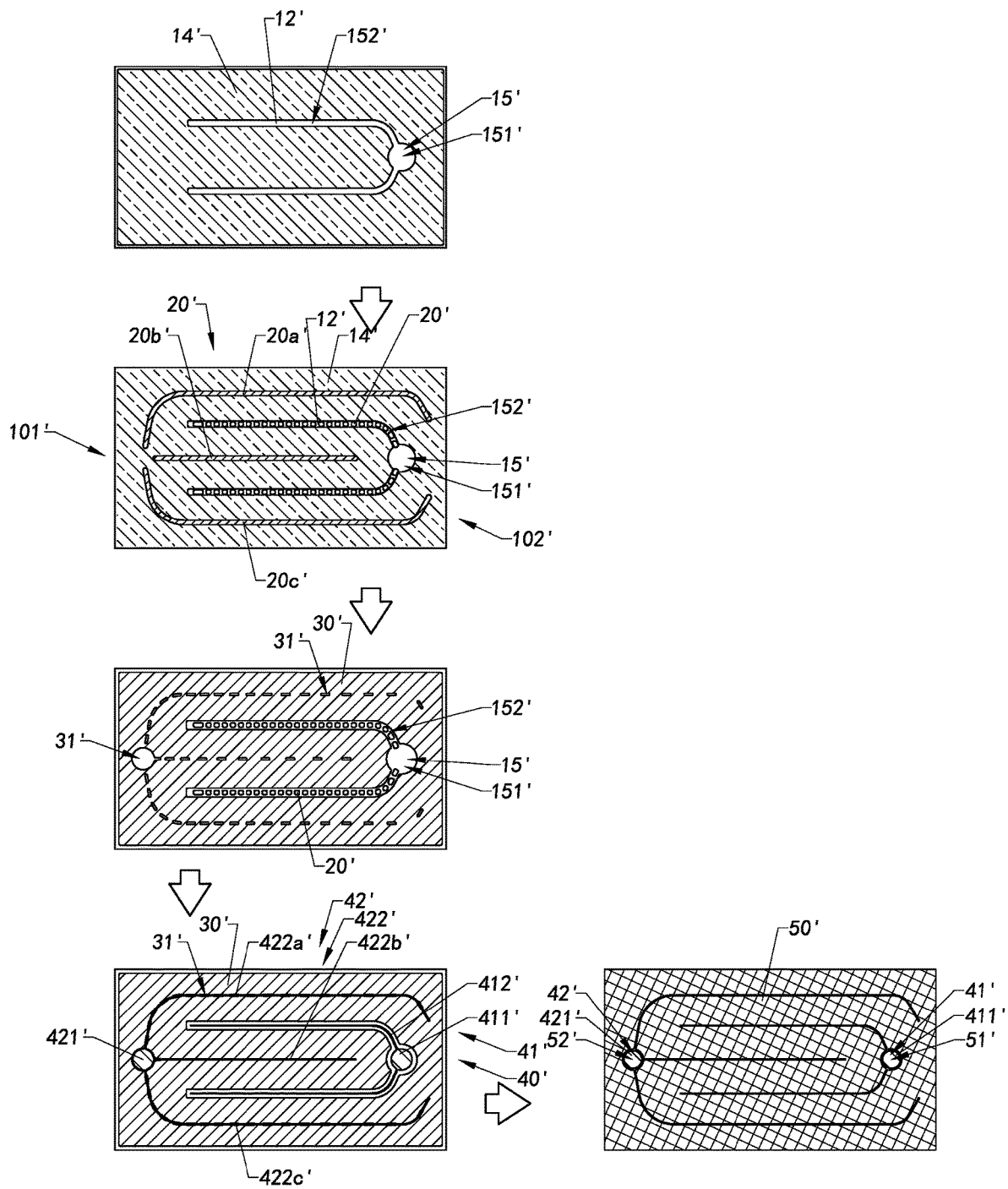
FIG. 15A is a schematic cross-sectional view illustrating the manufacturing steps of a semiconductor chip according to a seventh preferred embodiment of the present invention.
Figure 15B:
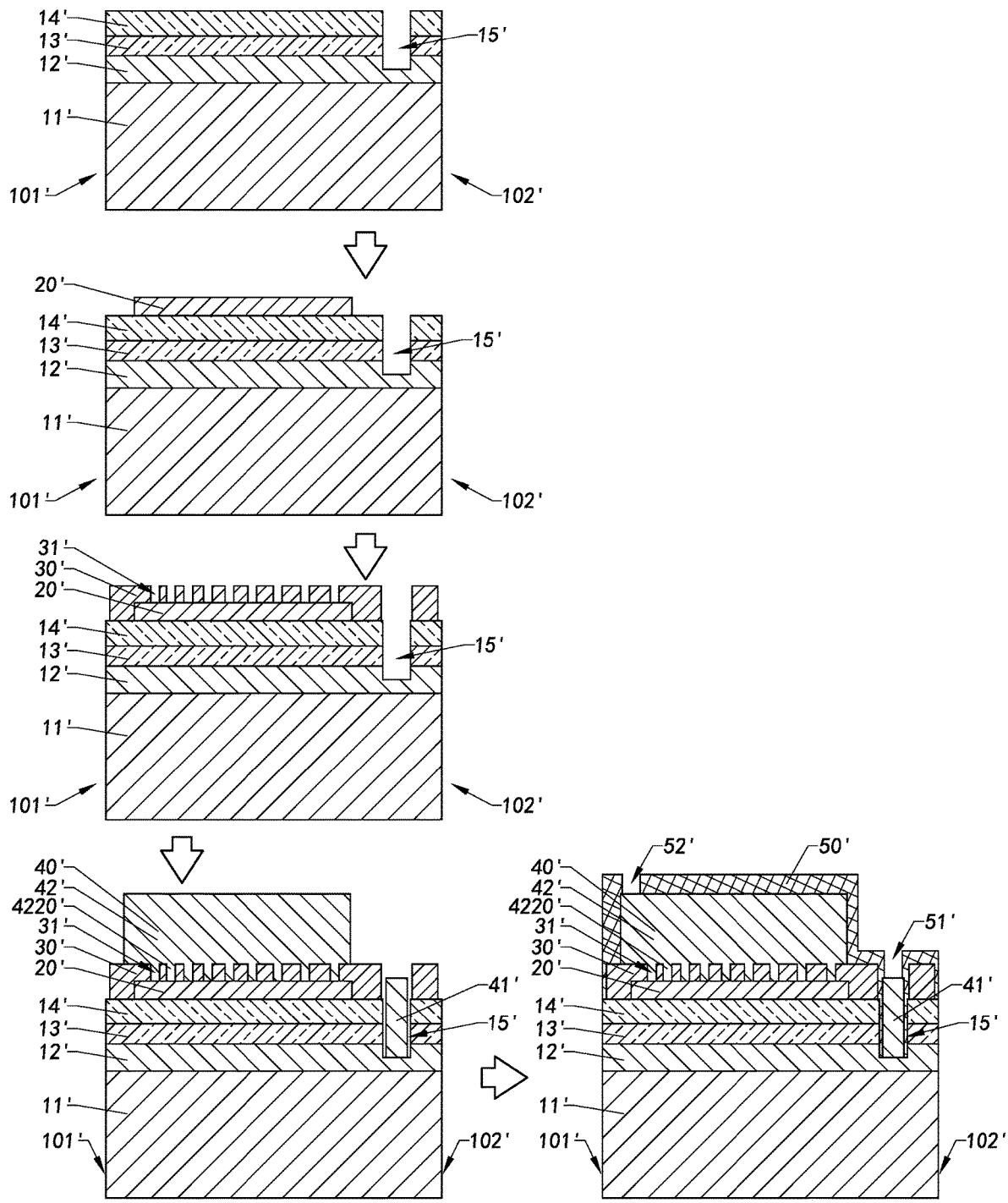
FIG. 15B is a schematic cross-sectional view illustrating the manufacturing steps of the semiconductor chip according to the above seventh preferred embodiment of the present invention.

Referring to the FIGS. 15A and 15B of the drawings, another alternative mode of the semiconductor chip according to the above second preferred embodiment of the present invention is illustrated, which is different to semiconductor chip as shown in FIGS. 10A and 10B in that, the through holes 31' of the transparent conductive layer 30' are equal in size, and the distance between each two adjacent through holes 31' of the transparent conductive layer 30' is gradually increased from first end portion 101' to the second end portion 102' of the semiconductor chip. Accordingly, after the P-type electrode 42' is stackedly formed on the transparent conductive layer 30', the P-type prongs 4220' of the P-type electrode extension member 422' are equal in size and the distance between each two adjacent P-type prongs 4220' of the P-type electrode extension member 422' is gradually increased from first end portion 101' to the second end portion 102' of the semiconductor chip. Therefore, the current can be evenly and uniformly distributed in the P-type semiconductor layer 14'.

Figure 16A:
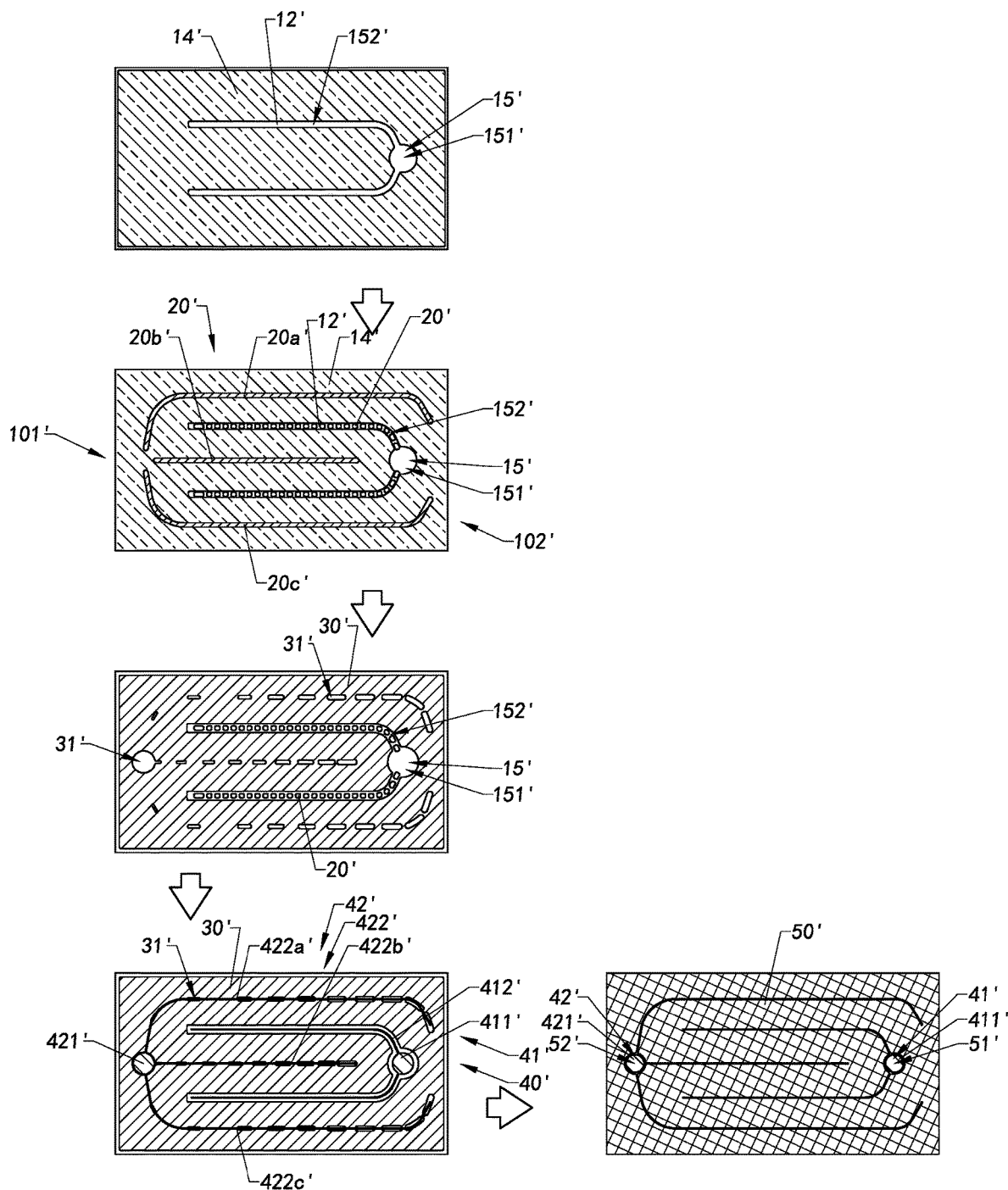
FIG. 16A is a schematic cross-sectional view illustrating the manufacturing steps of a semiconductor chip according to an eighth preferred embodiment of the present invention.
Figure 16B:
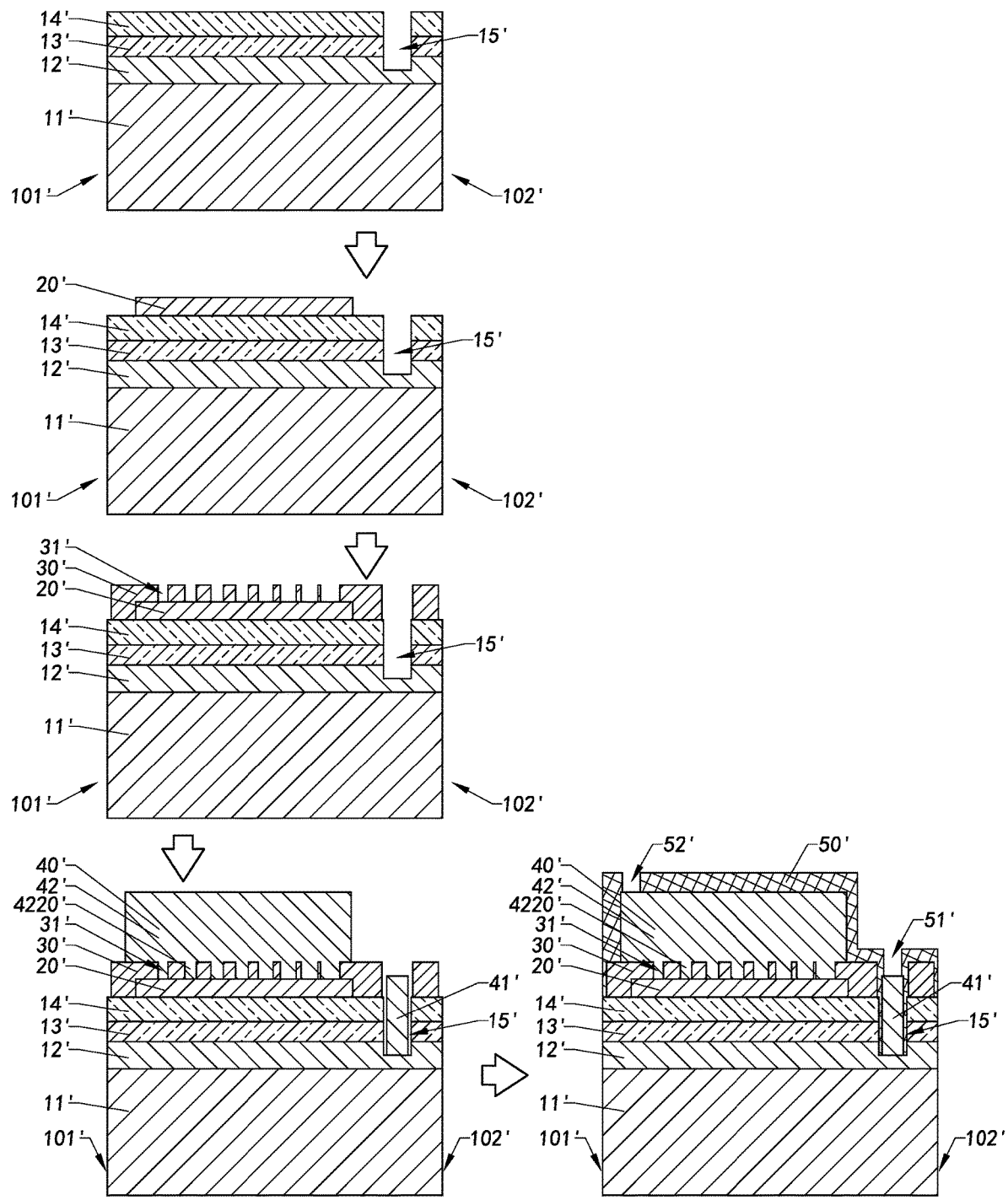
FIG. 16B is a schematic cross-sectional view illustrating the manufacturing steps of the semiconductor chip according to the above eighth preferred embodiment of the present invention.

Referring to FIGS. 16A and 16B of the drawings, another alternative mode of the semiconductor chip according to the above second preferred embodiment of the present invention is illustrated, which is different to the semiconductor chip as shown in FIGS. 10A and 10B in that, the sizes of through holes 31' of the transparent conductive layer 30' are gradually increased from first end portion 101' to the second end portion 102' of the semiconductor chip, and that the distance between each two adjacent through holes 31' of the transparent conductive layer 30' is gradually decreased from first end portion 101' to the second end portion 102' of the semiconductor chip. Accordingly, after the P-type electrode 42' is stackedly formed on the transparent conductive layer 30', the sizes of the P-type prongs 4220' of the P-type electrode extension member 422' is gradually increased from the first end portion 101' to the second end portion 102' of the semiconductor chip and the distance between each two adjacent P-type prongs 4220' of the P-type electrode extension member 422' is gradually decreased from the first end portion 101' to the second end portion 102' of the semiconductor chip. Therefore, the current can be evenly and uniformly distributed in the P-type semiconductor layer 14'.

Figure 17A:
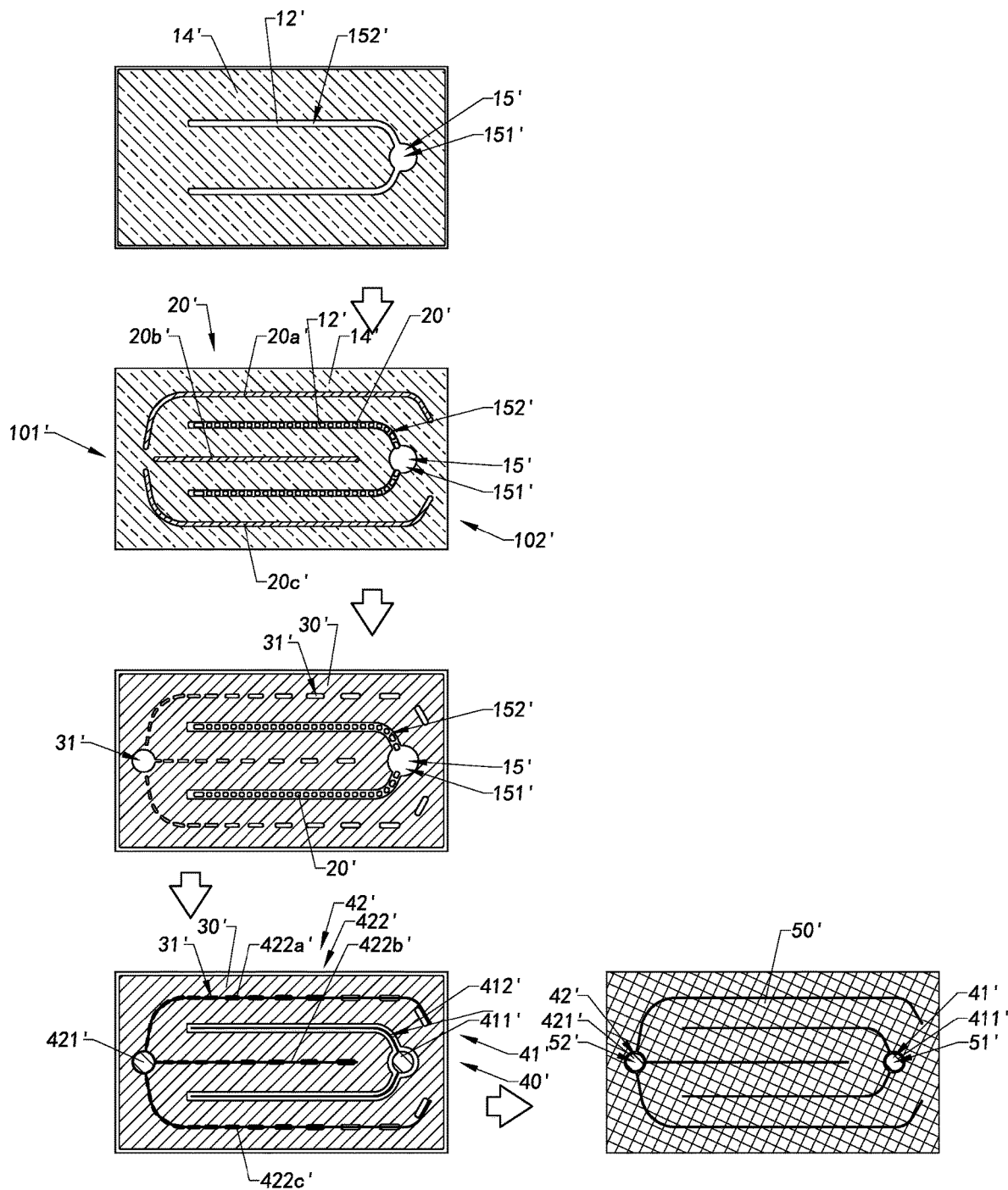
FIG. 17A is a schematic cross-sectional view illustrating the manufacturing steps of a semiconductor chip according to a ninth preferred embodiment of the present invention.
Figure 17B:
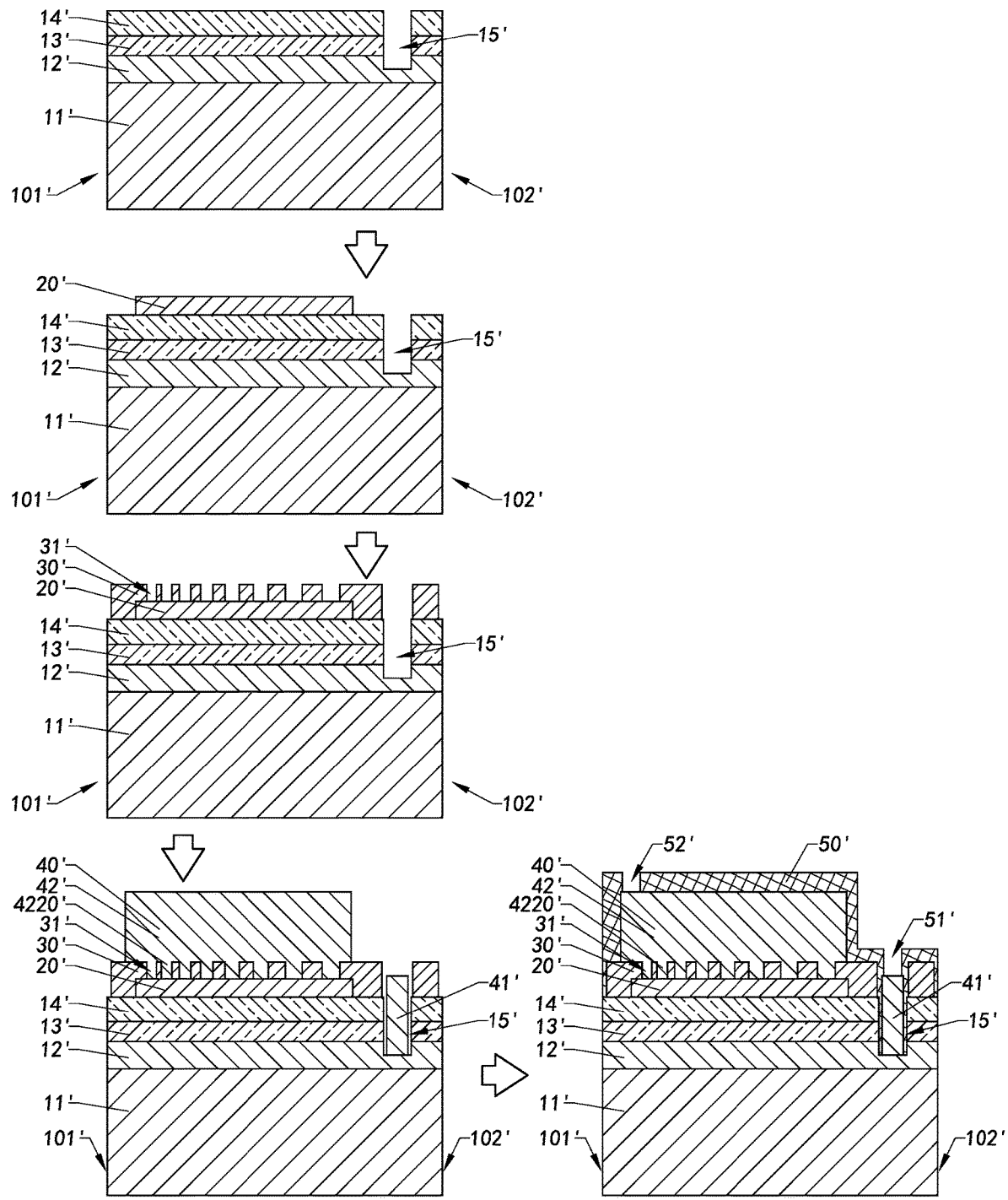
FIG. 17B is a schematic cross-sectional view illustrating the manufacturing steps of the semiconductor chip according to the above ninth preferred embodiment of the present invention.

Referring to the FIGS. 17A and 17B of the drawings, another alternative mode of the semiconductor chip according to the above second preferred embodiment of the present invention is illustrated, which is different to the semiconductor chip as shown in FIGS. 10A and 10B in that, the sizes of through holes 31' of the transparent conductive layer 30' are gradually increased from first end portion 101' to the second end portion 102' of the semiconductor chip, and that the distance between each two adjacent through holes 31' of the transparent conductive layer 30' is gradually increased from the first end portion 101' to the second end portion 102' of the semiconductor chip. Accordingly, after the P-type electrode 42' is stackedly formed on the transparent conductive layer 30', the sizes of the P-type prongs 4220' of the P-type electrode extension member 422' are gradually increased from the first end portion 101' to the second end portion 102' of the semiconductor chip and the distance between each two adjacent P-type prongs 4220' of the P-type electrode extension member 422' is gradually increased from the first end portion 101' to the second end portion 102' of the semiconductor chip. Therefore, the current can be evenly and uniformly distributed in the P-type semiconductor layer 14'.

Figure 18:
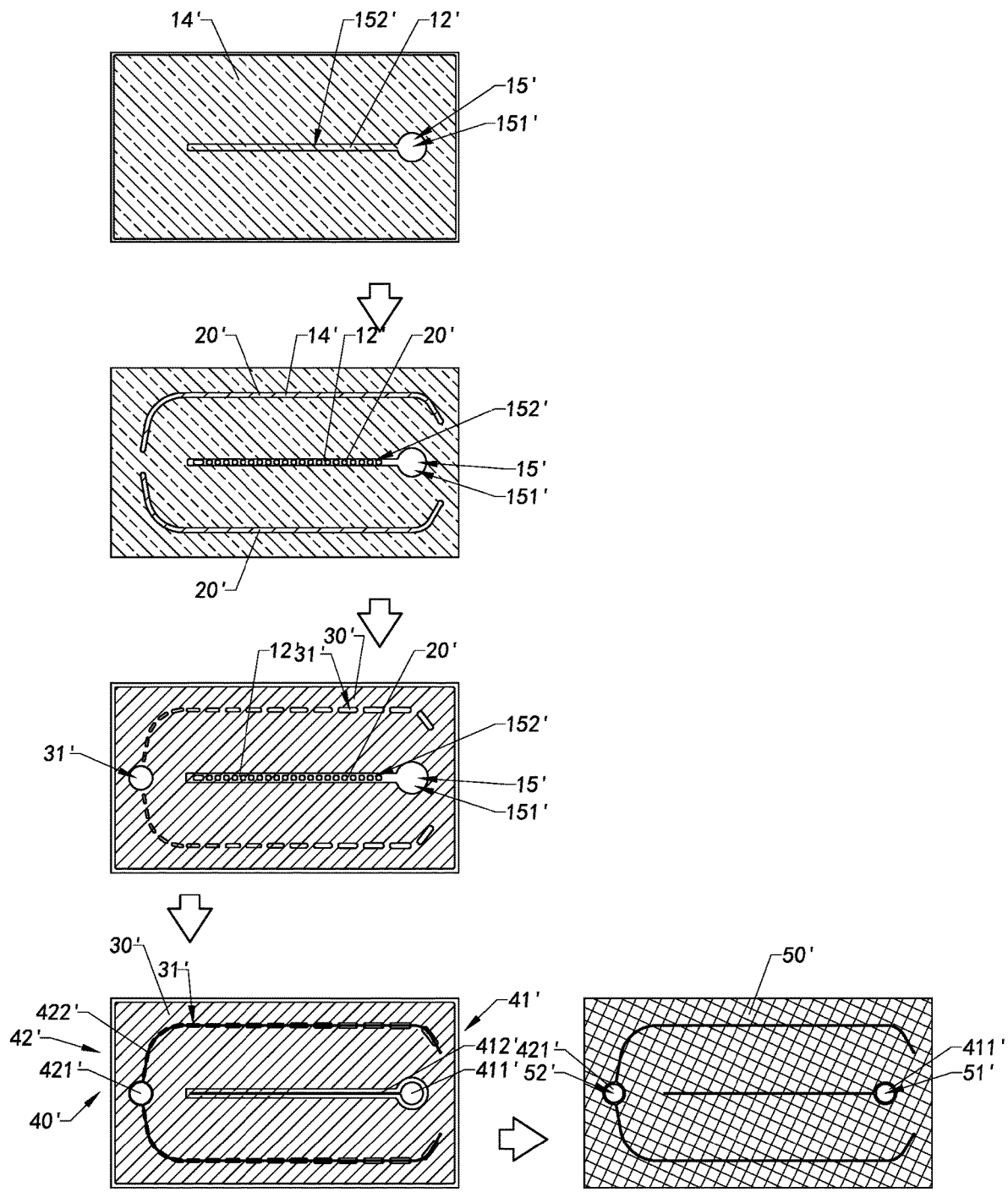
FIG. 18 is a schematic cross-sectional view illustrating the manufacturing steps of a semiconductor chip according to a tenth preferred embodiment of the present invention.

Referring to the FIG. 18 of the drawings, another alternative mode of the semiconductor chip according to the above second preferred embodiment of the present invention is illustrated, which is different to the semiconductor chip as shown in FIGS. 10A and 10B in that, the semiconductor exposing portion 15' has one N-type electrode pad exposing portion 151' and one N-type electrode extension member exposing portion 152', wherein the N-type electrode pad exposing portion 151' is formed on the second end portion 102' of the semiconductor chip, while the N-type electrode extension member exposing portion 152' is extended from the N-type electrode pad exposing portion 151' to the first end portion 101' of the semiconductor chip along a longitudinal direction at a middle portion of the semiconductor chip.

Correspondingly, the N-type electrode 41' comprises one N-type electrode pad 411' stacked on the N-type semiconductor layer 12' and retained in the N-type electrode pad exposing portion 151', and one N-type electrode extension member 412' stacked on the N-type semiconductor layer 12' and retained in the N-type electrode extension member exposing portion 152', wherein the N-type electrode extension member 412' is extended from the N-type electrode pad 411' towards the first end portion 101' of the semiconductor chip along a longitudinal direction at a middle portion of the semiconductor chip.

Referring to the FIG. 18 of the drawings, there are two current blocking layers 20' provided in this alternative mode, wherein the two current blocking layers 20' are symmetrically extended from the first end portion 101' to the second end portion 102' of the semiconductor chip along the peripheral edge of the semiconductor chip in a longitudinal direction. Further, the transparent conductive layer 30' encapsulates the current blocking layer 20' in such a manner to stack on the P-type semiconductor layer 14', wherein the through holes 31' of the transparent conductive layer 30' are arranged corresponding to different positions of the current blocking layer 20' respectively. Accordingly, the transparent conductive layer 30' has two rows of the through holes 31', wherein the two rows of the through holes 31' are arranged corresponding to different positions of the current blocking layers 20'.

Accordingly, the P-type electrode 42', after being formed, comprises one P-type electrode pad 421' and two P-type electrode extension members 422', wherein the one P-type electrode pad 421' and the two P-type electrode extension members 422' are stackedly formed on the transparent conductive layer 30'. The two P-type electrode extension members 422' are symmetrically extended from the P-type electrode pad 421' towards the second end portion 102' of the semiconductor chip at the peripheral edge thereof along a longitudinal direction of the semiconductor chip, wherein the P-type prongs 4220' of the P-type electrode extension member 422' are formed and retained in the through holes of the transparent conductive layer 30' respectively. Referring to the FIG. 18 of the drawings, the N-type electrode extension member 412' of the N-type electrode 41' is retained between the two P-type electrode extension members 422' of the P-type electrode 42'.

Referring to the FIG. 18 of the drawings, a passivation layer 50' is stackedly formed on the P-type semiconductor layer 14' of the epitaxial unit 10', wherein the passivation layer 50' encapsulates the transparent conductive layer 30' and the N-type electrode 41' and the P-type electrode 42' of the electrode assembly 40'. The passivation layer 50' has at least one first through hole 51' formed corresponding to the N-type electrode pad 411' of the N-type electrode 41' of the electrode assembly 40' so as to expose the N-type electrode pad 411' at the first through hole 51', and at least one second through hole 52' formed corresponding to the P-type electrode pads 421' of the P-type electrodes 42' of the electrode assembly 40' so as to expose the P-type electrode pad 421' at the second through hole 42'.

Figure 19:
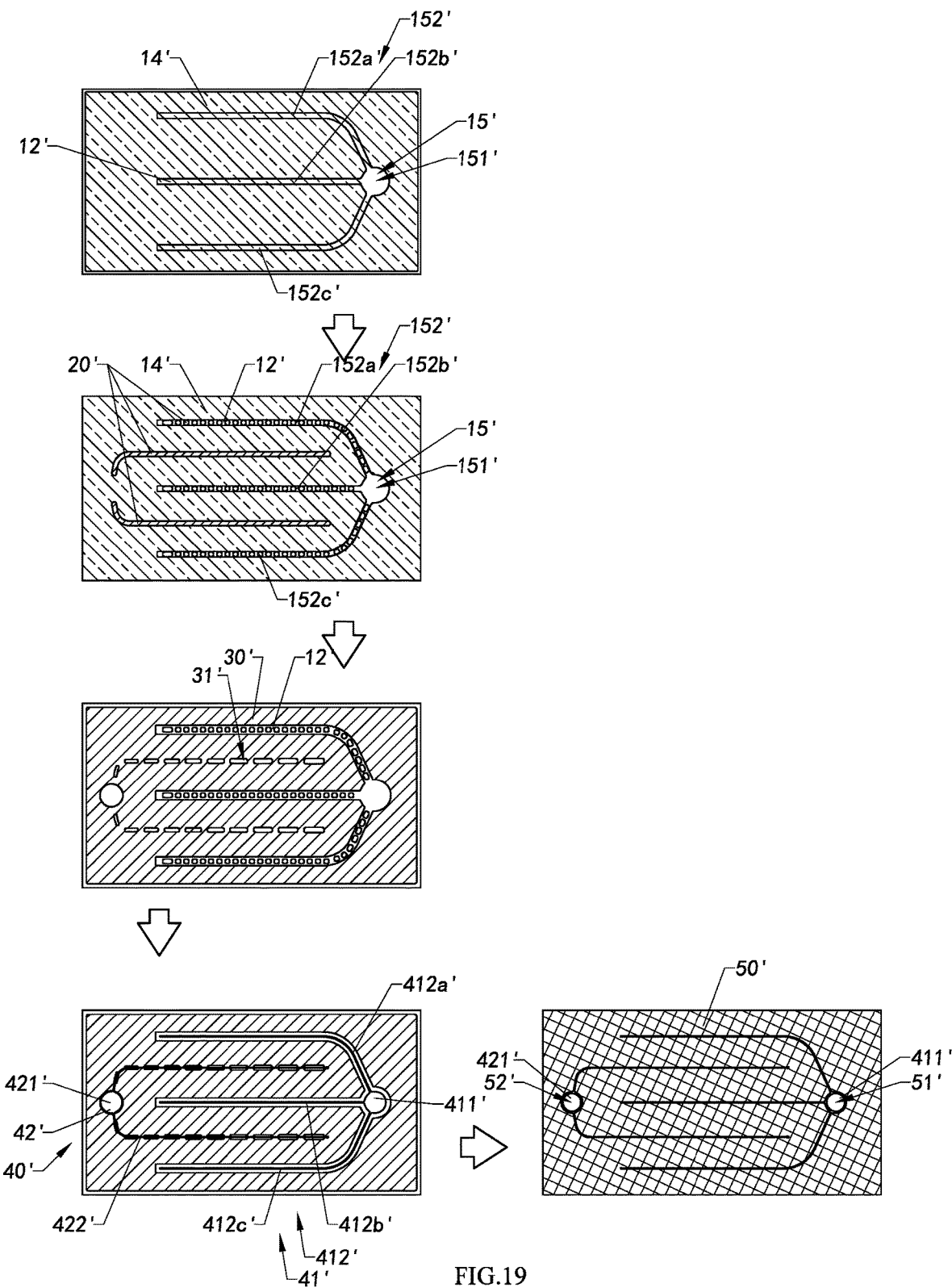
FIG. 19 is a schematic cross-sectional view illustrating the manufacturing steps of a semiconductor chip according to an eleventh preferred embodiment of the present invention.

Referring to the FIG. 19 of the drawings, another alternative mode of the semiconductor chip according to the above second preferred embodiment of the present invention is illustrated, which is different to the semiconductor chip as shown in FIGS. 10A and 10B in that, the semiconductor exposing portion 15' has one N-type electrode pad exposing portion 151' and three N-type electrode extension member exposing portions 152', which are defined as a first extension exposing portion 152a', a second extension exposing portion 152b', and a third extension exposing portion 152c'. Accordingly, the first extension exposing portion 152'a' and the third extension exposing portion 152c' are symmetrically extended from the N-type electrode pad exposing portion 151' to the first end portion 101' of the semiconductor at a peripheral edge thereof along a longitudinal direction of the semiconductor chip. The second extension exposing portion 152b' is extended from the N-type electrode pad exposing portion 151' to the first end portion 101' of the semiconductor chip at a middle portion thereof along a longitudinal direction of the semiconductor chip.

Correspondingly, the N-type electrode 41' comprises one N-type electrode pad 411' stacked on the N-type semiconductor layer 12' and retained in the N-type electrode pad exposing portion 151', and three N-type electrode extension members 412' stacked on the N-type semiconductor layer 12' and retained in the N-type electrode extension member exposing portion 152', wherein the three N-type electrode extension members 412' are defined as a first N-type electrode extension member 412a', a second N-type electrode extension member 412b', and a third N-type electrode extension member 412c'. Accordingly, the first N-type electrode extension member 412a' and the third N-type electrode extension member 412c' are symmetrically extended from the N-type electrode pad 411' to the first end portion 101' of the semiconductor at a peripheral edge thereof along a longitudinal direction of the semiconductor chip. The second N-type electrode extension member 412b' is extended from the N-type electrode pad 411' to the first end portion 101' of the semiconductor chip at a middle portion thereof along a longitudinal direction of the semiconductor chip.

Referring to the FIG. 19 of the drawings, there are two current blocking layers 20' provided in this alternative mode, wherein the two current blocking layers 20' are symmetrically extended from the first end portion 101' to the second end portion 102' of the semiconductor chip at the peripheral edge thereof along a longitudinal direction the semiconductor chip. Further, the transparent conductive layer 30' encapsulates the current blocking layer 20' in such a manner to stack on the P-type semiconductor layer 14', wherein the through holes 31' of the transparent conductive layer 30' are formed corresponding to different positions of the current blocking layer 20' respectively. Accordingly, the transparent conductive layer 30' has two rows of the through holes 31', which are formed corresponding to different positions of the current blocking layers 20' respectively.

Accordingly, the P-type electrode 42', after being formed, comprises one P-type electrode pad 421' and two P-type electrode extension members 422', wherein the one P-type electrode pad 421' and the two P-type electrode extension members 422' are stackedly formed on the transparent conductive layer 30'. The two P-type electrode extension members 422' are symmetrically extended from the P-type electrode pad 421' towards the second end portion 102' of the semiconductor chip at the peripheral edge thereof along a longitudinal direction of the semiconductor chip, wherein the P-type prongs 4220' of the P-type electrode extension member 422' are formed and retained in the through holes of the transparent conductive layer 30' respectively. Referring to the FIG. 19 of the drawings, the N-type electrode extension member 412' of the N-type electrode 41' is retained between the two P-type electrode extension members 422' of the P-type electrode 42'.

Referring to the FIG. 19 of the drawings, a passivation layer 50' is stackedly formed on the P-type semiconductor layer 14' of the epitaxial unit 10', wherein the passivation layer 50' encapsulates the transparent conductive layer 30' and the N-type electrode 41' and the P-type electrode 42' of the electrode assembly 40'. The passivation layer 50' has at least one first through hole 51' positioned corresponding to the N-type electrode pad 411' of the N-type electrode 41' of the electrode assembly 40' so as to expose the N-type electrode pad 411' at the first through hole 51', and at least one second through hole 52' positioned corresponding to the P-type electrode pads 421' of the P-type electrodes 42' of the electrode assembly 40' so as to expose the P-type electrode pad 421' at the second through hole 42'.

Figure 20:
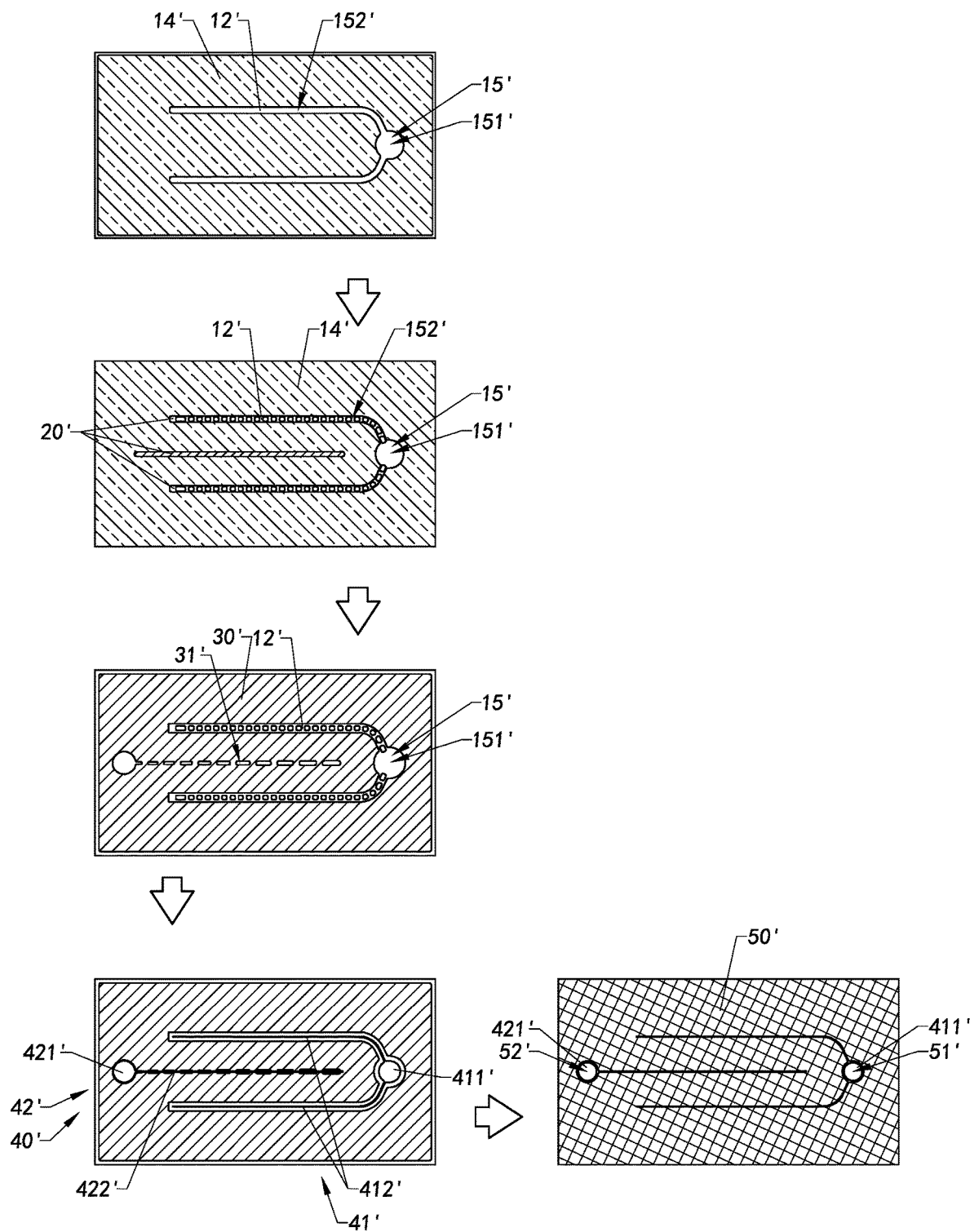
FIG. 20 is a schematic cross-sectional view illustrating the manufacturing steps of a semiconductor chip according to a twelfth preferred embodiment of the present invention.

Referring to the FIG. 20 of the drawings, another alternative mode of the semiconductor chip according to the above second preferred embodiment of the present invention is illustrated, which is different to the semiconductor chip as shown in FIG. 19 in that, wherein the semiconductor exposing portion 15' has one N-type electrode pad exposing portion 151' and two N-type electrode extension member exposing portions 152', wherein the two extension exposing portions are symmetrically extended from the N-type electrode pad exposing portion 151' to the first end portion 101' of the semiconductor at a peripheral edge thereof along a longitudinal direction of the semiconductor chip.

Correspondingly, the N-type electrode 41' comprises one N-type electrode pad 411' stacked on the N-type semiconductor layer 12' and retained in the N-type electrode pad exposing portion 151', and two N-type electrode extension members 412' stacked on the N-type semiconductor layer 12' and retained in the N-type electrode extension member exposing portions 152' respectively, wherein the two N-type electrode extension members 412' are symmetrically extended from the N-type electrode pad 411' to the first end portion 101' of the semiconductor chip along a longitudinal direction thereof at a peripheral edge of the semiconductor chip.

Referring to the FIG. 20 of the drawings, there is one current blocking layers 20' provided in this alternative mode, wherein the one current blocking layer 20' is extended from the first end portion 101' to the second end portion 102' of the semiconductor chip along a longitudinal direction thereof at the peripheral edge of the semiconductor chip. Furthermore, the transparent conductive layer 30' encapsulates the current blocking layer 20' in such a manner to stack on the P-type semiconductor layer 14', wherein the through holes 31' of the transparent conductive layer 30' are positioned corresponding to different positions of the current blocking layers 20' respectively. Accordingly, the transparent conductive layer 30' has one row of the through holes 31' positioned corresponding to different positions of the current blocking layers 20' respectively.

Accordingly, the P-type electrode 42', after being formed, comprises one P-type electrode pad 421' and one P-type electrode extension members 422', wherein the one P-type electrode pad 421' and the one P-type electrode extension member 422' are stackedly formed on the transparent conductive layer 30'. The one P-type electrode extension members 422' is extended from the P-type electrode pad 421' towards the second end portion 102' of the semiconductor chip at the peripheral edge thereof along a longitudinal direction of the semiconductor chip, wherein the P-type prongs 4220' of the P-type electrode extension member 422' are formed and retained in the through holes of the transparent conductive layer 30' respectively. Referring to the FIG. 20' of the drawings, the P-type electrode extension member 422' of the P-type electrode 42' is retained between the two N-type electrode extension members 412' of the N-type electrode 41'.

Referring to the FIG. 20 of the drawings, a passivation layer 50' is stackedly formed on the P-type semiconductor layer 14' of the epitaxial unit 10', wherein the passivation layer 50' encapsulates the transparent conductive layer 30' and the N-type electrode 41' and the P-type electrode 42' of the electrode assembly 40'. The passivation layer 50' has at least one first through hole 51' positioned corresponding to the N-type electrode pad 411' of the N-type electrode 41' of the electrode assembly 40' so as to expose the N-type electrode pad 411' at the first through hole 51', and at least one second through hole 52' positioned corresponding to the P-type electrode pad 421' of the P-type electrodes 42' of the electrode assembly 40' so as to expose the P-type electrode pad 421' at the second through hole 52'.

Figure 21:
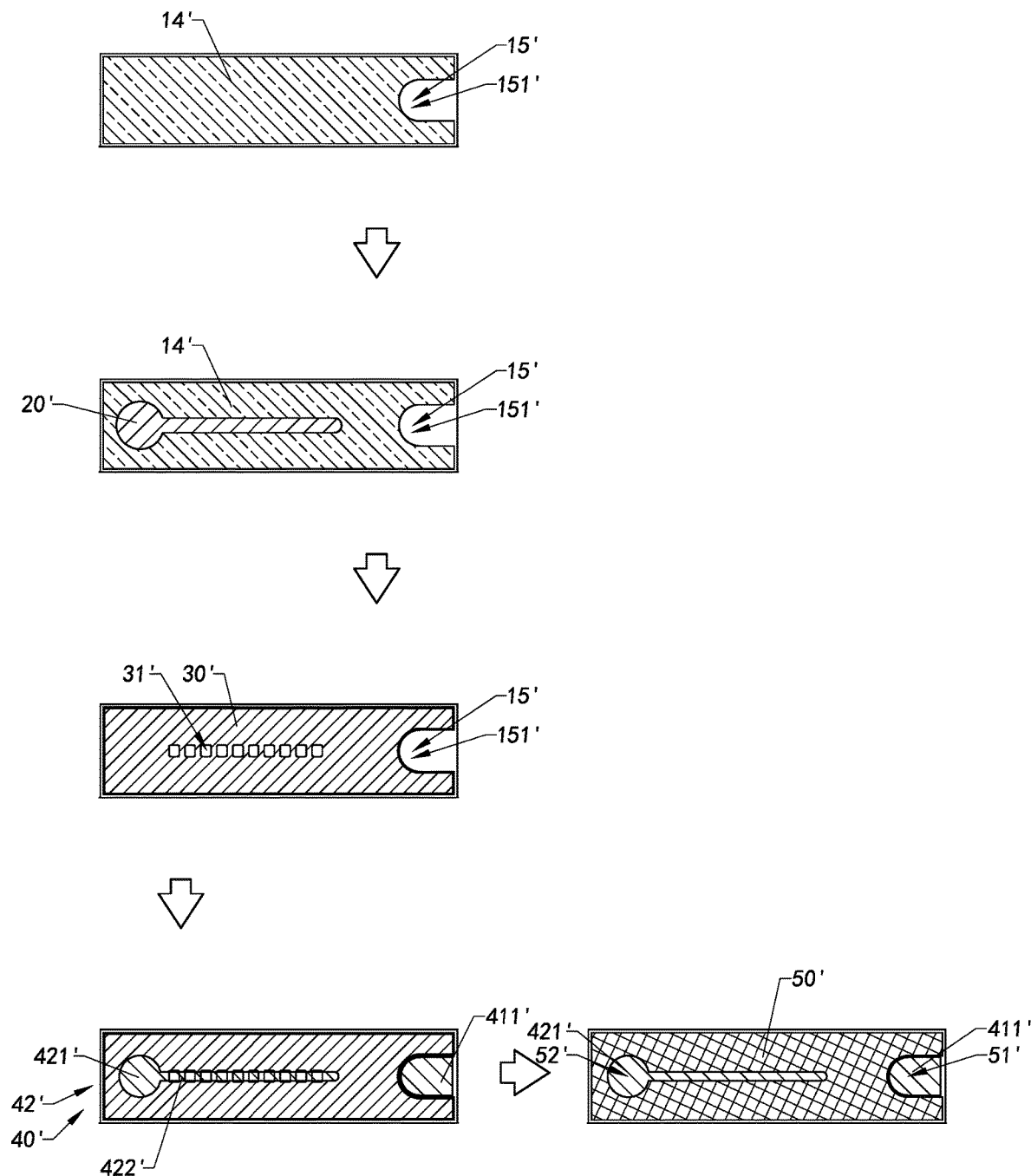
FIG. 21 is a schematic cross-sectional view illustrating the manufacturing steps of a semiconductor chip according to a thirteenth preferred embodiment of the present invention.

Referring to the FIG. 21 of the drawings, another alternative mode of the semiconductor chip according to the above second preferred embodiment of the present invention is illustrated, which is different to the semiconductor chip as shown in FIG. 20 in that, the semiconductor exposing portion 15' has one N-type electrode pad exposing portion 151' formed at the second end portion 102' of the semiconductor chip. Accordingly, the N-type electrode 41' comprises one N-type electrode pad 411' stacked on the N-type semiconductor layer 12' and retained in the N-type electrode pad exposing portion 151'.

Referring to the FIG. 21 of the drawings, there is one current blocking layer 20' provided in this alternative mode, wherein the one current blocking layer 20' extends from the first end portion 101' to the second end portion 102' of the semiconductor chip at the peripheral edge thereof along a longitudinal direction of the semiconductor chip. Further, the transparent conductive layer 30' encapsulates the current blocking layer 20' in such a manner to stack on the P-type semiconductor layer 14', wherein the through holes 31' of the transparent conductive layer 30' are positioned corresponding to different positions of the current blocking layers 20' respectively.

Accordingly, the P-type electrode 42', after being formed, comprises one P-type electrode pad 421' and one P-type electrode extension member 422', wherein the one P-type electrode pad 421' and the one P-type electrode extension member 422' are stackedly formed on the transparent conductive layer 30'. The one P-type electrode extension member 422' extends from the P-type electrode pad 421' towards the second end portion 102' of the semiconductor chip at the peripheral edge thereof along a longitudinal direction of the semiconductor chip, wherein the P-type prongs 4220' of the P-type electrode extension member 422' are formed and retained in the through holes of the transparent conductive layer 30' respectively.

Referring to the FIG. 21 of the drawings, a passivation layer 50' is stackedly formed on the P-type semiconductor layer 14' of the epitaxial unit 10', wherein the passivation layer 50' encapsulates the transparent conductive layer 30' and the N-type electrode 41' and the P-type electrode 42' of the electrode assembly 40'. The passivation layer 50' has at least one first through hole 51' positioned corresponding to the N-type electrode pad 411' of the N-type electrode 41' of the electrode assembly 40' so as to expose the N-type electrode pad 411' at the first through hole 51', and at least one second through hole 52' positioned corresponding to the P-type electrode pads 421' of the P-type electrode 42' of the electrode assembly 40' so as to expose the P-type electrode pad 421' at the second through hole 42'.

It is worth mentioning that the thicknesses of the substrate 11', the N-type semiconductor layer 12', the active region 13', the second semiconductor layer 14', the current blocking layer 20', the transparent conductive layer 30', the N-type electrode 41', and the P-type electrode 42' as shown in the Figs are merely exemplary, and may not represent the real thickness of the substrate 11', the N-type semiconductor layer 12', the active region 13', the second semiconductor layer 14', the current blocking layer 20', the transparent conductive layer 30', the N-type electrode 41', and the P-type electrode 42'. In addition, the real thickness proportion between the substrate 11', the N-type semiconductor layer 12', the active region 13', the second semiconductor layer 14', the current blocking layer 20', the transparent conductive layer 30', the N-type electrode between 41', and the P-type electrode 42' may also not shown in the drawings and the size proportion between the N-type electrode 41' and the P-type electrode 42' of the electrode assembly 40' and other layers of the semiconductor chip is not limited as that is shown in the drawings.

In addition, the size of each of the through holes 31' of the transparent conductive layer transparent conductive layer 30', the size proportion between each two adjacent through holes 31' and the distance between each two adjacent through holes 31' are merely exemplary, which is not intended to be limiting in the present invention.

Accordingly, the size of the P-type prongs 4220' of P-type electrode extension member 422', the size ration between each adjacent two P-type prongs 4220' and the distance between each adjacent two P-type prongs 4220' not merely exemplary, which is not intended to be limiting in the present invention.

One skilled in the art will understand that the embodiment of the present invention as shown in the drawings and described above is exemplary only and not intended to be limiting. Accordingly, the size of the P-type prongs 4220' of P-type electrode extension member 422', the size proportion between each two adjacent P-type prongs 4220' and the distance between each two adjacent P-type prongs 4220' are merely exemplary, which is not intended to be limiting in the present invention.

One skilled in the art will understand that the embodiment of the present invention as shown in the drawings and described above is exemplary only and not intended to be limiting.

It will thus be seen that the objects of the present invention have been fully and effectively accomplished. The embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A semiconductor chip of LED, comprising:
an epitaxial unit, which comprises a substrate, an N-type semiconductor layer formed on the substrate, an active region formed on the N-type semiconductor layer, and a P-type semiconductor layer formed on the active region, wherein the epitaxial unit has at least one semiconductor exposing portion extended from the P-type semiconductor layer through the active region to the N-type semiconductor layer to expose the N-type semiconductor layer;
one or more current blocking layers formed on the P-type semiconductor layer of the epitaxial unit;
a transparent conductive layer, having one or more through holes positioned corresponding to the one or more current blocking layers respectively, encapsulating the one or more current blocking layers so as to be formed on the P-type semiconductor layer; and
an electrode assembly which comprises at least one N-type electrode and at least one P-type electrode, wherein the at least one N-type electrode is formed on the semiconductor exposing portion and the N-type semiconductor layer, wherein the at least one P-type electrode has one or more P-type prongs formed and retained in the one or more through holes of the transparent conductive layer respectively when the transparent conductive layer being formed on the P-type semiconductor layer.

2. The semiconductor chip, as recited in claim 1, wherein the at least one N-type electrode comprises a N-type electrode pad formed at a second end portion of the semiconductor chip and at least one N-type electrode extension member extended from the at least one N-type electrode pad to a first end portion of the semiconductor chip, wherein the at least one P-type electrode comprises a P-type electrode pad formed at the first end portion of the semiconductor chip and at least two P-type electrode extension members extended from the at least one P-type electrode pad to the second end portion of the semiconductor chip, wherein the at least one N-type electrode extension member is retained between the at least two P-type electrode extension members.

3. The semiconductor chip, as recited in claim 2, wherein the at least one N-type electrode comprises one N-type electrode extension member extending along a longitudinal direction of the semiconductor chip at a middle portion of the semiconductor chip, wherein the at least one P-type electrode includes two P-type electrode extension members symmetrically extended along the longitudinal direction of the semiconductor chip at a peripheral edge of the semiconductor chip.

4. The semiconductor chip, as recited in claim 2, wherein the at least one N-type electrode includes two N-type electrode extension members symmetrically extended along a longitudinal direction of the semiconductor chip at a middle portion of the semiconductor chip, wherein the at least one P-type electrode includes a first P-type electrode extension member, a second P-type electrode extension member and a third P-type electrode extension member, wherein the first P-type electrode extension member and the third P-type electrode extension member of the at least one P-type electrode are symmetrically extended from the P-type electrode pad towards the second end portion of the semiconductor chip along the longitudinal direction of the semiconductor chip at a peripheral edge of the semiconductor chip, and that the second P-type electrode extension member of the P-type electrode is extended from the P-type electrode pad towards the second end portion of the semiconductor chip along the longitudinal direction of the semiconductor chip at the middle portion of the semiconductor chip, wherein one of the N-type electrode extension members is retained between the first P-type electrode extension member and the second P-type electrode extension member, and the other N-type electrode extension member is retained between the second P-type electrode extension member and the third P-type electrode extension member.

5. The semiconductor chip, as recited in claim 1, wherein the at least one N-type electrode comprises a N-type electrode pad formed at a second end portion of the semiconductor chip and at least two N-type electrode extension members extended from the N-type electrode pad to a first end portion of the semiconductor chip, wherein the at least one P-type electrode comprises a P-type electrode pad formed at the first end portion of the semiconductor chip and at least one P-type electrode extension member extended from the P-type electrode pad to the second end portion of the semiconductor chip, wherein the at least one P-type electrode extension member is retained between the at least two N-type electrode extension members.

6. The semiconductor chip, as recited in claim 1, wherein each of the one or more current blocking layers is formed on an outer surface of N-type semiconductor layer exposed at the semiconductor exposing portion and encapsulated in the at least one N-type electrode, wherein each of the one or more current blocking layers formed on the N-type semiconductor layer is extended in a longitudinal direction of the semiconductor chip.

7. The semiconductor chip, as recited in claim 1, further comprising a passivation layer encapsulating the at least one N-type electrode and the at least one P-type electrode so as to be formed on the P-type semiconductor layer and the transparent conductive layer, wherein the passivation layer has a first through hole positioned corresponding to the at least one N-type electrode and a second through hole positioned corresponding to the at least one P-type electrode.

8. The semiconductor chip, as recited in claim 1, wherein the at least one N-type electrode comprises a N-type electrode pad formed at a second end portion of the semiconductor chip, wherein the at least one P-type electrode comprises a P-type electrode pad formed at a first end portion of the semiconductor chip and at least one P-type electrode extension member extended from the at least one P-type electrode pad towards the second end portion of the semiconductor chip, wherein the P-type electrode extension member has one or more P-type prongs formed and retained in the one or more through holes of the transparent conductive layer respectively.

9. The semiconductor chip, as recited in claim 8, wherein the one or more through holes are gradually increased in size from the first end portion to the second end portion of the semiconductor chip, and the one or more P-type prongs are gradually increased in size from the first end portion to the second end portion of the semiconductor chip.

10. The semiconductor chip, as recited in claim 8, wherein the one or more through holes are gradually decreased in size from the first end portion to the second end portion of the semiconductor chip, and the one or more P-type prongs are gradually decreased in size from the first end portion to the second end portion of the semiconductor chip.

11. The semiconductor chip, as recited in claim 8, wherein a distance between each two of the one or more through holes is gradually increased from the first end portion to the second end portion of the semiconductor chip, and a distance between each two of the one or more P-type prongs is gradually increased from the first end portion to the second end portion of the semiconductor chip.

12. The semiconductor chip, as recited in claim 8, wherein a distance between each two of the one or more through holes is gradually decreased from the first end portion to the second end portion of the semiconductor chip, and a distance between each two of the one or more P-type prongs is gradually decreased from the first end portion to the second end portion of the semiconductor chip.

13. A manufacturing method of a semiconductor chip of LED, comprising the steps of:
(a) stacking at least one current blocking layer on a P-type semiconductor layer of an epitaxial unit;
(b) stacking a transparent conductive layer on the P-type semiconductor layer, wherein the at least one current blocking layer is encapsulated in the transparent conductive layer, and the transparent conductive layer has at least one through hole positioned corresponding to the at least one current blocking layer; and
(c) stacking at least one N-type electrode on an N-type semiconductor layer of the epitaxial unit, wherein the at least one N-type electrode is retained in a semiconductor exposing portion of the epitaxial unit, and stacking at least one P-type electrode on the transparent conductive layer, wherein at least one P-type prong of the at least one P-type electrode is formed and retained in the at least one through hole of the transparent conductive layer.

14. The manufacturing method, as recited in claim 13, further comprising a step of:
(d) stacking a passivation layer on the P-type semiconductor layer and the transparent conductive layer, wherein the at least one N-type electrode and the at least one P-type electrode are encapsulated in the passivation layer and the passivation layer has a first through hole positioned corresponding to the at least one N-type electrode and a second through hole positioned corresponding to the at least one P-type electrode.

15. The manufacturing method, as recited in claim 13, wherein the step (a) further comprises the steps of:
(a.1) depositing an insulating layer on the P-type semiconductor layer; and
(a.2) wet-etching the insulating layer to form the at least one current blocking layer stacked on the P-type semiconductor layer.

16. The manufacturing method, as recited in claim 15, wherein, before the step (a.2), the step (a) further comprises a step of applying photoresist on the insulating layer, and after the step (a.2), the step (a) further comprises a step of removing the photoresist.

17. The manufacturing method, as recited in claim 16, wherein the insulating layer is made of $SiO_2$ and, in the step (a.1), a reaction gas being used includes $SiH_4$, $N_2O$ and $N_2$ to deposit the insulating layer on the P-type semiconductor layer, and a solution to be used in the wet-etching is a mixed solution of hydrofluoric acid and ammonium fluoride, wherein a thickness of the insulating layer ranges from 500 Angstroms to 10,000 Angstroms, and a thickness of the photoresist ranges from 0.5 μm to 5 μm.

18. The manufacturing method, as recited in claim 13, wherein the step (b) further comprises the steps of:
(b.1) depositing an indium tin oxide layer on the P-type semiconductor layer, wherein the at least one current blocking layer is encapsulated in the indium tin oxide layer; and
(b.2) wet-etching the indium tin oxide layer to form the transparent conductive layer and the at least one through hole of the transparent conductive layer.

19. The manufacturing method, as recited in claim 18, wherein, before the step (b.2), the step (b) further comprises a step of applying photoresist on the transparent conductive layer, and, after the step (b.2), the step (b) further comprises a step of removing the photoresist, wherein, before the step of applying the photoresist, the step (b) further comprises a step of alloy-treating the indium tin oxide layer.

20. The manufacturing method, as recited in claim 13, wherein the step (a) further comprises a step of stacking the at least one current blocking layer on an outer surface of the N-type semiconductor layer exposed at the semiconductor exposing portion, such that in the step (c), the at least one current blocking layer stacked on the N-type semiconductor layer is encapsulated in the N-type electrode.

* * * * *